United States Patent
Servalli et al.

(10) Patent No.: US 12,477,743 B2
(45) Date of Patent: Nov. 18, 2025

(54) MEMORY DEVICES AND METHODS OF FORMING MEMORY DEVICES

(71) Applicant: Micron Technology, Inc., Boise, ID (US)

(72) Inventors: Giorgio Servalli, Fara Gera d'Adda (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/202,237

(22) Filed: May 25, 2023

(65) Prior Publication Data

US 2023/0301112 A1    Sep. 21, 2023

Related U.S. Application Data

(62) Division of application No. 17/189,594, filed on Mar. 2, 2021, now Pat. No. 11,706,927.

(51) Int. Cl.
   *H10B 53/10*    (2023.01)
   *H10B 51/10*    (2023.01)
   (Continued)

(52) U.S. Cl.
   CPC .............. *H10B 51/20* (2023.02); *H10B 51/10* (2023.02); *H10B 53/10* (2023.02); *H10B 53/20* (2023.02)

(58) Field of Classification Search
   CPC ... H01L 28/55; H01L 28/90; H01L 29/78642; H01L 27/10852; H01L 27/10876;
   (Continued)

(56) References Cited

U.S. PATENT DOCUMENTS

| 5,406,447 A | 4/1995 | Miyazaki |
| 6,190,957 B1 | 2/2001 | Mochizuki et al. |

(Continued)

FOREIGN PATENT DOCUMENTS

| JP | 2009-010424 | 1/2009 |
| KR | 2017-0028666 | 3/2017 |

(Continued)

OTHER PUBLICATIONS

WO PCT/US2022/015936 IPRP, Aug. 29, 2023, Micron Technology, Inc.

(Continued)

*Primary Examiner* — Meiya Li
(74) *Attorney, Agent, or Firm* — Wells St. John P.S.

(57) ABSTRACT

Some embodiments include an integrated assembly having pillars arranged in an array. The pillars have channel regions between upper and lower source/drain regions. Gating structures are proximate to the channel regions and extend along a row direction. Digit lines are beneath the pillars, extend along a column direction, and are coupled with the lower source/drain regions. Linear structures are above the pillars and extend along the column direction. Bottom electrodes are coupled with the upper source/drain regions. The bottom electrodes have horizontal segments adjacent the upper source/drain regions and have vertical segments extending upwardly from the horizontal segments. The vertical segments are adjacent to lateral sides of the linear structures. Ferroelectric-insulative-material and top-electrode-material are over the bottom electrodes. A slit passes through the top-electrode-material, is directly over one of the linear structures, and extends along the column direction.

14 Claims, 47 Drawing Sheets

(51) Int. Cl.
    *H10B 51/20*     (2023.01)
    *H10B 53/20*     (2023.01)

(58) Field of Classification Search
    CPC ........ H01L 27/10885; H01L 27/10891; H10B 51/10; H10B 51/20; H10B 53/10; H10B 53/20; H10B 53/30; G11C 7/02; G11C 7/18; H10D 1/682; H10D 1/716; H10D 30/6728
    See application file for complete search history.

(56) References Cited

U.S. PATENT DOCUMENTS

| | | |
|---|---|---|
| 7,371,627 B1 | 5/2008 | Forbes |
| 7,459,362 B2 | 12/2008 | Juengling |
| 7,646,041 B2 | 1/2010 | Chae et al. |
| 8,344,517 B2 | 1/2013 | Kim et al. |
| 8,901,704 B2 | 12/2014 | Kang |
| 8,934,283 B2 | 1/2015 | Matsudaira et al. |
| 9,245,893 B1 | 1/2016 | Sukekawa |
| 9,608,077 B1 | 3/2017 | Kye et al. |
| 9,837,420 B1 | 12/2017 | Ramaswamy |
| 10,020,360 B1 | 7/2018 | Ramaswamy |
| 10,062,745 B2 | 8/2018 | Ramaswamy |
| 10,388,658 B1 | 8/2019 | Ramaswamy |
| 10,622,366 B2 | 4/2020 | Chavan et al. |
| 11,127,744 B2 | 9/2021 | Servalli et al. |
| 11,170,834 B2 | 11/2021 | Mutch et al. |
| 11,706,909 B2 | 7/2023 | Tang et al. |
| 11,706,927 B2 * | 7/2023 | Servalli .................. H10B 53/10 |
| 2001/0022372 A1 | 9/2001 | Kanaya et al. |
| 2003/0127676 A1 | 7/2003 | Redecker |
| 2005/0127428 A1 | 6/2005 | Mokhlesi et al. |
| 2005/0164454 A1 | 7/2005 | Leslie |
| 2006/0002192 A1 | 1/2006 | Forbes et al. |
| 2006/0054958 A1 | 3/2006 | Weis et al. |
| 2006/0113587 A1 | 6/2006 | Thies et al. |
| 2006/0244023 A1 | 11/2006 | Kanaya |
| 2007/0216467 A1 | 9/2007 | Akiyama et al. |
| 2007/0228434 A1 | 10/2007 | Shimojo |
| 2008/0035958 A1 | 2/2008 | Asao |
| 2008/0093644 A1 | 4/2008 | Forbes |
| 2008/0096341 A1 | 4/2008 | Lai et al. |
| 2008/0128757 A1 | 6/2008 | Chae et al. |
| 2008/0296671 A1 | 12/2008 | Takaishi |
| 2009/0020797 A1 | 1/2009 | Wang |
| 2009/0242972 A1 | 10/2009 | Cho |
| 2010/0052029 A1 | 3/2010 | Huang |
| 2010/0085800 A1 | 4/2010 | Yeom |
| 2010/0140696 A1 | 6/2010 | Yedinak et al. |
| 2011/0062504 A1 | 3/2011 | Hamamoto |
| 2011/0241170 A1 | 10/2011 | Haeberlen et al. |
| 2011/0284939 A1 | 11/2011 | Chung et al. |
| 2012/0007165 A1 | 1/2012 | Lee et al. |
| 2012/0153365 A1 | 6/2012 | Sung |
| 2012/0153371 A1 | 6/2012 | Chen et al. |
| 2012/0161215 A1 | 6/2012 | Lindert |
| 2012/0241826 A1 | 9/2012 | Satoh et al. |
| 2013/0043525 A1 | 2/2013 | Yu et al. |
| 2013/0302966 A1 | 11/2013 | Oh et al. |
| 2013/0320433 A1 | 12/2013 | Cho et al. |
| 2014/0042535 A1 | 2/2014 | Darwish et al. |
| 2015/0016180 A1 | 1/2015 | Lu et al. |
| 2015/0041873 A1 | 2/2015 | Karda et al. |
| 2015/0091070 A1 | 4/2015 | Cho et al. |
| 2015/0123067 A1 | 5/2015 | Lee |
| 2015/0171143 A1 | 6/2015 | Park et al. |
| 2015/0214278 A1 | 7/2015 | Satoh et al. |
| 2016/0020251 A1 | 1/2016 | Kim et al. |
| 2016/0049397 A1 | 2/2016 | Chang et al. |
| 2016/0093611 A1 | 3/2016 | Cheng et al. |
| 2016/0276433 A1 | 9/2016 | Holland et al. |
| 2017/0222045 A1 | 8/2017 | Leobandung |
| 2017/0236828 A1 | 8/2017 | Karda et al. |
| 2017/0309322 A1 | 10/2017 | Ramaswamy et al. |
| 2017/0346279 A1 | 11/2017 | Son et al. |
| 2018/0061468 A1 | 3/2018 | Derner et al. |
| 2018/0122816 A1 | 5/2018 | Ramaswamy |
| 2018/0130515 A1 | 5/2018 | Zawodny |
| 2018/0195049 A1 | 7/2018 | Ramaswamy |
| 2018/0197864 A1 | 7/2018 | Sills |
| 2018/0197870 A1 | 7/2018 | Balakrishnan et al. |
| 2018/0315658 A1 | 11/2018 | Ramaswamy |
| 2018/0331029 A1 | 11/2018 | Sukekawa |
| 2019/0074363 A1 | 3/2019 | Zhu |
| 2019/0148372 A1 | 5/2019 | Miao et al. |
| 2019/0148390 A1 | 5/2019 | Frank |
| 2019/0189357 A1 | 6/2019 | Chavan et al. |
| 2019/0198667 A1 | 6/2019 | Liu et al. |
| 2019/0214455 A1 | 7/2019 | Kang |
| 2019/0237470 A1 | 8/2019 | Mine et al. |
| 2019/0333917 A1 | 10/2019 | Ramaswamy |
| 2020/0111800 A1 | 4/2020 | Ramaswamy |
| 2020/0203357 A1 | 6/2020 | Chhajed et al. |
| 2020/0235111 A1 | 7/2020 | Calderoni et al. |
| 2020/0243267 A1 | 7/2020 | Chavan et al. |
| 2020/0286906 A1 | 9/2020 | Karda et al. |
| 2020/0381290 A1 | 12/2020 | Ramaswamy |
| 2020/0388619 A1 | 12/2020 | Sukekawa et al. |
| 2020/0395437 A1 | 12/2020 | Ramaswamy |
| 2021/0074714 A1 | 3/2021 | Derner et al. |
| 2021/0134816 A1 | 5/2021 | Calderoni et al. |
| 2021/0183873 A1 | 6/2021 | Goodwin et al. |
| 2021/0243267 A1 | 8/2021 | Fukuzaki et al. |
| 2021/0391334 A1 | 12/2021 | Servalli et al. |
| 2022/0020756 A1 | 1/2022 | Mariani et al. |
| 2022/0262813 A1 | 8/2022 | Karda et al. |
| 2022/0285392 A1 | 9/2022 | Servalli et al. |
| 2023/0010846 A1 | 1/2023 | Mariani et al. |
| 2023/0014289 A1 | 1/2023 | Servalli et al. |
| 2023/0027308 A1 | 1/2023 | Ramaswamy |

FOREIGN PATENT DOCUMENTS

| | | |
|---|---|---|
| TW | I645539 | 12/2018 |
| TW | I671884 | 9/2019 |
| TW | 202025400 A | 1/2020 |
| TW | I715007 | 1/2021 |
| WO | WO 2021/006989 | 1/2021 |

OTHER PUBLICATIONS

WO PCT/US2020/066285 IPRP, Jul. 12, 2022, Micron Technology, Inc.
WO PCT/US2020/066285 Search Rprt., Apr. 19, 2021, Micron Technology, Inc.
WO PCT/US2020/066285 Writ. Opin., Apr. 19, 2021, Micron Technology, Inc.
WO PCT/US2021/040018 IPRP, Jan. 24, 2023, Micron Technology, Inc.
WO PCT/US2021/040018 Search Rprt., Oct. 21, 2021, Micron Technology, Inc.
WO PCT/US2021/040018 Writ. Opin., Oct. 21, 2021, Micron Technology, Inc.
WO PCT/US2022/015936 Search Rprt., May 30, 2022, Micron Technology, Inc.
WO PCT/US2022/015936 Writ. Opin., May 30, 2022, Micron Technology, Inc.
WO PCT/US2022/033900 Search Rprt., Oct. 11, 2022, Micron Technology, Inc.
WO PCT/US2022/033900 Writ. Opin., Oct. 11, 2022, Micron Technology, Inc.
WO PCT/US2022/036917 Search Rprt., Jan. 2, 2023, Micron Technology, Inc.
WO PCT/US2022/036917 Writ. Opin., Jan. 2, 2023, Micron Technology, Inc.

(56) References Cited

OTHER PUBLICATIONS

WO PCT/US2022/037148 Search Rprt., Nov. 3, 2022, Micron Technology, Inc.
WO PCT/US2022/037148 Writ. Opin., Nov. 3, 2022, Micron Technology, Inc.

* cited by examiner

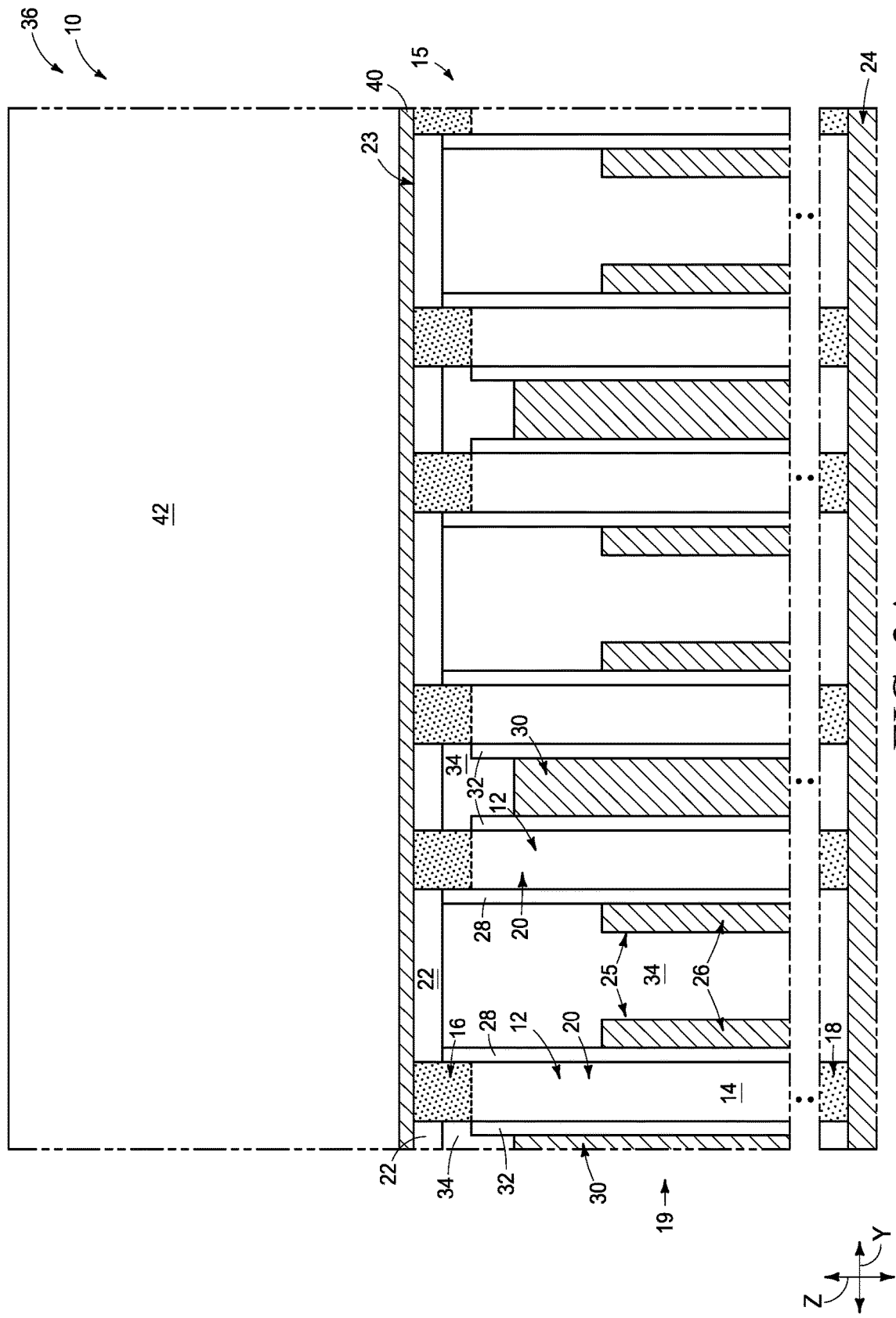

MEMORY DEVICES AND METHODS OF FORMING MEMORY DEVICES

RELATED PATENT DATA

This patent is a divisional of and claims priority to U.S. patent application Ser. No. 17/189,594, filed Mar. 2, 2021, the disclosures of which are incorporated herein by reference.

TECHNICAL FIELD

Memory devices (e.g., devices comprising FeRAM configurations), and methods of forming memory devices.

BACKGROUND

Memory may utilize memory cells which individually comprise an access transistor in combination with a capacitor. In some applications, the capacitor may be a ferroelectric capacitor and the memory may be ferroelectric random-access memory (FeRAM).

It would be desirable to develop improved memory architecture, and improved methods of forming memory architecture. It would also be desirable for such methods to be applicable for fabrication of FeRAM.

BRIEF DESCRIPTION OF THE DRAWINGS

FIG. 1 is a top view. FIGS. 1A and 1B are cross-sectional side views along the lines A-A and B-B, respectively, of FIG. 1.

FIGS. 1A-1 and 1B-1 are diagrammatic cross-sectional side views along the lines A-A and B-B, respectively, of FIG. 1, and show materials that may be associated with a gap shown in FIGS. 1A and 1B.

FIG. 2 is a top view. FIGS. 2A and 2B are cross-sectional side views along the lines A-A and B-B, respectively, of FIG. 2.

FIG. 3 is a top view. FIGS. 3A and 3B are cross-sectional side views along the lines A-A and B-B, respectively, of FIG. 3.

FIG. 4 is a top view. FIGS. 4A and 4B are cross-sectional side views along the lines A-A and B-B, respectively, of FIG. 4.

FIG. 5 is a top view. FIGS. 5A and 5B are cross-sectional side views along the lines A-A and B-B, respectively, of FIG. 5.

FIG. 6 is a top view. FIGS. 6A and 6B are cross-sectional side views along the lines A-A and B-B, respectively, of FIG. 6.

FIGS. 6-1 and 6A-1 are similar to FIGS. 6 and 6A, but show an alternative embodiment.

FIG. 7 is a top view. FIGS. 7A and 7B are cross-sectional side views along the lines A-A and B-B, respectively, of FIG. 7.

FIGS. 7-1 and 7A-1 are similar to FIGS. 7 and 7A, but show an alternative embodiment.

FIG. 8 is a top view. FIG. 8C is a three-dimensional view.

FIG. 9 is a top view. FIGS. 9A and 9B are cross-sectional side views along the lines A-A and B-B, respectively, of FIG. 9.

FIG. 10 is a top view. FIGS. 10A and 10B are cross-sectional side views along the lines A-A and B-B, respectively, of FIG. 10.

FIG. 11 is a top view. FIGS. 11A and 11B are cross-sectional side views along the lines A-A and B-B, respectively, of FIG. 11. The construction of FIGS. 11-11B may be considered to be a region of an example integrated assembly or a region of an example memory device.

FIG. 11A-1 is similar to FIG. 11, but shows an alternative embodiment.

DETAILED DESCRIPTION OF THE ILLUSTRATED EMBODIMENTS

Some embodiments include methods of forming memory architecture (e.g., FeRAM, etc.) in which bottom electrodes are configured as angle plates (e.g., "L-shaped" plates) having vertically-extending legs joining to horizontally-extending legs. The angle plates may be supported by insulative structures (rails) that extend along the angle plates and are adjacent to the vertically-extending legs. The insulative structures may extend along a same direction as digit lines (e.g., a column direction). Ferroelectric material and top-electrode-material may be over the bottom electrodes and the insulative structures. One or more slits may pass through the top-electrode-material and may be aligned with the insulative structures to pattern the top-electrode-material into two or more plates. Voltage of the individual plates may be controlled during various operations associated with a memory array (e.g., READ/WRITE operations). Example embodiments are described with reference to FIGS. 1-17.

Figure 1:
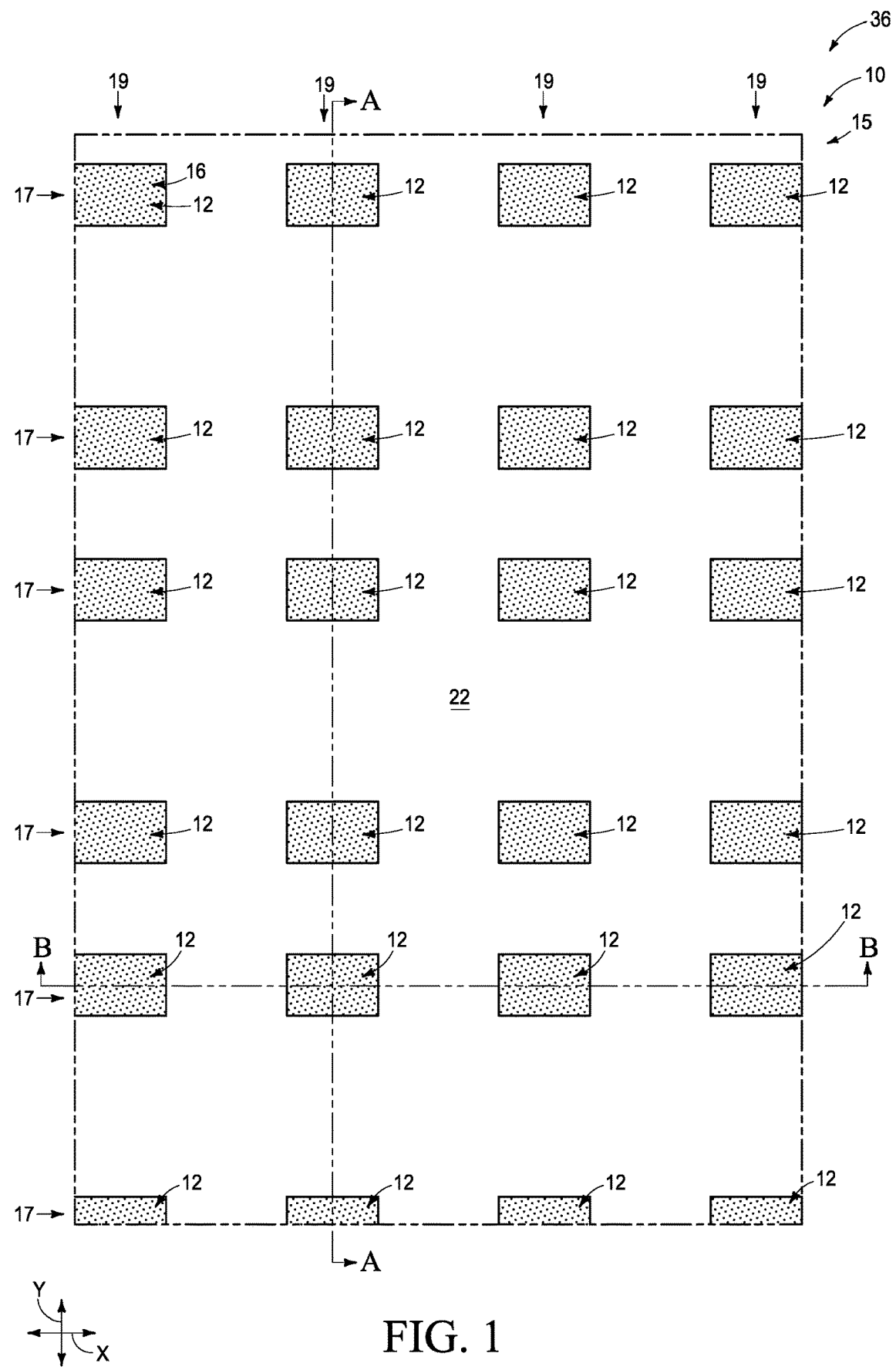
FIGS. 1-1B are diagrammatic views of a region of an example construction at an example process stage of an example method for forming an example integrated assembly.
Figure 1A:
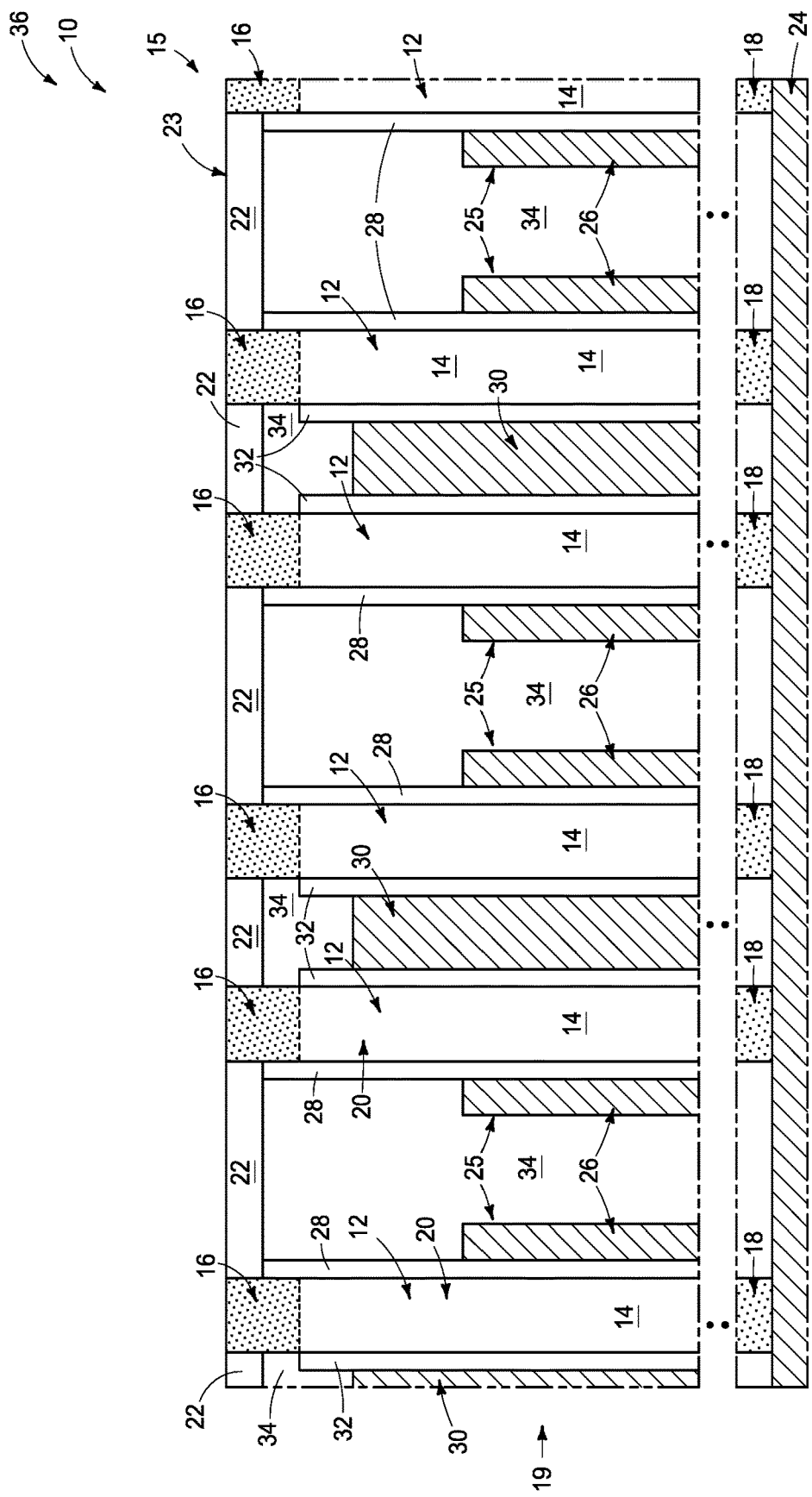
Figures 1, 1A:
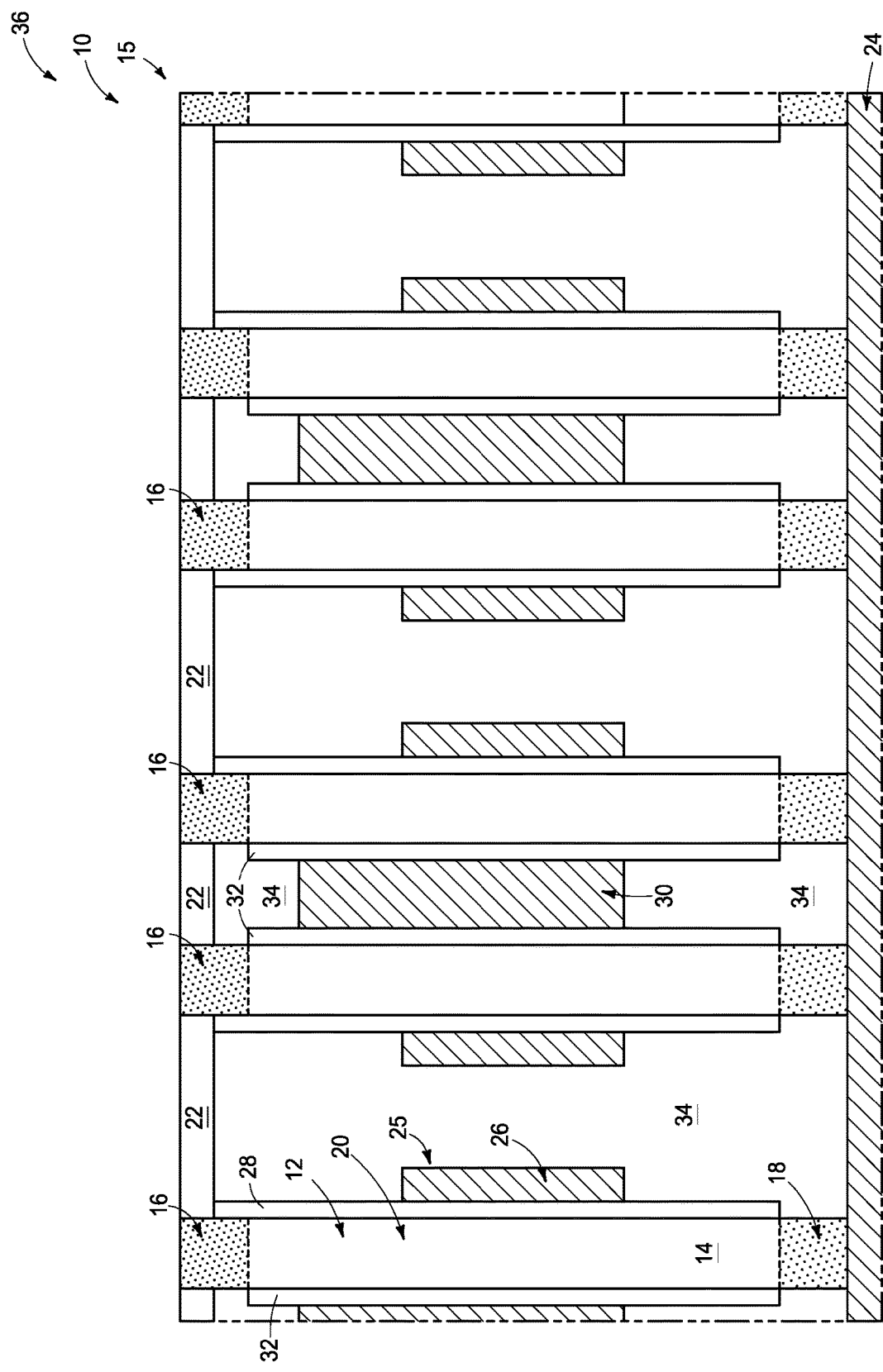
Figure 1B:
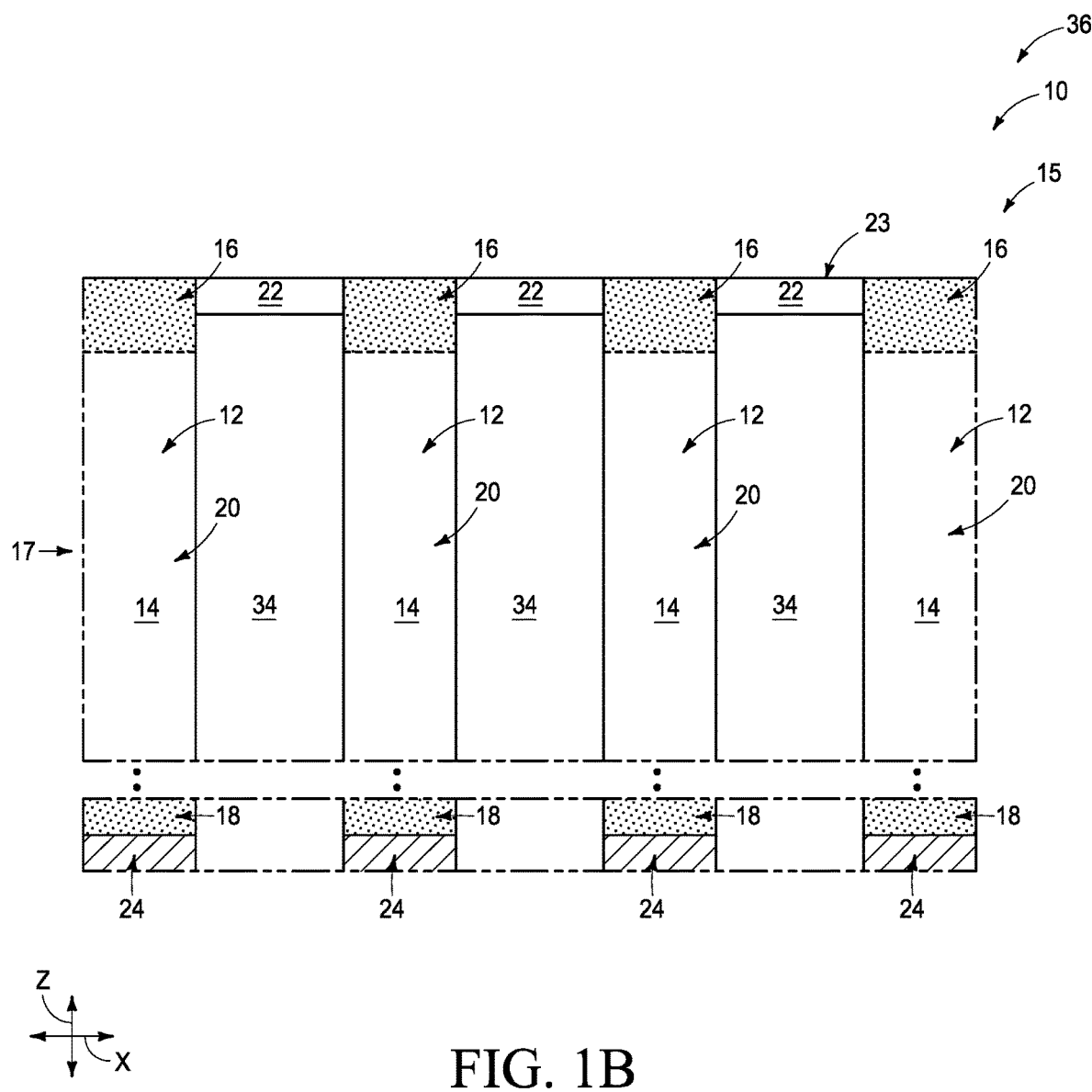
Figure 1B:
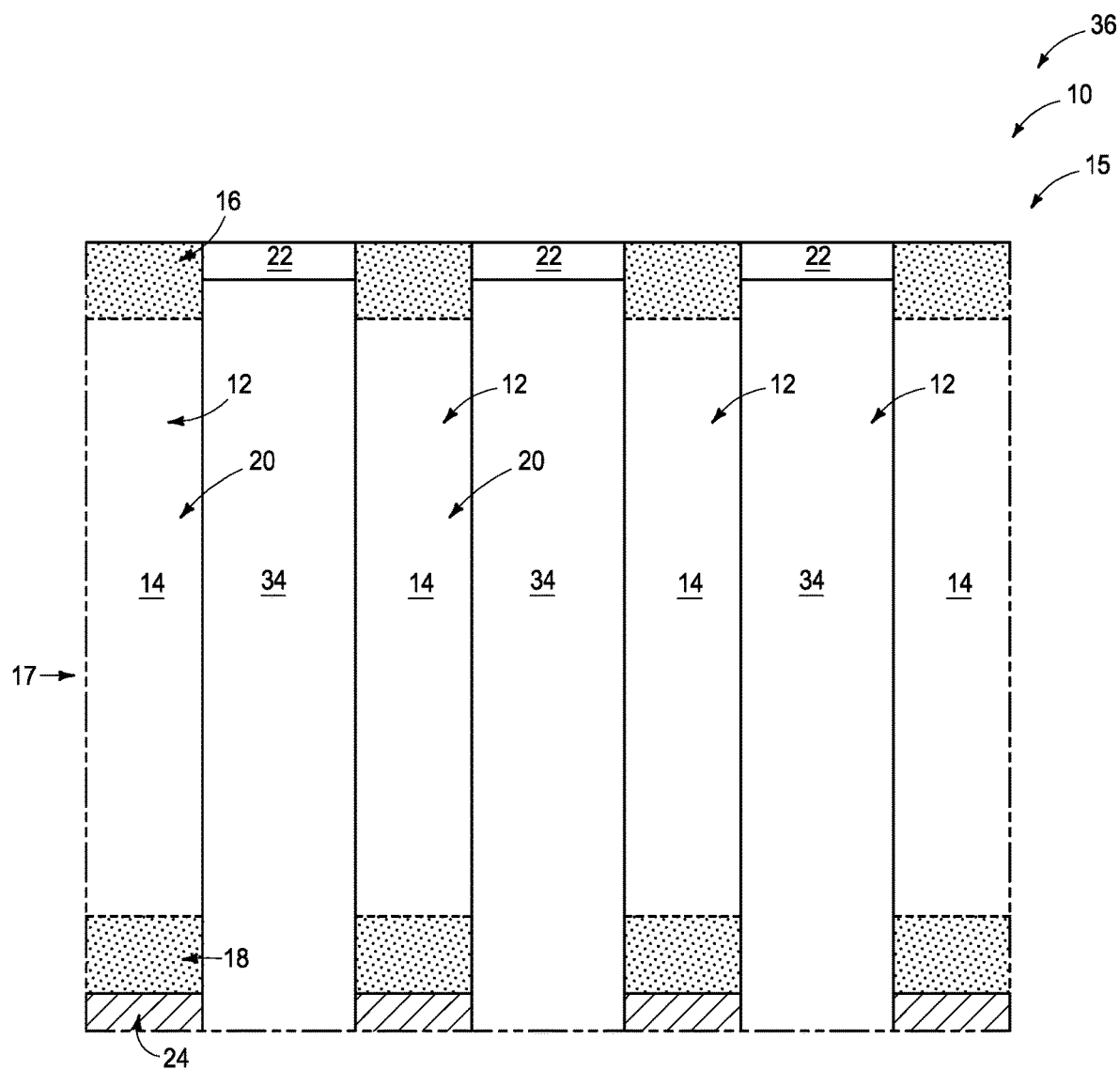
Figure 1:
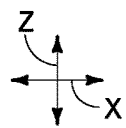

Referring to FIGS. 1-1B, a construction 10 includes vertically-extending pillars 12. The pillars 12 comprise semiconductor material 14. The pillars 12 are all substantially identical to one another, with the term "substantially identical" meaning identical to within reasonable tolerances of fabrication and measurement.

The semiconductor material 14 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of appropriately-doped silicon. The silicon may be in any suitable form, and in some embodiments may be monocrystalline, polycrystalline and/or amorphous.

Each of the pillars 12 includes a channel region 20 between an upper source/drain region 16 and a lower source/drain region 18. Stippling is utilized in the drawings to indicate that the source/drain regions 16 and 18 are heavily doped. In some embodiments, the source/drain regions 16 and 18 may be n-type doped by incorporating one or both of phosphorus and arsenic into the semiconductor material (e.g., silicon) 14 of the pillars 12. In some embodiments, one or both of the source/drain regions 16 and 18 may comprise additional conductive material besides the conductively-doped semiconductor material 14. For instance, one or both of the source/drain regions 16 and 18 may include metal silicide (e.g., titanium silicide, tungsten silicide, etc.) and/or other suitable conductive materials (e.g., titanium, tungsten, etc.). In some embodiments, the pillars 12 may be considered to be capped by the upper source/drain regions 16, with the term "capped" indicating that the upper source/drain regions may or may not include the semiconductor material 14 of the pillars 12.

The pillars 12 may be considered to be arranged in an array 15. The array may be considered to comprise rows 17 extending along an indicated x-axis direction, and to comprise columns 19 extending along an indicated y-axis direction.

Insulative material 22 extends between the upper source/drain regions 16. The insulative material 22 may comprise any suitable composition(s); and in some embodiments may comprise, consist essentially of, or consist of silicon nitride, silicon dioxide, aluminum oxide, etc. In some embodiments, the insulative material 22 may be referred to as a first insulative material.

A planarized upper surface 23 extends across the insulative material 22 and the source/drain regions 16. The planarized surface 23 may be formed utilizing chemical-mechanical polishing (CMP) and/or any other suitable process(es). In some embodiments, the surface 23 may be referred to as an upper surface of the construction 10.

The construction includes conductive structures (digit lines) 24 under the pillars 12. The digit lines 24 extend along the column direction (the illustrated y-axis direction) and are electrically coupled with the lower source/drain regions 18 of the pillars. The digit lines may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the digit lines are physically against the lower source/drain regions 18. In some embodiments, the digit lines may comprise metal (e.g., titanium, tungsten, etc.), the source/drain regions 18 may comprise conductively-doped silicon, and metal silicide be present where the silicon of the source/drain regions 18 interfaces with the digit lines 24.

Gating structures (wordlines) 25 are alongside the pillars 12 and comprise gates 26. The gates 26 are spaced from the pillars by dielectric material (also referred to as gate dielectric material) 28. The gating structures 25 extend along the row direction (i.e., along the illustrated x-axis direction).

The gating structures 25 (and associated gates 26) may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The dielectric material 28 may comprise any suitable composition(s); and in some embodiments may comprise, consist essentially of, or consist of one or more of silicon nitride, silicon dioxide, aluminum oxide, hafnium oxide, etc.

The dielectric material 28 is provided between the gates 26 and the channel regions 20, and may extend to any suitable vertical dimension. In the shown embodiment the dielectric material 28 extends upwardly beyond the uppermost surfaces of the gates 26. In other embodiments the dielectric material 28 may or may not extend vertically beyond the gates 26.

The gates (transistor gates) 26 may be considered to be operatively adjacent to (operatively proximate to) the channel regions 20 such that a sufficient voltage applied to an individual gate 26 (specifically along a wordline 25 comprising the gate) will induce an electric field on a channel region near the gate which enables current flow through the channel region to electrically couple the source/drain regions on opposing sides of the channel region with one another. If the voltage to the gate is below a threshold level, the current will not flow through the channel region, and the source/drain regions on opposing sides of the channel region will not be electrically coupled with one another. The selective control of the coupling/decoupling of the source/drain regions through the level of voltage applied to the gate may be referred to as gated coupling of the source/drain regions.

Shield lines 30 are alongside the pillars 12, and are spaced from the pillars by dielectric material 32. The shield lines may be electrically coupled with ground or any other suitable reference voltage. The shield lines 30 extend along the row direction (i.e., along the illustrated x-axis direction). The shield lines 30 may be considered to be within regions between the pillars 12 along the cross-sectional view of FIG. 1A.

The dielectric material 32 may comprise any suitable composition(s); and in some embodiments may comprise, consist essentially of, or consist of one or more of silicon dioxide, silicon nitride, aluminum oxide, hafnium oxide, etc. In the shown embodiment the dielectric material 32 extends vertically beyond the shield lines 30. In other embodiments the dielectric material 32 may or may not extend vertically beyond the shield lines 30.

The shield lines 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the shown embodiment, each of the pillars 12 shown along the cross-section of FIG. 1A has one side adjacent a gate 26, and has an opposing side adjacent a shield line 30.

In the shown embodiment, insulative material 34 is over the gates 26 and the shield lines 30. The insulative material 34 may comprise any suitable composition(s); and may, for example, comprise silicon dioxide, silicon nitride, aluminum oxide, etc. In some embodiments the material 34 may comprise a same composition as one or both of the dielectric materials 28 and 32, and in other embodiments the material 34 may comprise a different composition than at least one of the dielectric materials 28 and 32.

Each of the pillars 12 is coupled to one of the wordlines 25 and one of the digit lines 24; and accordingly each of the pillars 12 may be considered to be uniquely addressed by one of the wordlines and one of the digit lines.

The construction 10 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

In some embodiments, the construction 10 of FIGS. 1-1B may be considered to represent a portion of an integrated assembly 36.

In the embodiment of FIGS. 1A and 1B, a gap is provided within the construction 10 to break a region of the pillars 12 above the lower source/drain regions 18. The gap enables the view of construction 10 to be collapsed into a smaller area, which leaves more room for additional materials formed over the construction 10 at subsequent process stages. It is to be understood that the pillars 12 extend across the illustrated gap. FIGS. 1A-1 and 1B-1 show views along the same cross-sections as FIG. 1A and FIG. 1B, and show the construction 10 without the gap of FIGS. 1A and 1B. FIGS. 1A-1 and 1B-1 are provided to assist the reader in understanding the arrangement of construction 10. The views of FIGS. 1A and 1B (i.e., the views with the gaps in construction 10) will be used for the remaining figures of this disclosure.

Figure 2:
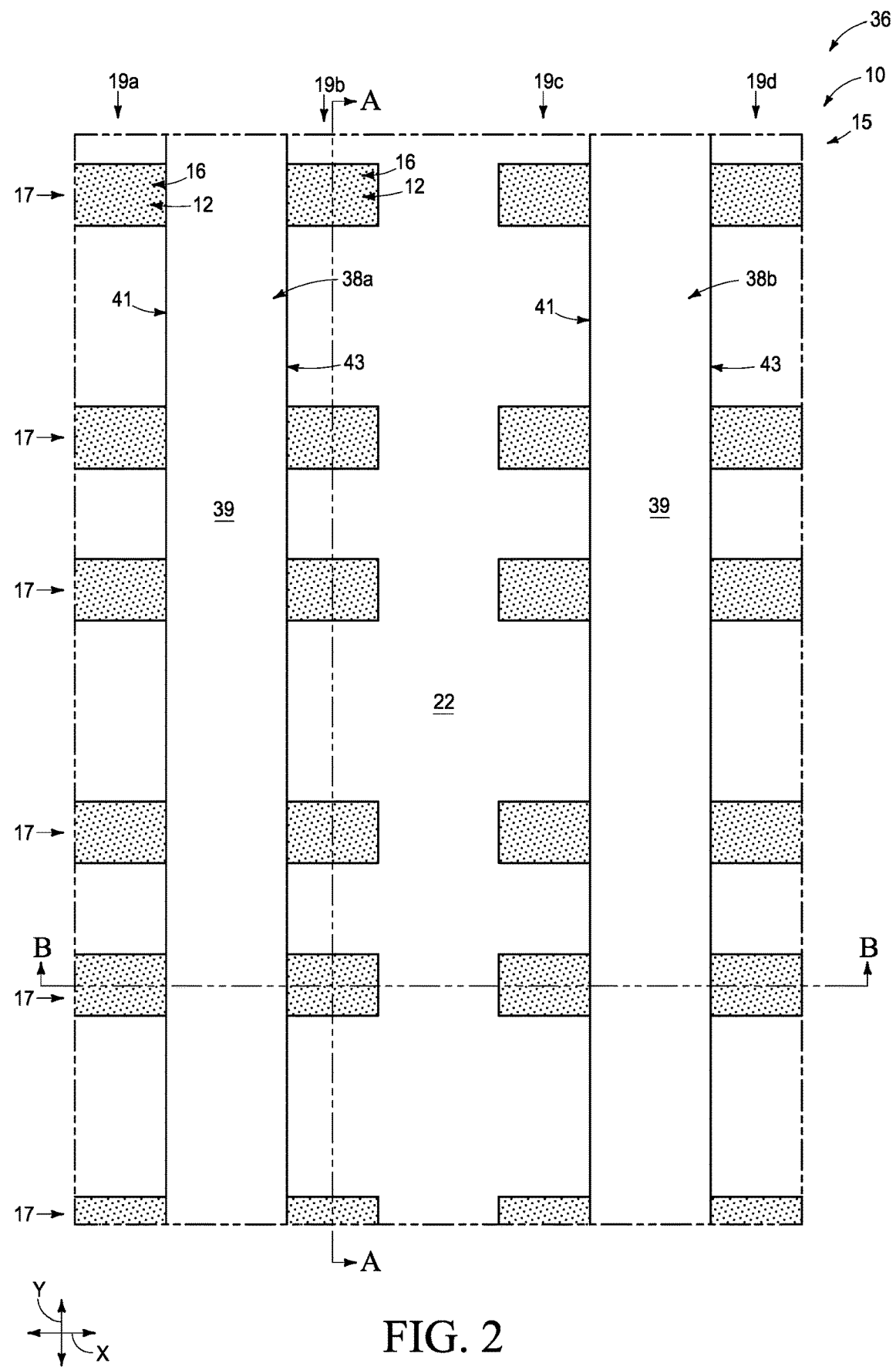
FIGS. 2-2B are diagrammatic views of the region of FIGS. 1-1B at an example process stage following that of FIGS. 1-1B.
Figure 2A:
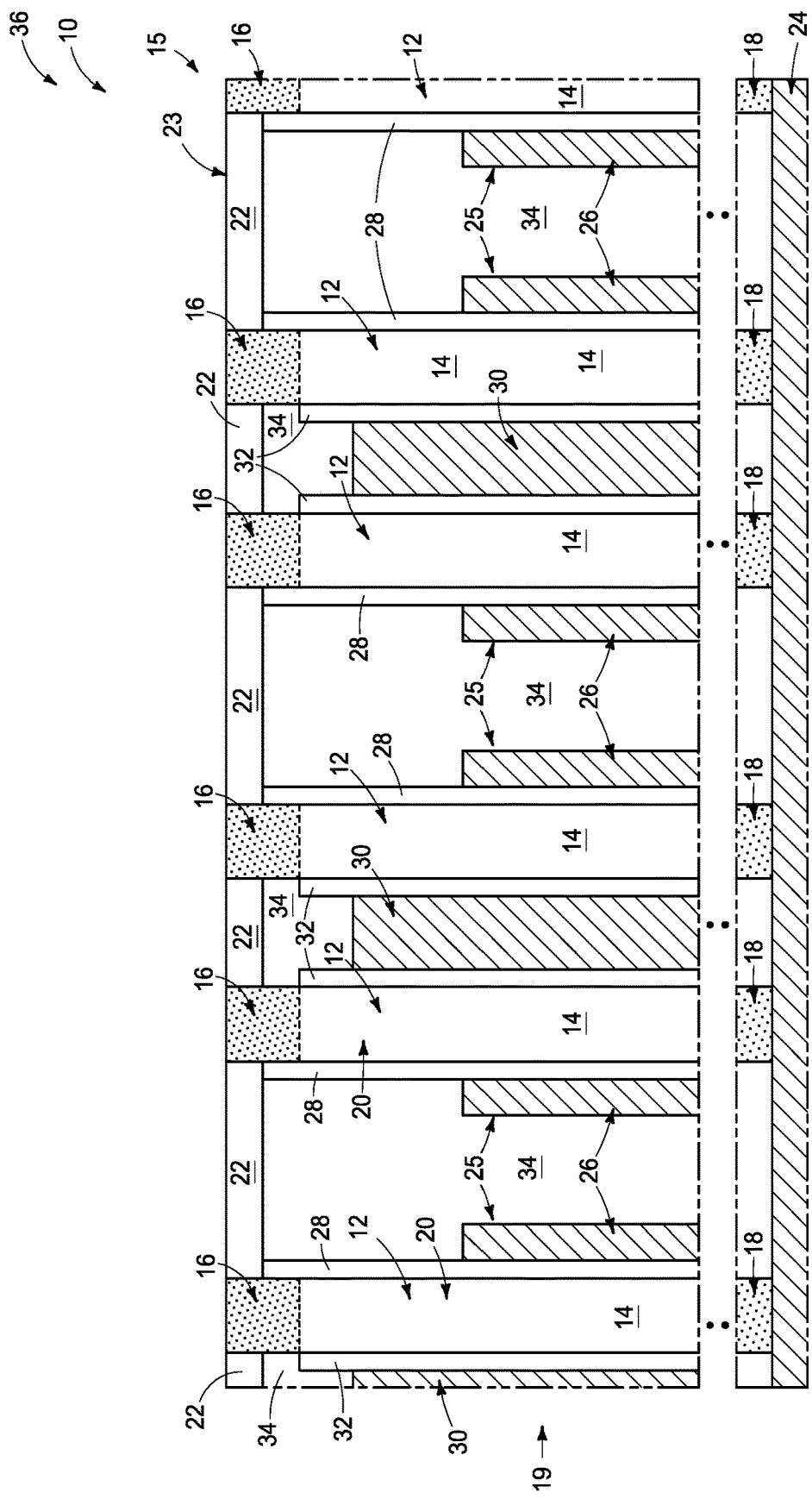
Figure 2B:
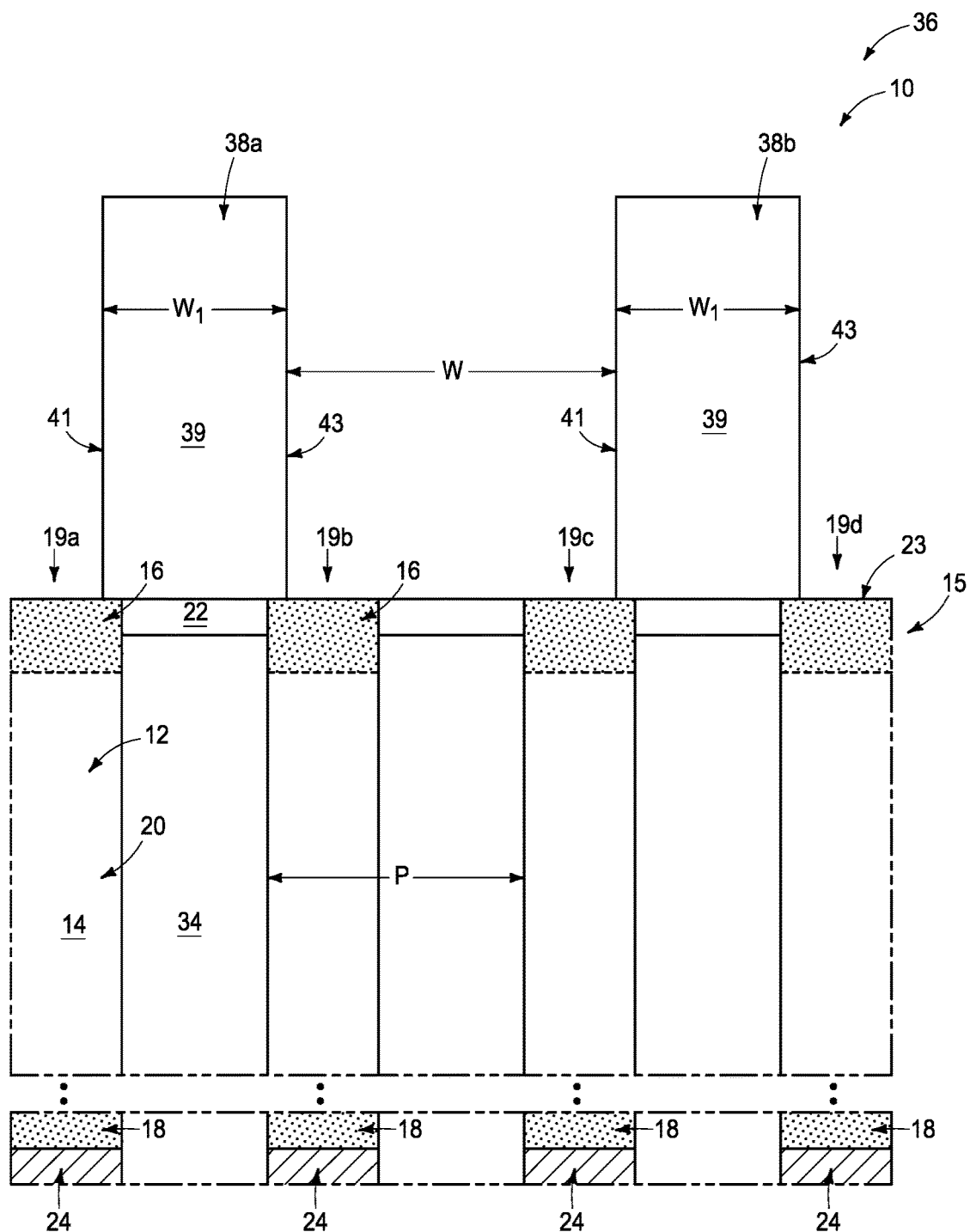

Referring to FIGS. 2-2B, the assembly 36 is shown at a process stage subsequent to that of FIGS. 1-1B. Linear insulative structures (rails, beams) 38 are formed over the upper surface 23 of construction 10. The structures 38 comprise insulative material 39. The material 39 may comprise any suitable composition(s); and in some embodiments may comprise, consist essentially of, or consist of silicon dioxide, silicon nitride, aluminum oxide, etc. It may be desirable for the material 39 to be a different composition than the material 22 so that the material 39 may be patterned selectively relative to the material 22 during the formation of the linear structures 38.

The illustrated linear structures 38 are labeled 38a and 38b so that they may be distinguished relative to one another.

The linear structures 38 extend along the column direction (the illustrated y-axis direction), and are formed to be between columns of the pillars 12. Each of the linear structures 38 has a pair of opposing lateral surfaces 41 and 43. The surfaces 41 and 43 may be referred to as first and second lateral sides, respectively, of the linear structures 38.

Each of the linear structures 38 may be considered to be associated with a pair of the columns 19 of the pillars 12, with such associated columns being along the sides 41 and 43. For instance, the columns 19 of FIG. 2 are labeled as 19a-d. Columns 19a and 19b are along the sides 41 and 43 of the linear structure 38a and may be considered to be associated with such linear structure. Similarly, columns 19c and 19d are along the sides 41 and 43 of the linear structure 38b and may be considered to be associated with such linear structure.

In the shown embodiment, the linear structures 38 laterally overlap portions of the source/drain regions 16 of the associated columns 19, as shown in FIG. 2B. In other embodiments, the linear structures 38 may be formed between the associated columns and may not laterally overlap the source/drain regions 16 of the associated columns (as described in more detail below with reference to FIG. 17).

The linear structures 38 may be formed with any suitable processing. For instance, an expanse of the material 39 may be formed across the upper surface 23, and such expanse may be patterned utilizing a patterned mask (not shown) and one or more suitable etches.

In the illustrated embodiment, the sidewall surfaces 41 and 43 are substantially vertical and extend substantially orthogonally relative to the substantially horizontal upper surface 23. The term "substantially vertical" means vertical to within reasonable tolerances of fabrication and measurement, the term "substantially orthogonal" means orthogonal to within reasonable tolerances of fabrication and measurement, and the term "substantially horizontal" means horizontal to within reasonable tolerances of fabrication and measurement.

FIG. 2B shows the pillars 12 to be on a pitch P along the cross-section of the figure. The linear structures 38a and 38b are spaced from one another by a gap having width W. The width W may be any suitable dimension, and in some embodiments may be within a range of from about one-fourth of the pitch P to about one-half of the pitch P. In some embodiments, the width W may be within a range of from about 20 nanometers (nm) to about 60 nm. The structures 38a and 38b have widths $W_1$ along the cross-section of FIG. 2B. In some embodiments, a ratio of $W_1$:W may be within a range of from about 1:2 to about 1:1.

Figure 3:
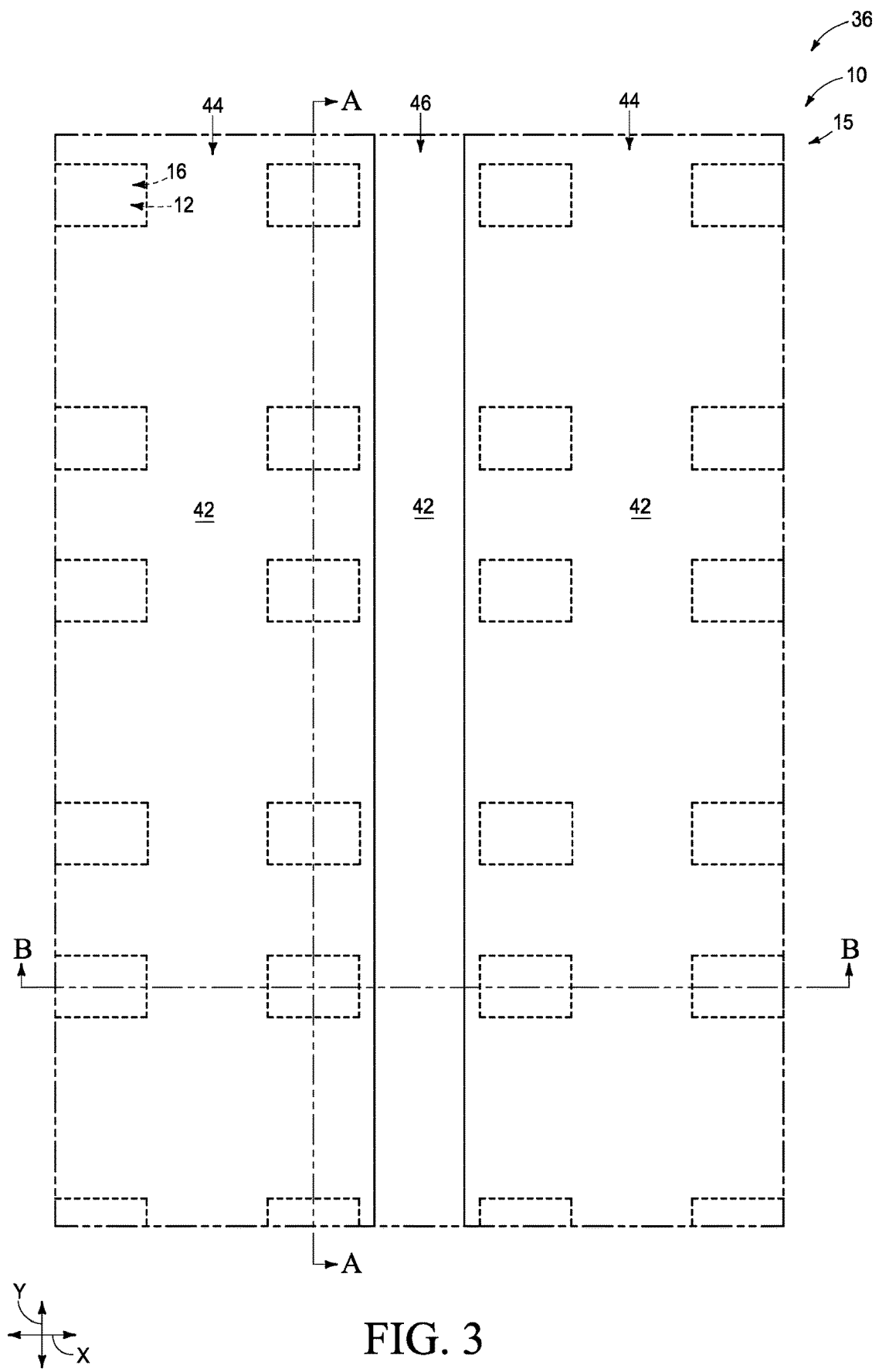
FIGS. 3-3B are diagrammatic views of the region of FIGS. 1-1B at an example process stage following that of FIGS. 2-2B.
Figure 3B:
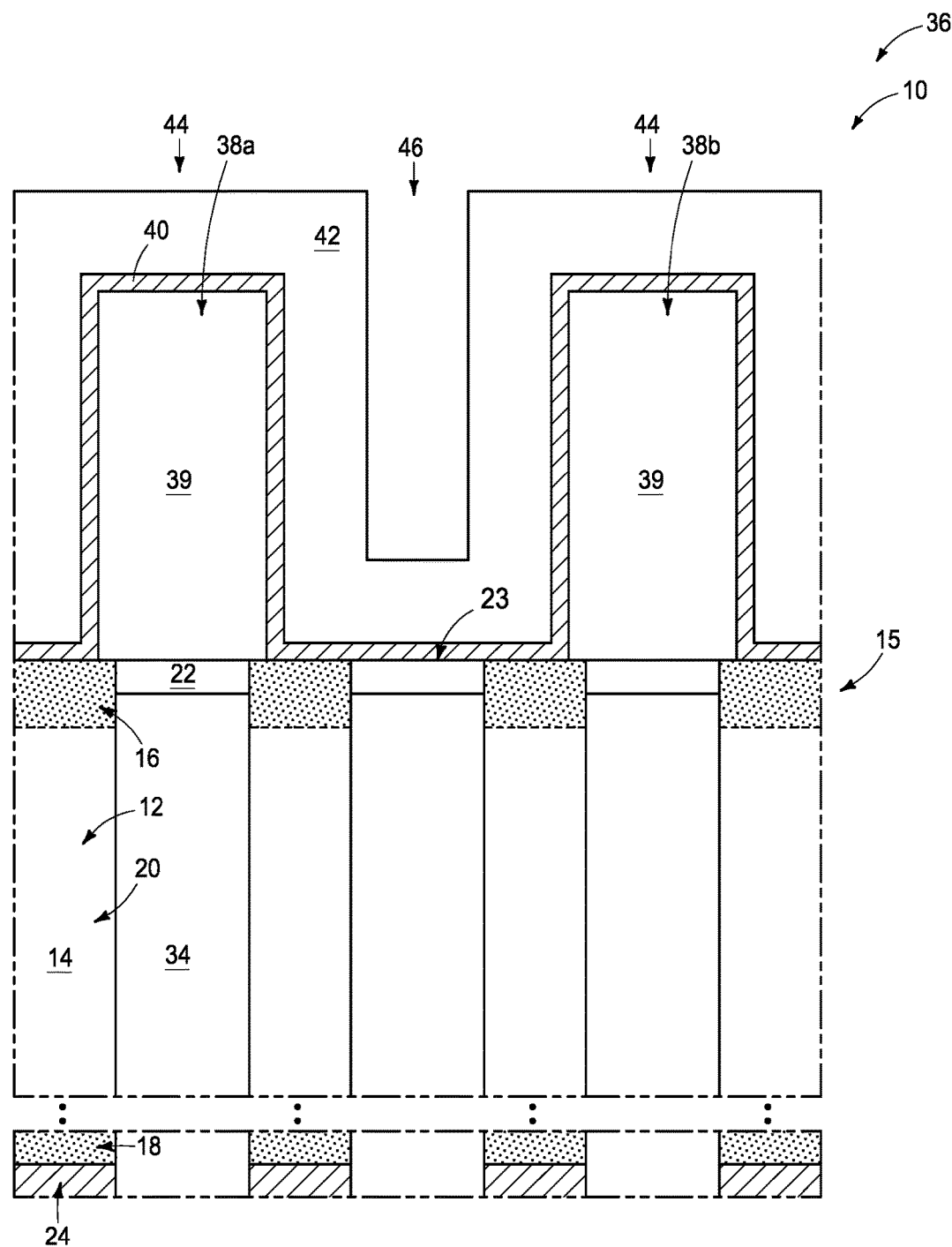

Referring to FIGS. 3-3B, bottom-electrode-material 40 is formed to extend conformally along the linear structures 38, and along regions of the upper surface 23 between the linear structures. The bottom-electrode-material 40 extends across the upper source/drain regions 16, and is electrically coupled with such source/drain regions. In the illustrated embodiment, the bottom-electrode-material 40 is directly against upper surfaces of the source/drain regions 16. The bottom-electrode-material 40 may have any suitable thickness; and in some embodiments may have a thickness within a range of from about 1 nanometer (nm) to about 5 nm. The source/drain regions 16 and associated pillars 12 are shown in dashed-line (phantom) view in FIG. 3 to indicate that they are under other materials.

The bottom-electrode-material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the bottom-electrode-material 40 may comprise, consist essentially of, or consist of titanium nitride.

A patterning material 42 is formed over the bottom-electrode-material 40. The patterning material 42 has an undulating topography which includes peaks 44 over the linear structures 38, and valleys 46 between the peaks. The material 42 may be formed to any suitable thickness (e.g., a thickness within a range of from about 10 nm to about 30 nm); and may comprise any suitable composition(s). In some embodiments, the material 42 may comprise, consist essentially of, or consist of one or more of silicon dioxide, silicon nitride and silicon oxynitride. In the embodiment of FIGS. 3-3B, the materials 22 and 42 may comprise silicon nitride, and the material 34 may comprise silicon dioxide.

Figure 4:
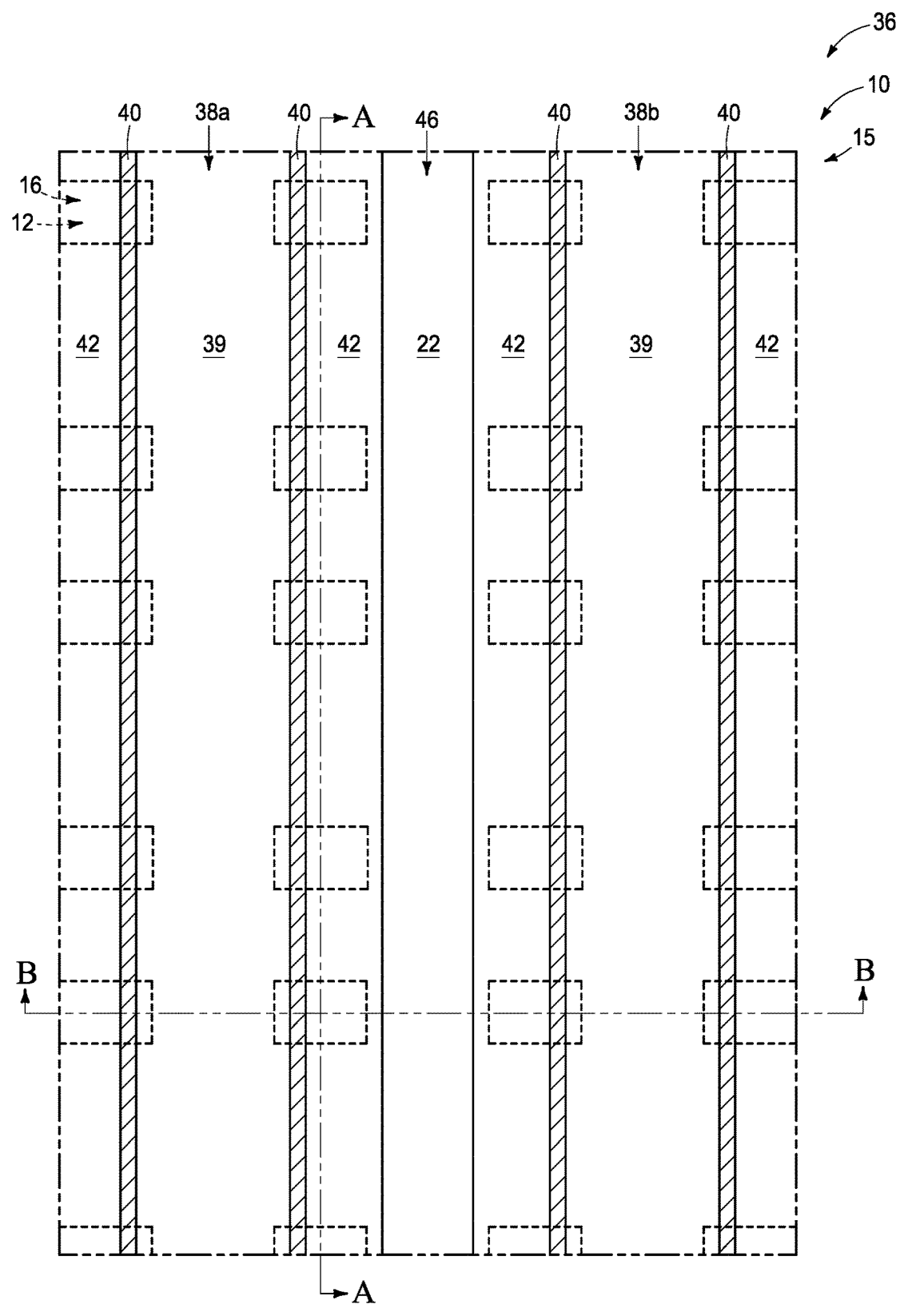
FIGS. 4-4B are diagrammatic views of the region of FIGS. 1-1B at an example process stage following that of FIGS. 3-3B.
Figure 4:
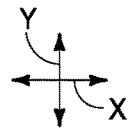
Figure 4A:
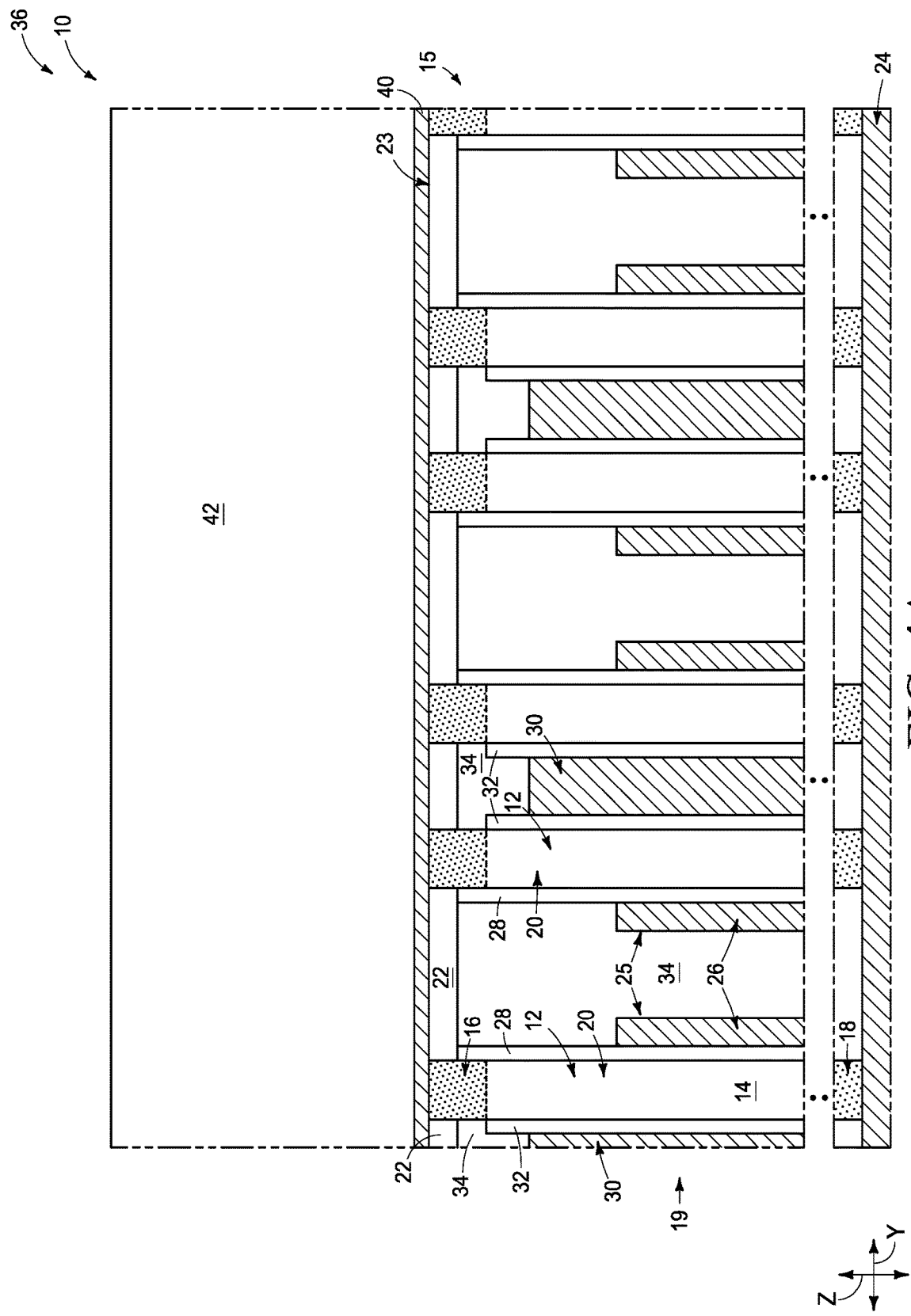
Figure 4B:
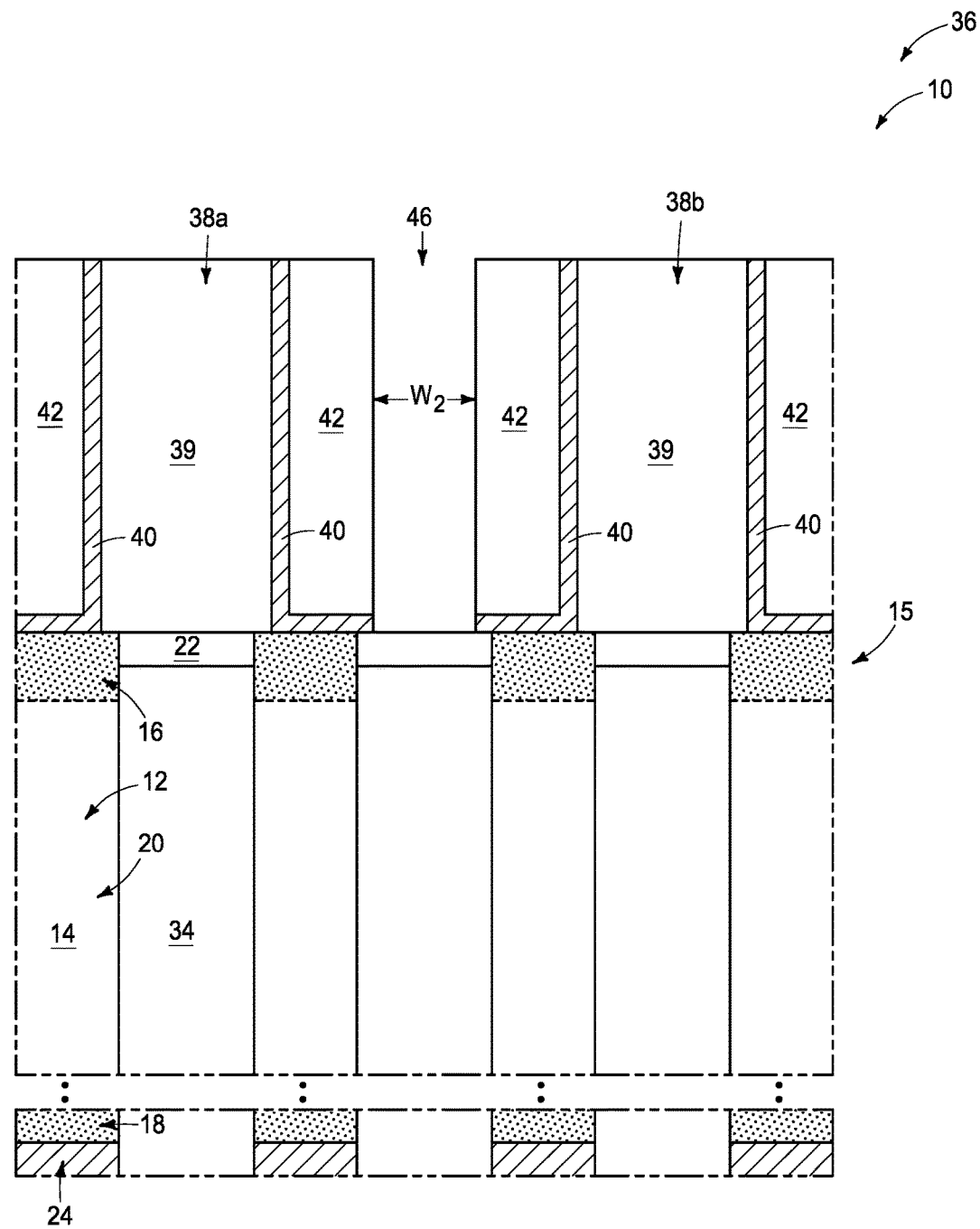

Referring to FIGS. 4-4B, the assembly 36 is subjected to one or more etches, and possibly also planarization, to remove the materials 40 and 42 from over the linear structures (insulative structures) 38; and to extend the valleys 46 through the materials 40 and 42, and to the insulative material 22. The valleys 46 thus become openings 46 which extend through the materials 42 and 40 to the material 22. In the illustrated embodiment, the openings 46 stop at an upper surface of the material 22. In other embodiments, the openings 46 may penetrate into the material 22 (or may even penetrate through the material 22 and stop at the underlying material 34).

The illustrated embodiment shows the upper surfaces of materials 39, 40 and 42 being substantially coplanar. In other embodiments at least one of such upper surfaces may be at a different elevational level relative to one or more of the others of such upper surfaces.

The illustrated opening 46 may, for example, have a width W2 along the cross-section of FIG. 4A within a range of from about 10 nm to about 30 nm.

Figure 5:
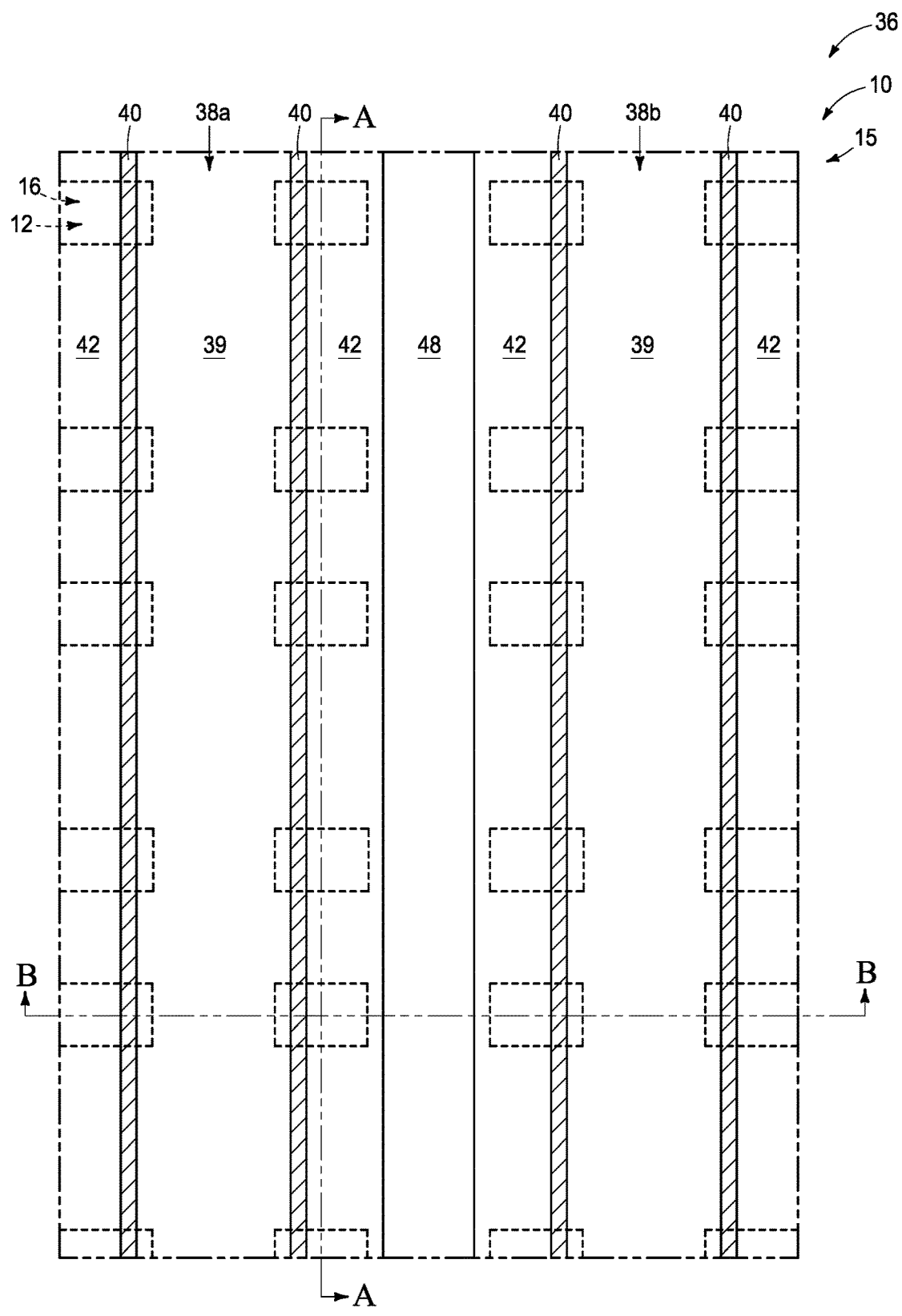
FIGS. 5-5B are diagrammatic views of the region of FIGS. 1-1B at an example process stage following that of FIGS. 4-4B.
Figure 5A:
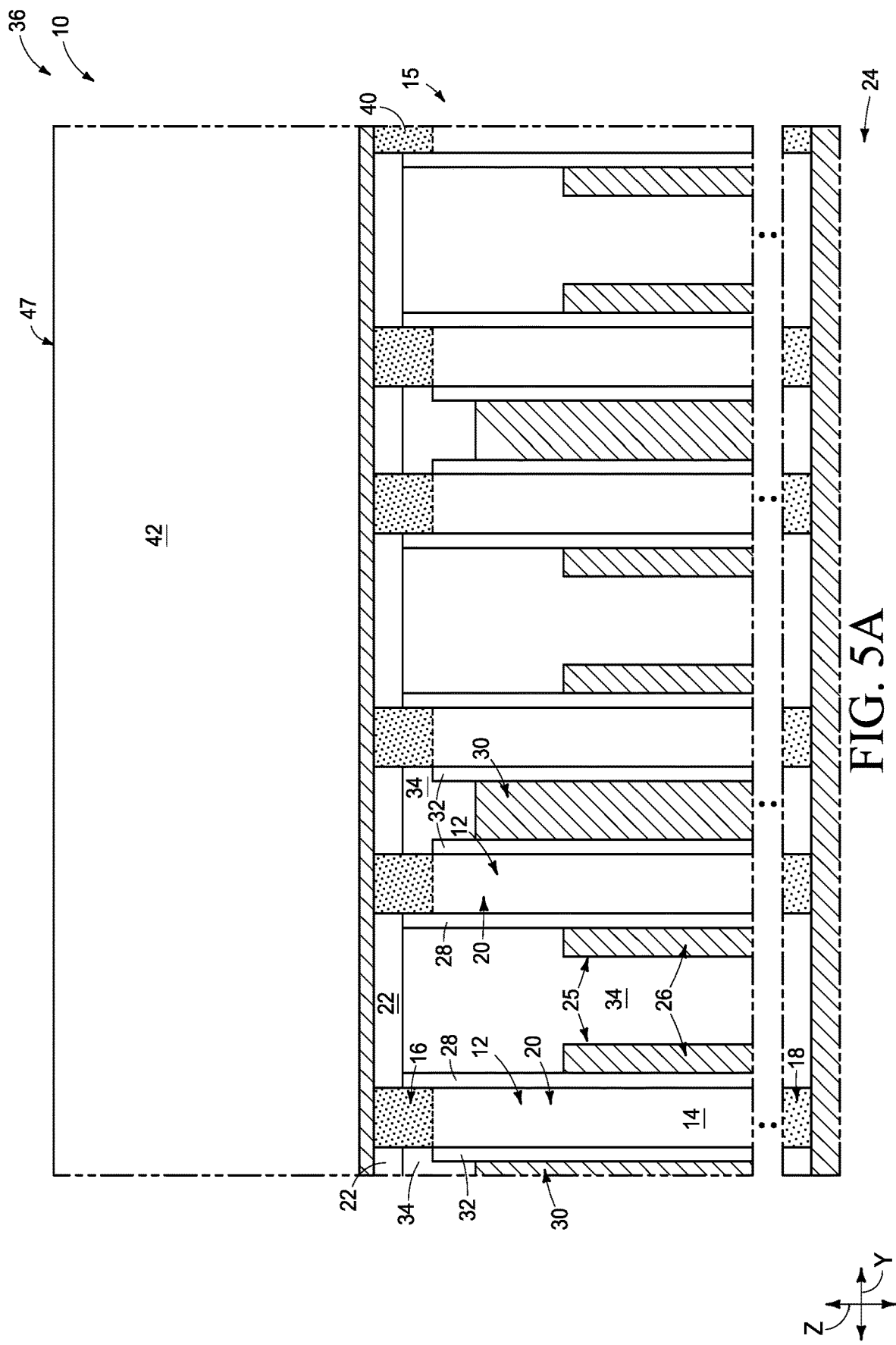
Figure 5B:
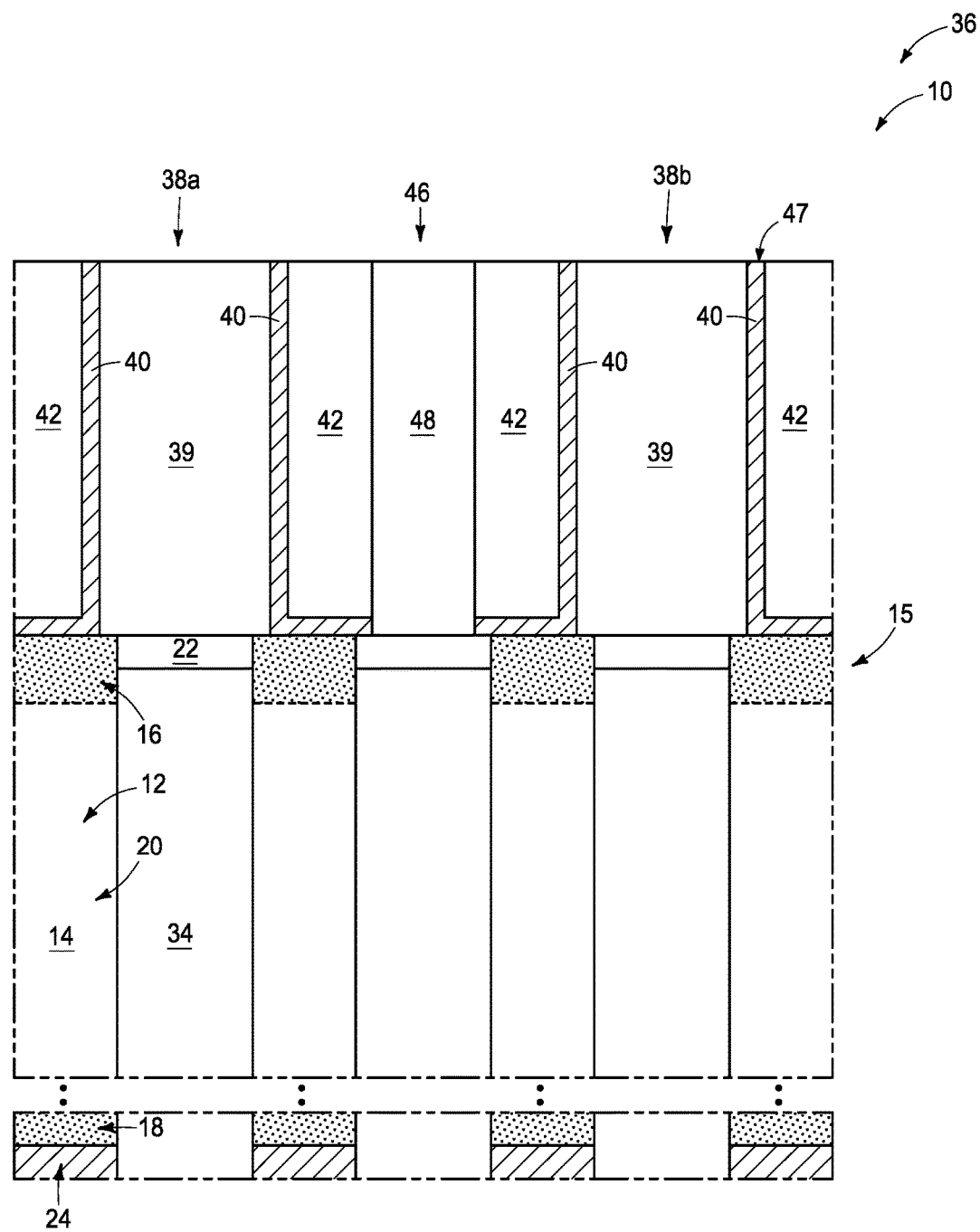

Referring to FIGS. 5-5B, fill material 48 is formed within the opening 46. Subsequently, CMP and/or other suitable planarization is utilized to form a planar surface 47 extending across the materials 39, 40, 42 and 48.

The fill material 48 may comprise any suitable composition(s); and in some embodiments may comprise, consist essentially of, or consist of one or more of silicon dioxide, silicon nitride and silicon oxynitride. Accordingly, the fill material 48 may or may not be a same composition as the patterning material 42.

Figure 6:
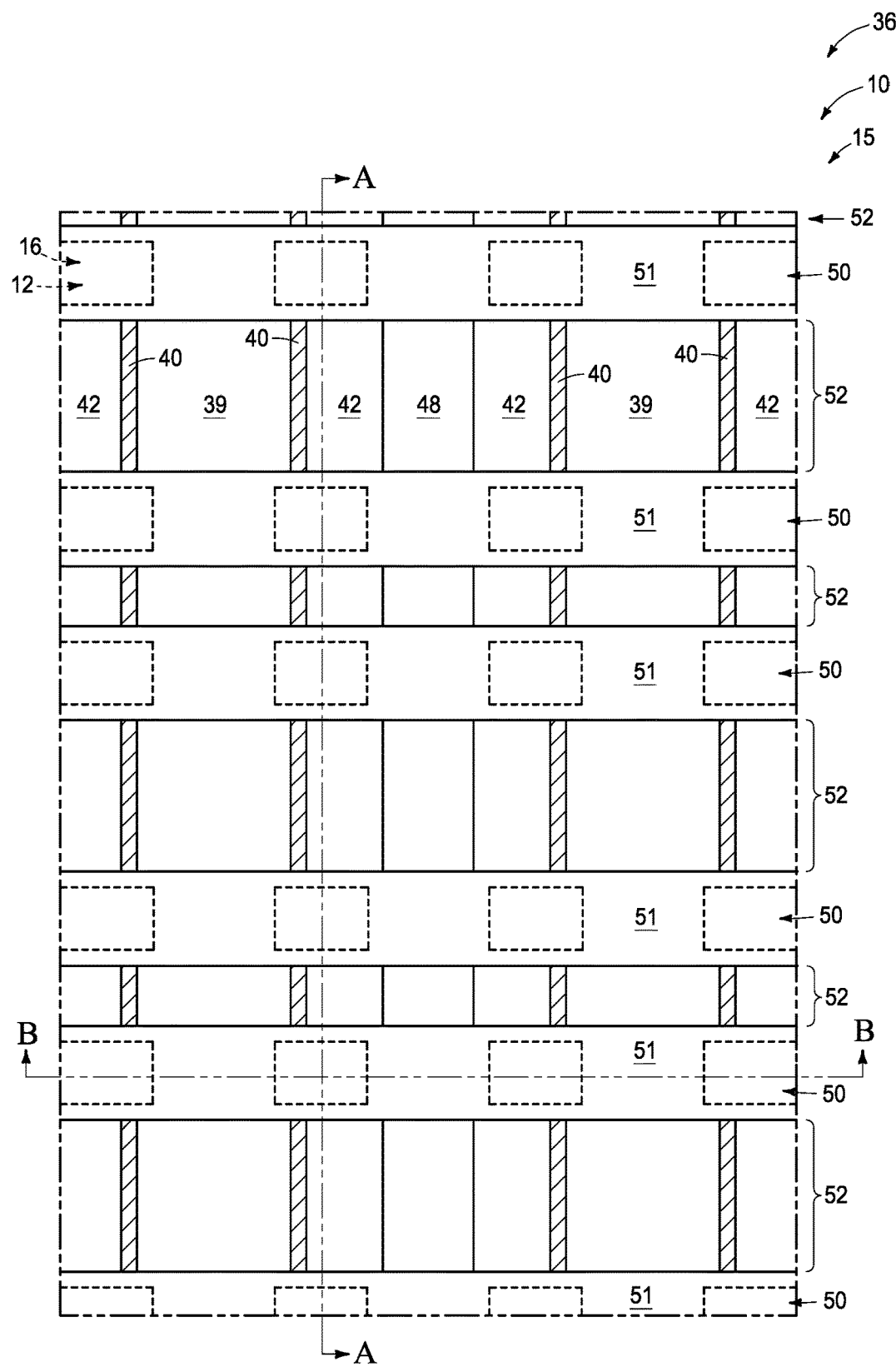
FIGS. 6-6B are diagrammatic views of the region of FIGS. 1-1B at an example process stage following that of FIGS. 5-5B.
Figure 6:
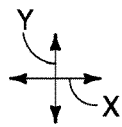
Figures 1, 6:
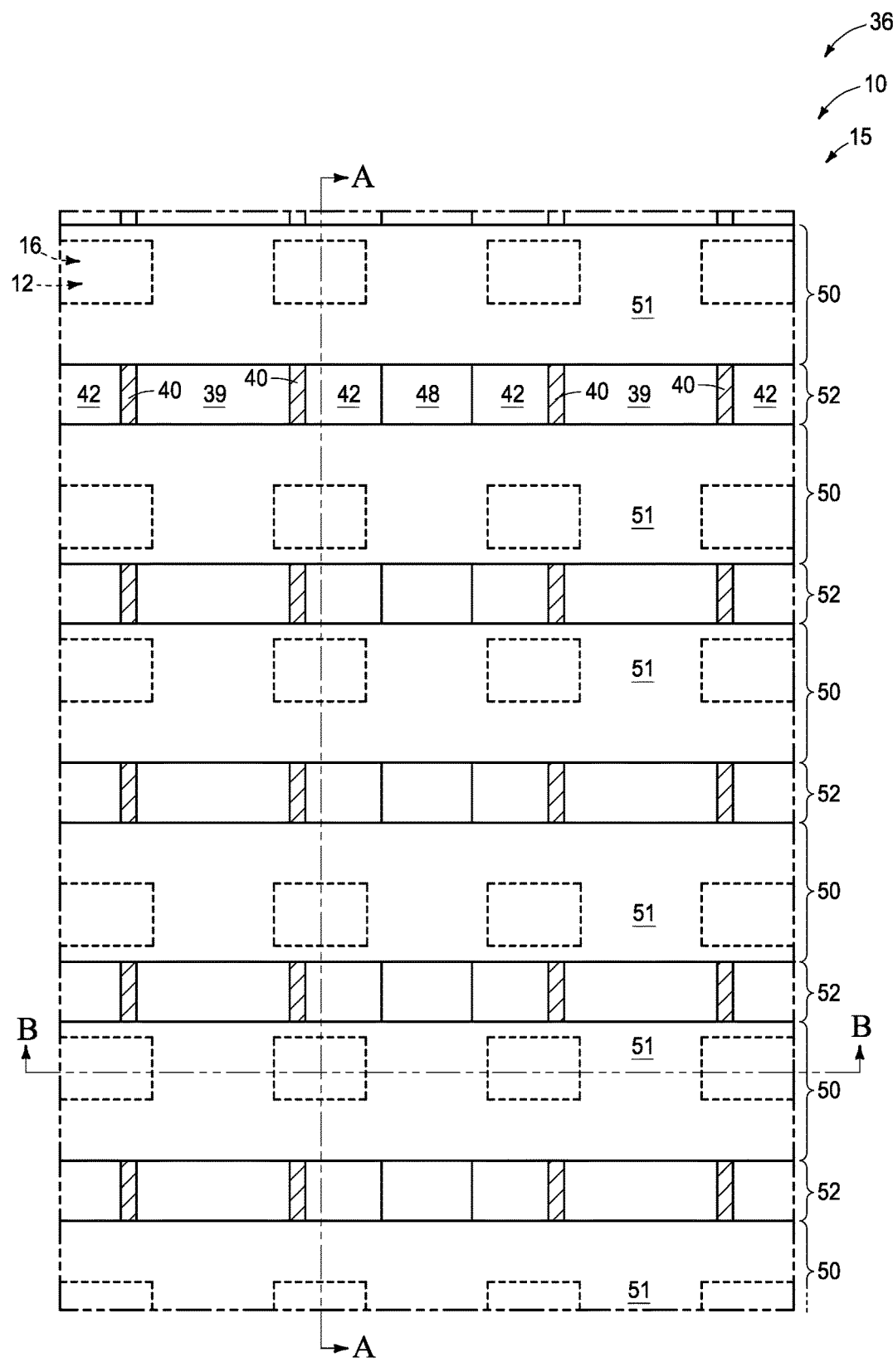
Figure 6A:
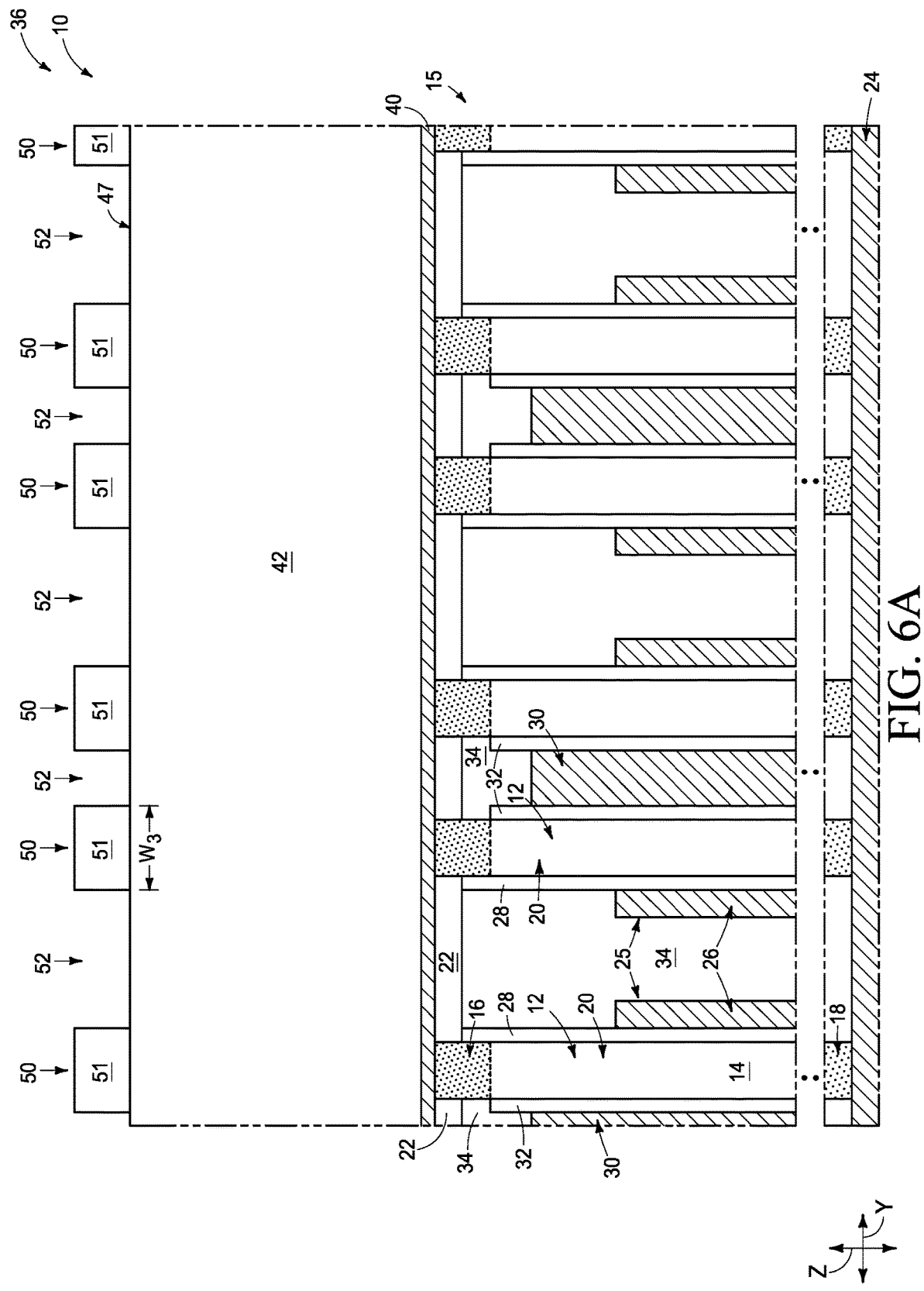
Figures 1, 6A:
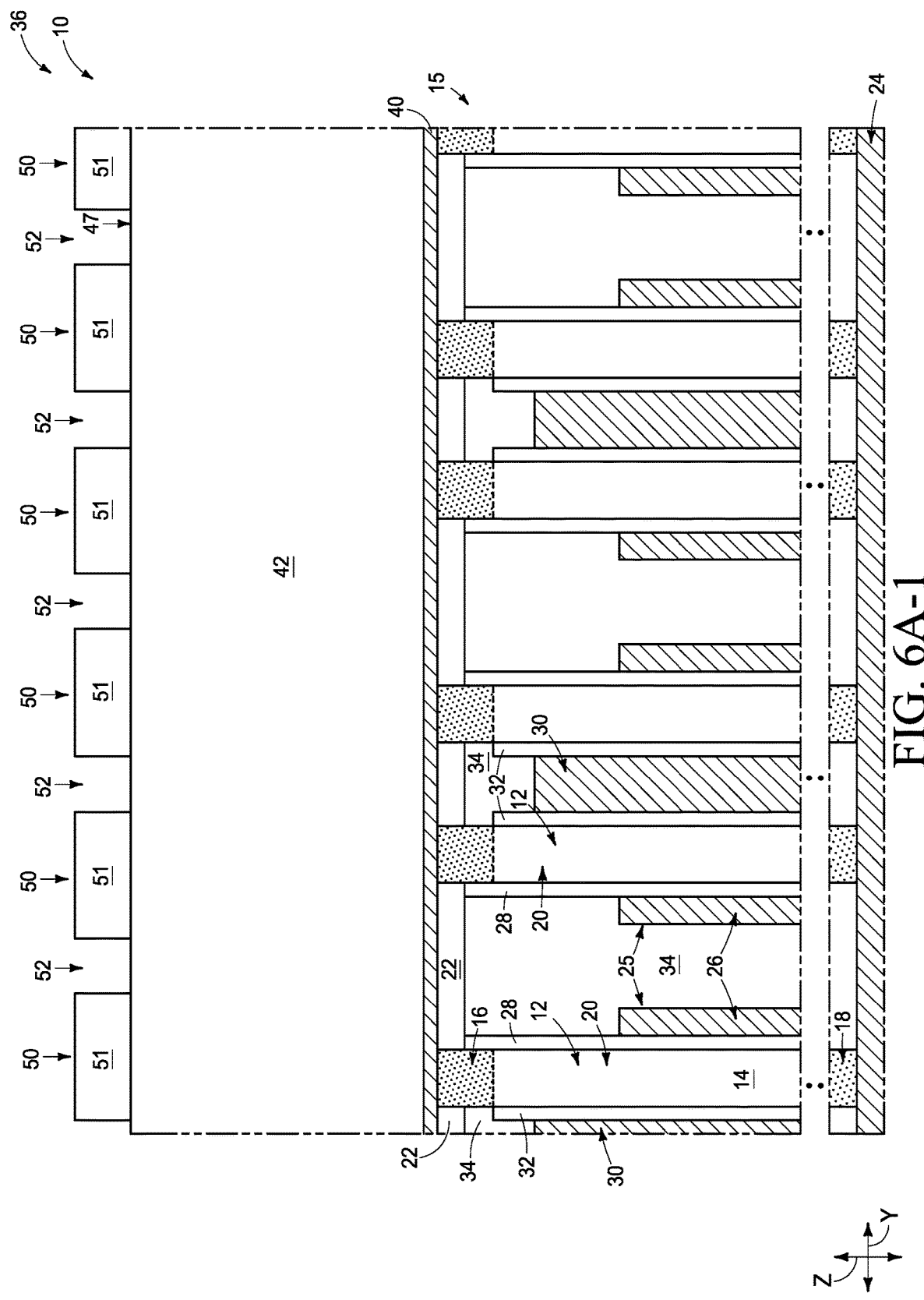
Figure 6B:
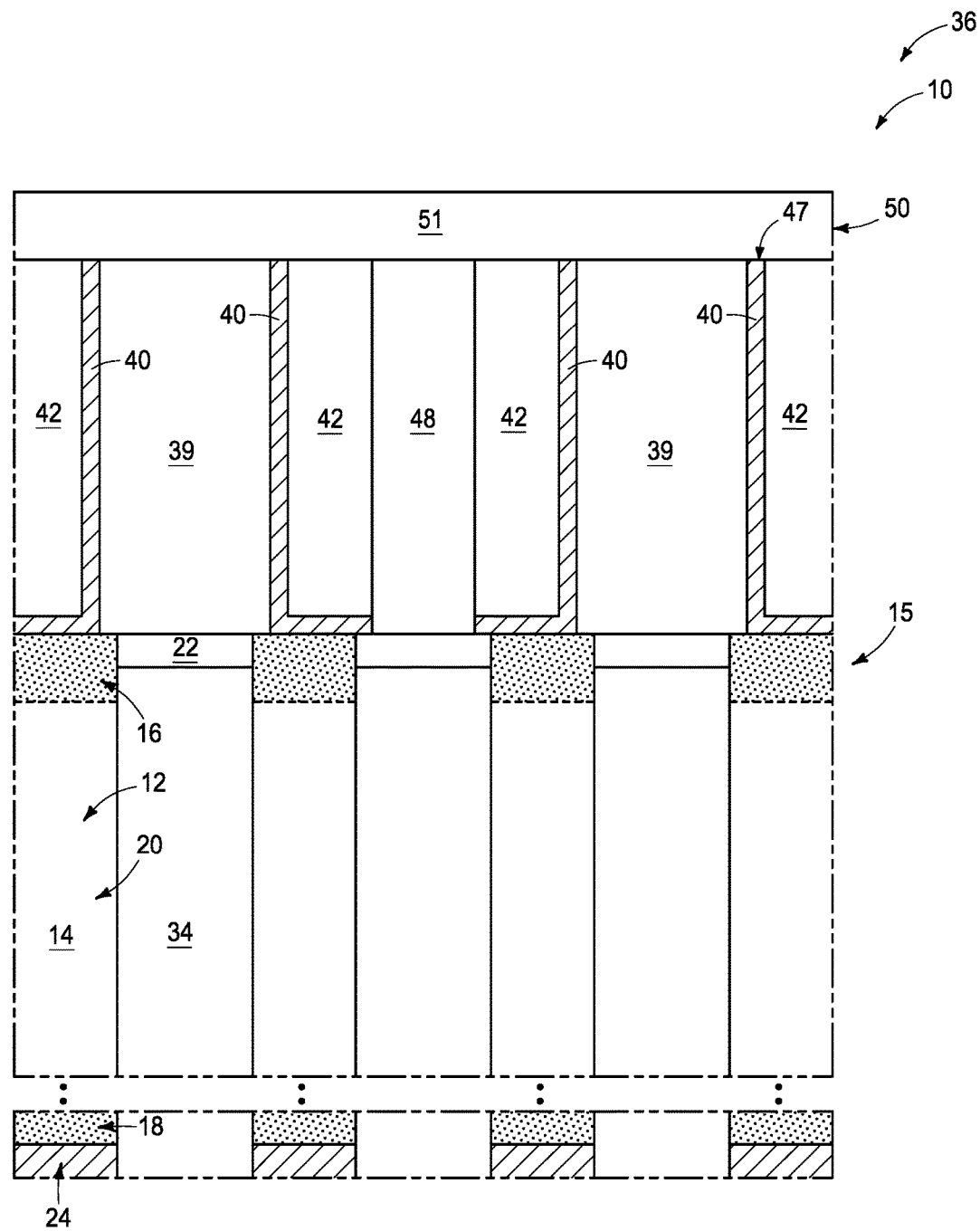

Referring to FIGS. 6-6B, mask structures (beams, rails) 50 are formed on the planar surface 47, and extend along the row direction (the illustrated x-axis direction). The mask structures 50 may comprise any suitable composition(s) 51; and in some embodiments may comprise, consist essentially of, or consist of carbon-containing material (e.g., amorphous carbon, resist, etc.).

The mask structures 50 are spaced from one another by intervening gaps (also referred to as spacings or openings) 52.

The mask structures 50 may have any suitable dimensions; and may, for example, have widths $W_3$ along the cross-section of FIG. 6A within a range of from about 10 nm to about 30 nm.

The embodiment of FIGS. 6 and 6A shows the spacings 52 varying in width along the y-axis direction. In other embodiments, the mask structures may be patterned to be wider than shown in FIGS. 6 and 6A so that the spacings 52 are all of about the same width along the y-axis direction, as shown in FIGS. 6-1 and 6A-1.

Figure 7:
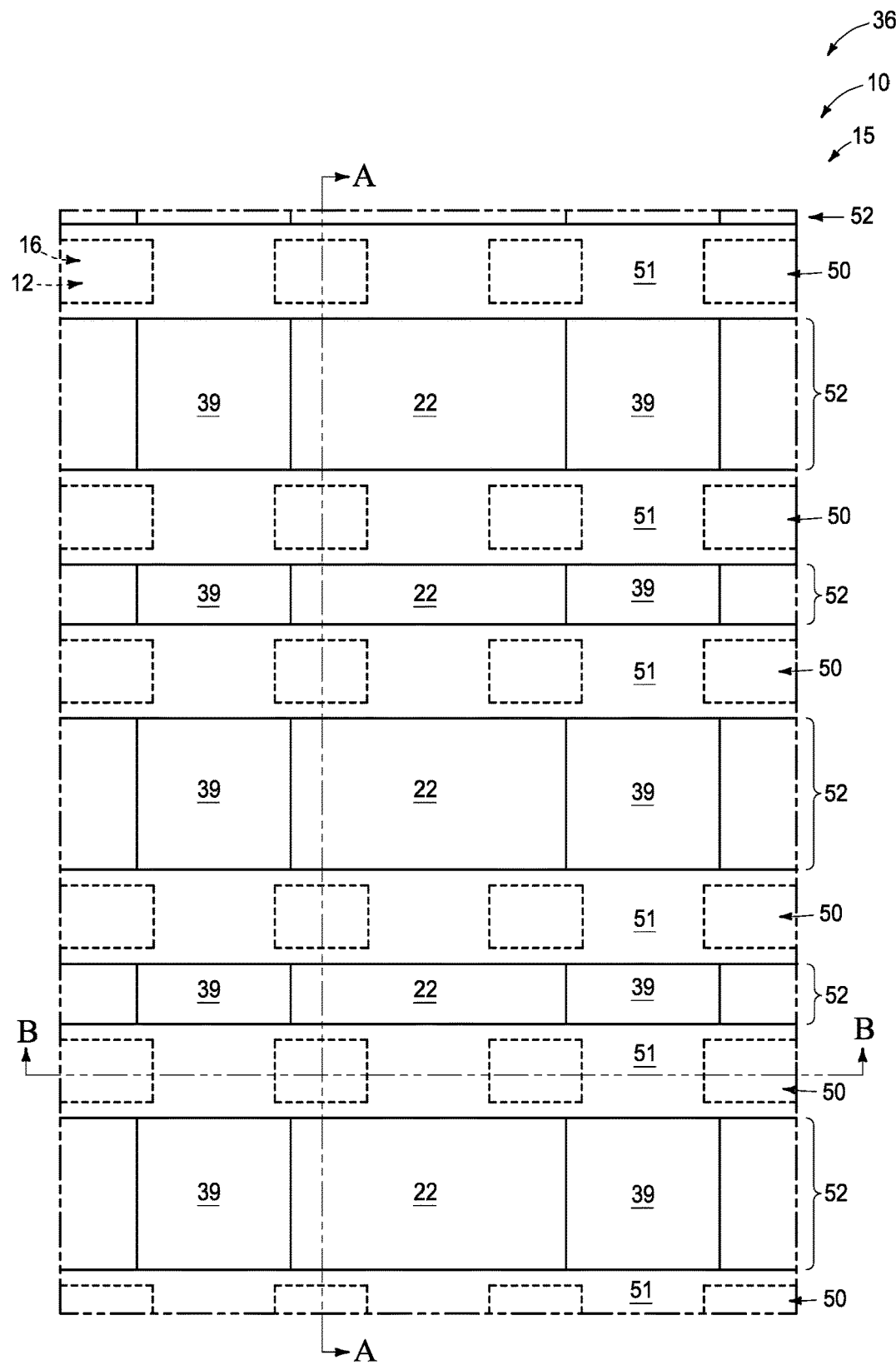
FIGS. 7-7B are diagrammatic views of the region of FIGS. 1-1B at an example process stage following that of FIGS. 6-6B.
Figures 1, 7:
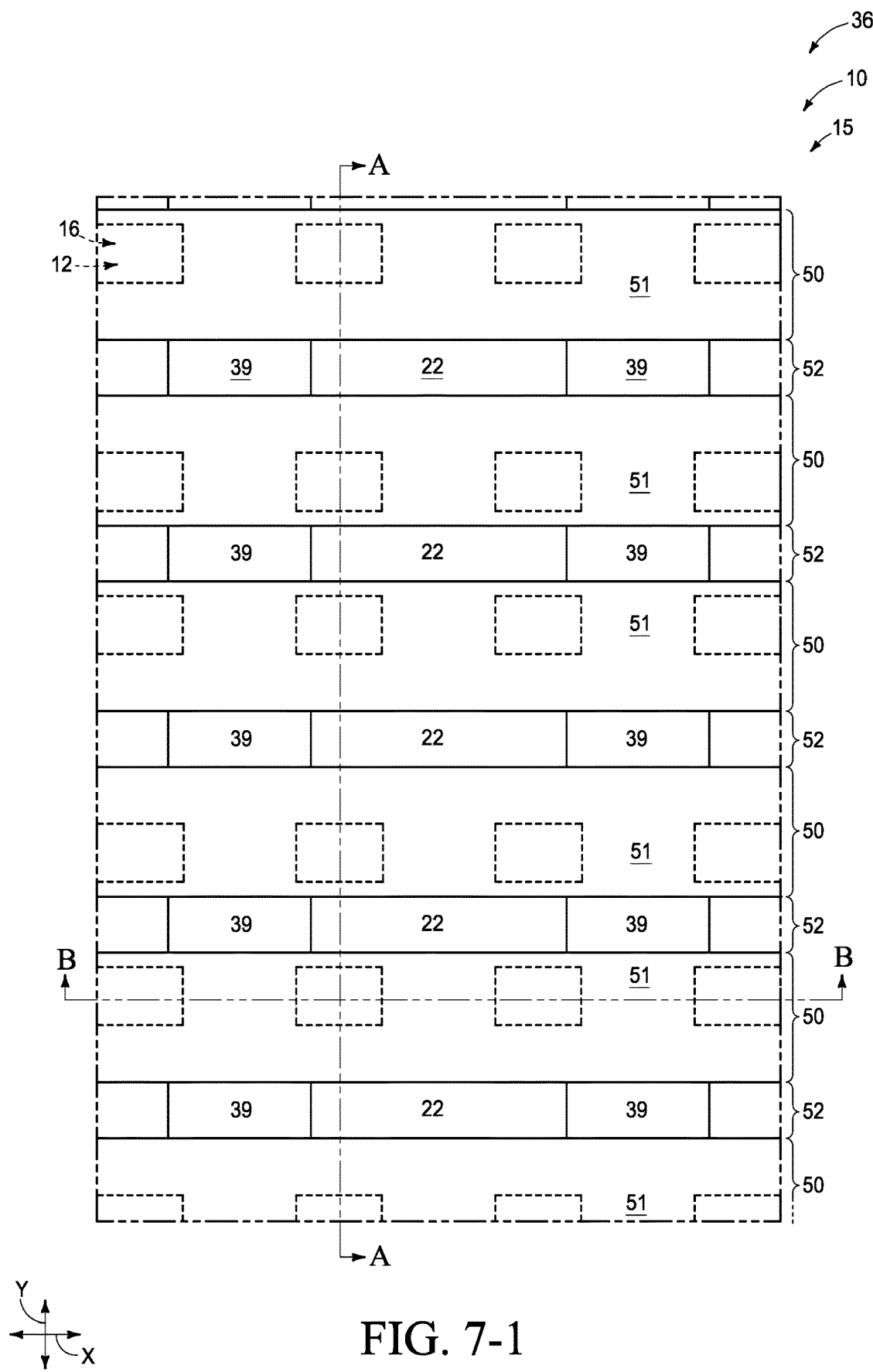
Figure 7A:
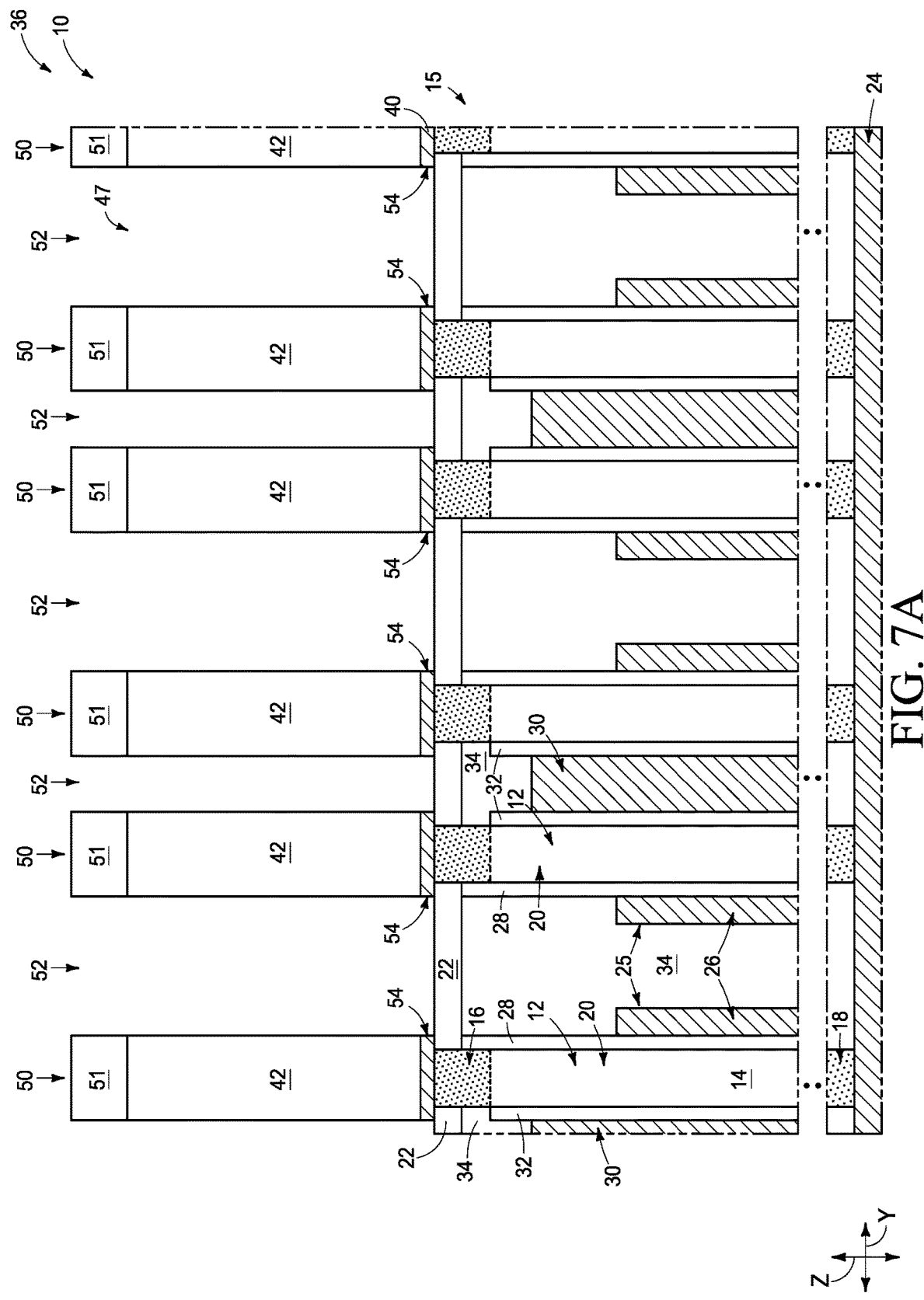
Figures 1, 7A:
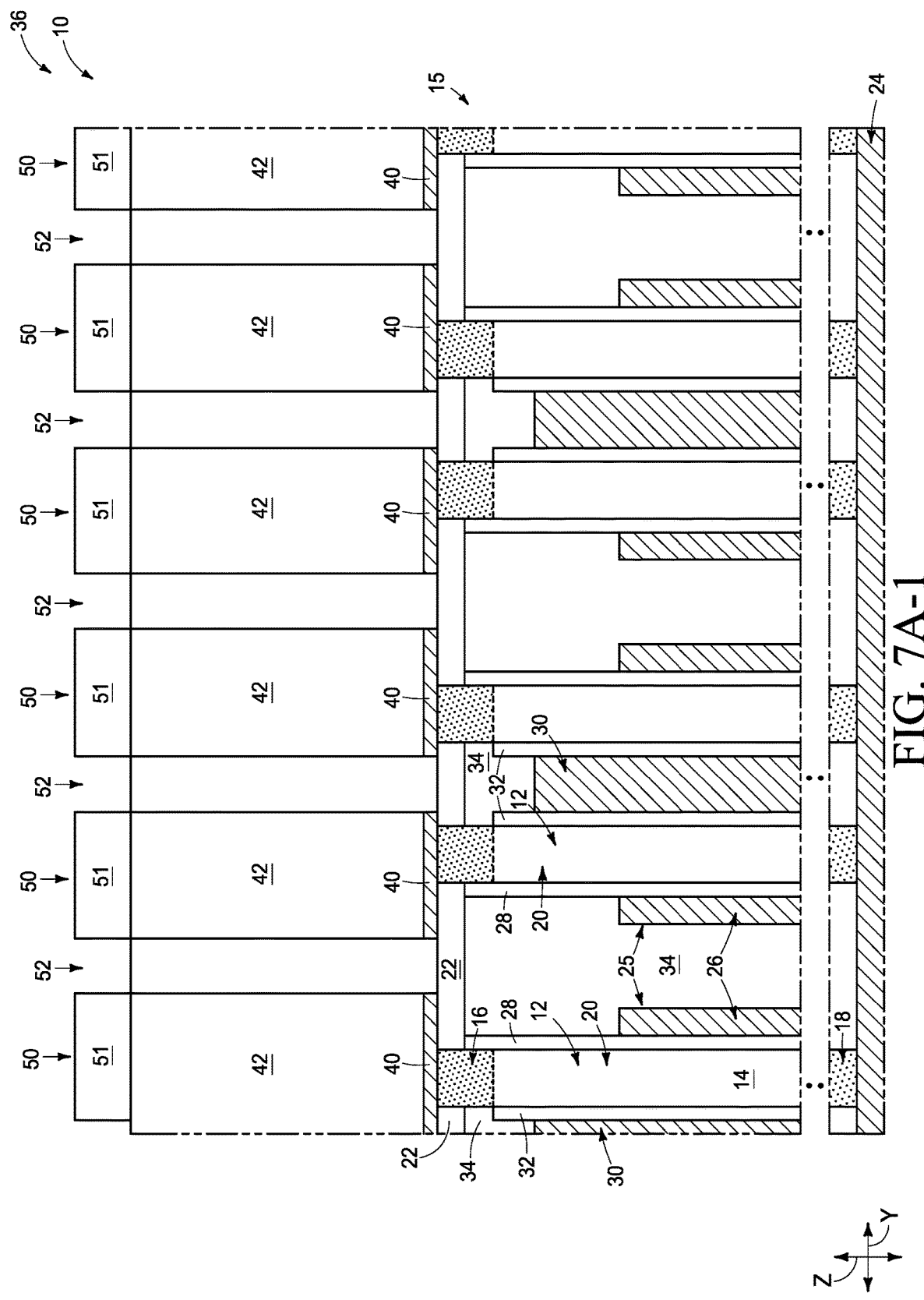
Figure 7B:
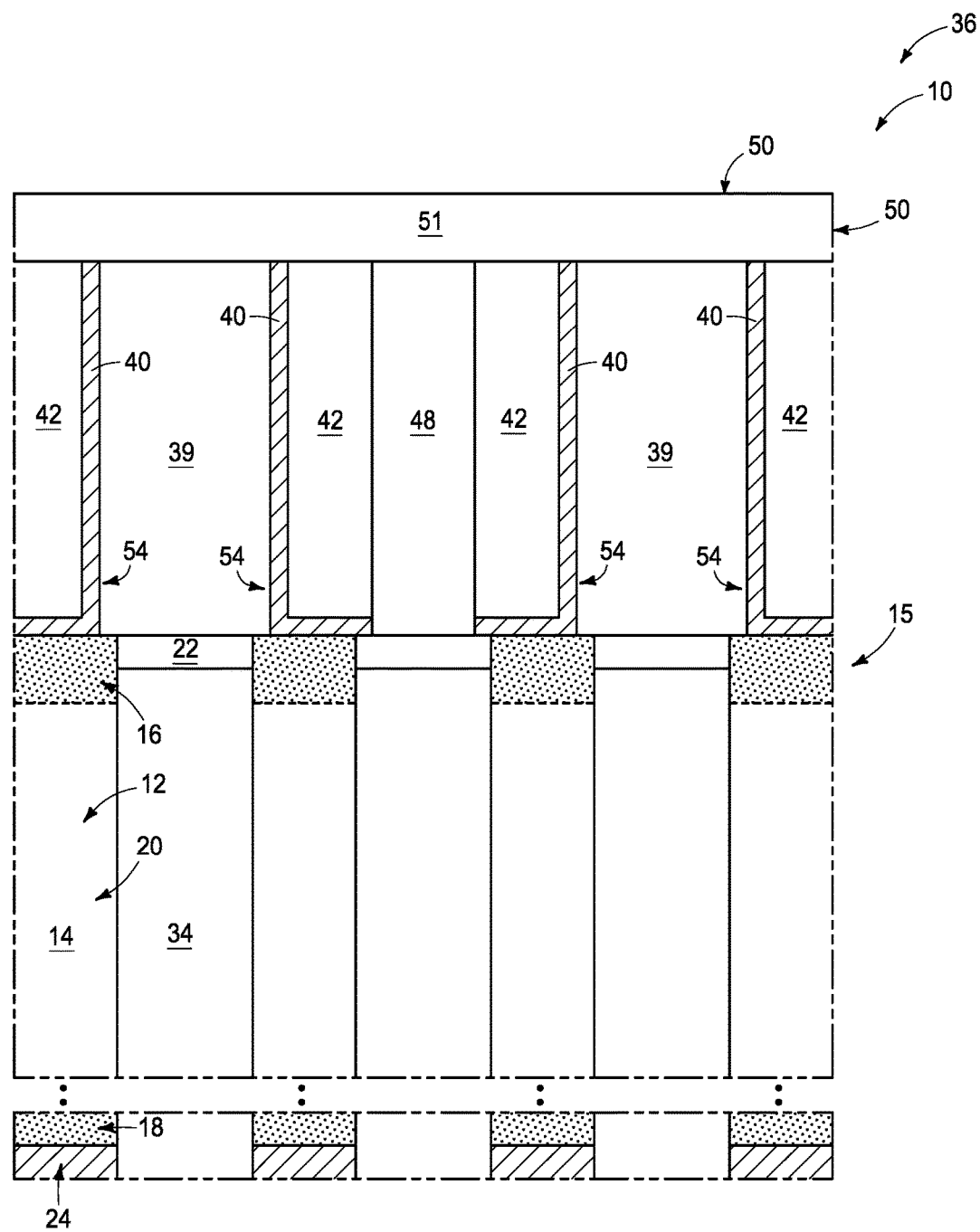

Referring to FIGS. 7-7B, the gaps 52 are extended through the materials 40, 42 and 48, and to an upper surface of the insulative material 22. In other embodiments (not shown), the gaps 52 may punch into the material 22, or even through the material 22 and into the underlying insulative material 34.

The gaps 52 may be extended through the materials 42, 48 and 40 with any suitable processing, including, for example, dry etching to anisotropically etch through the materials 42, 48 and 40. Alternatively, dry etching may be utilized to anisotropically etch through the materials 42 and 48, and then a wet etch may be utilized to extend the openings 52 through the thin layer corresponding to the bottom-electrode-material 40.

The patterning of the bottom-electrode-material 40 at the process stage of FIG. 4 (which forms the bottom-electrode-material 40 into strips extending along the y-axis as shown in the top view of FIG. 4), and the subsequent processing shown in FIG. 7 (which subdivides the strips utilizing the trenches 52 that extend along the x-axis direction) may be considered to pattern the bottom-electrode-material 40 into bottom-electrode-structures (bottom electrodes) 54. Each of the bottom-electrode-structures is over one of the source/drain regions 16, and may be considered to be associated with a corresponding one of the vertically-extending pillars 12.

FIGS. 7-1 and 7A-1 show the embodiment of FIGS. 6-1 and 6A-1 patterned in the manner described above relative to FIGS. 7-7B. An advantage of the embodiment of FIGS. 7-1 and 7A-1 is that such may enable larger capacitors to eventually be formed (and may thereby enable associated higher capacitance per capacitor). Another advantage is that such may enable good contact to be obtained between a lower electrode of a capacitor and an underlying source/drain region, even if there is mask misalignment (i.e., may enable better tolerances for mask misalignment). The remaining figures of this disclosure (except for 11A-1) show embodiments following FIGS. 6, 6A, 7 and 7A (i.e., show embodiments in which the spacings 52 vary along the y-axis direction), but it is to be understood that analogous embodiments could follow the illustrated processing stages of FIGS. 6-1, 6A-1, 7-1 and 7A-1. An example of such analogous embodiments is shown in FIG. 11A-1 and described below.

Figure 8:
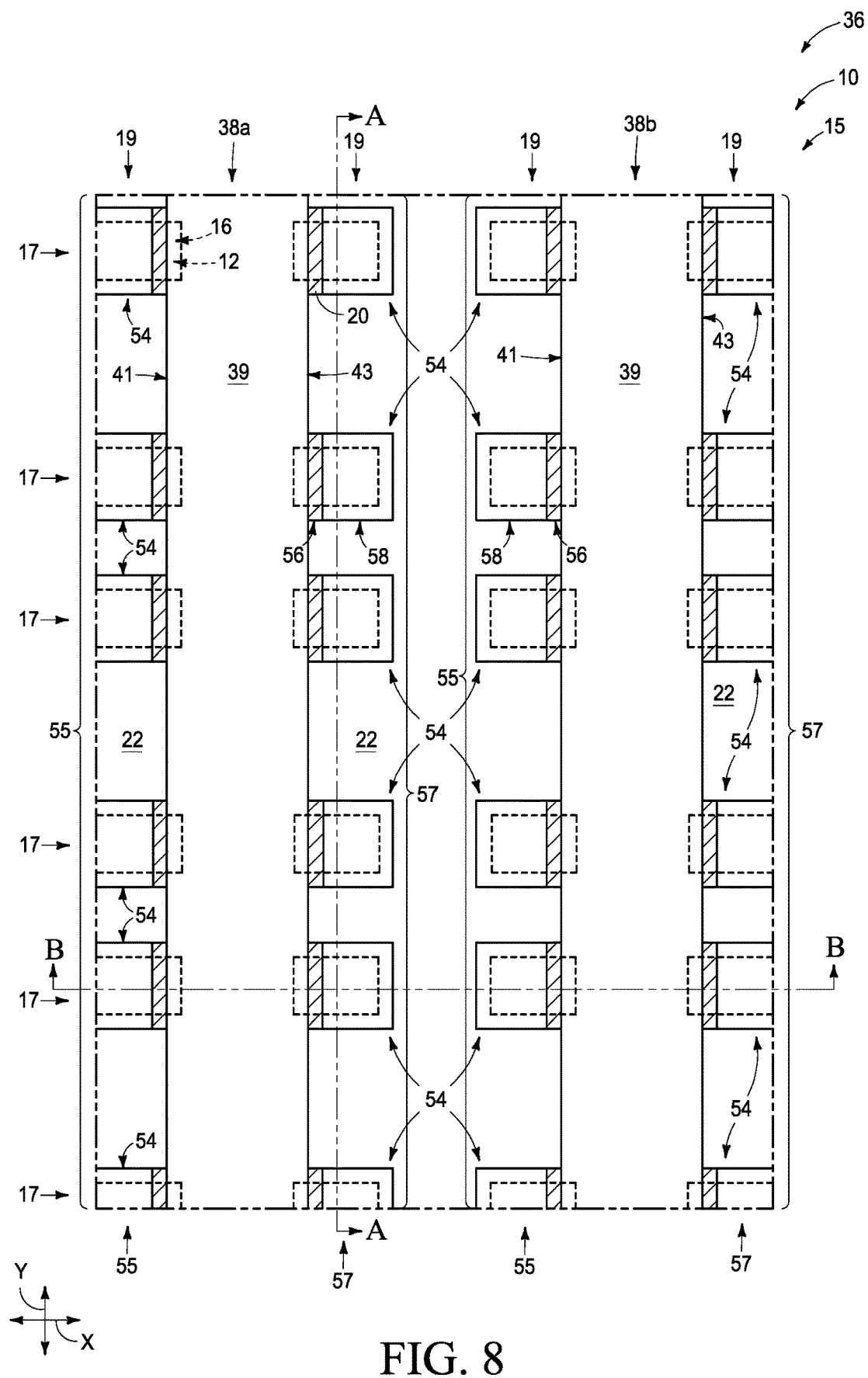
FIGS. 8-8C are diagrammatic views of the region of FIGS. 1-1B at an example process stage following that of FIGS. 7-7B.
Figure 8A:
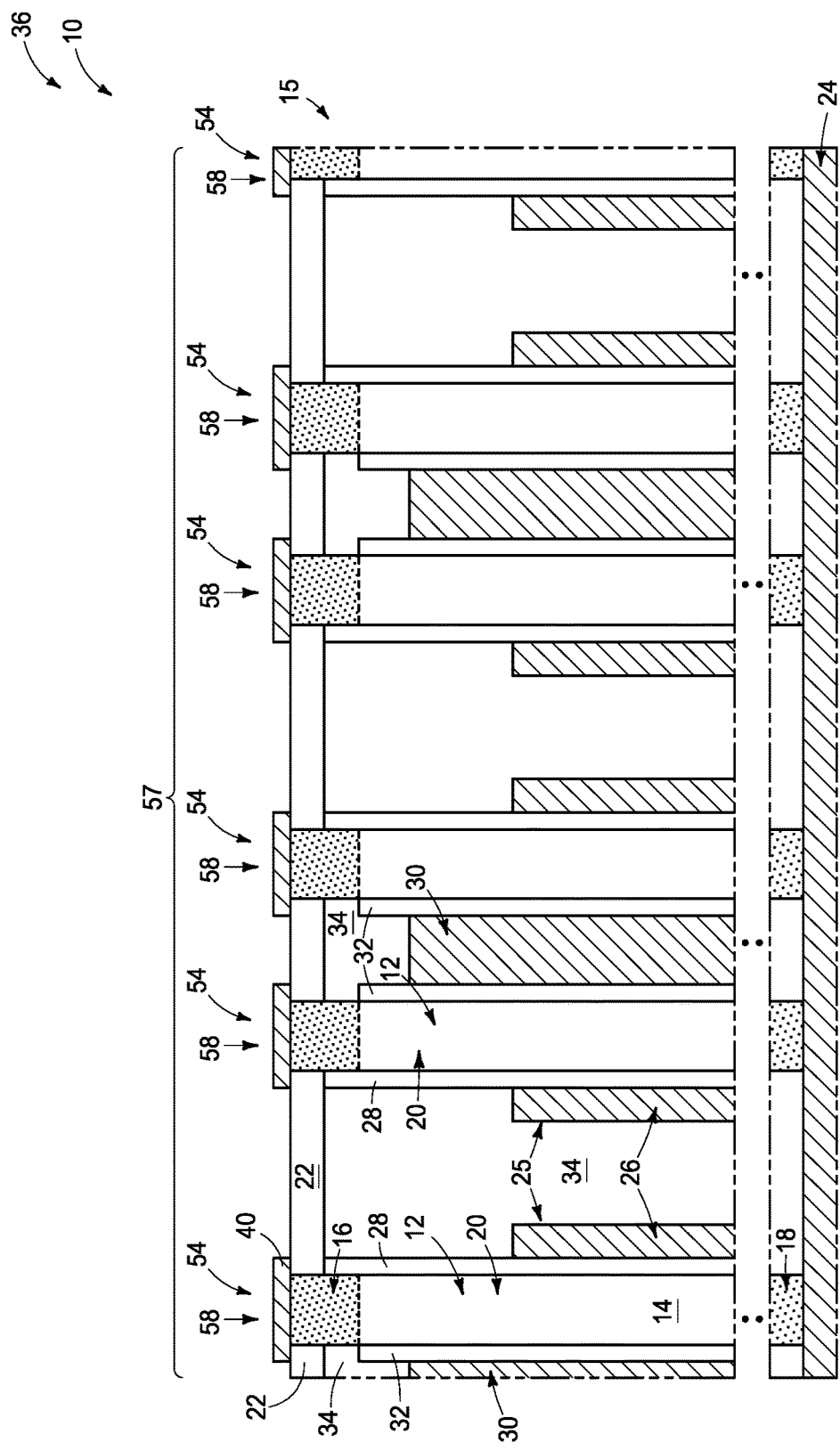
FIGS. 8A and 8B are cross-sectional side views along the lines A-A and B-B, respectively, of FIG. 8.
Figure 8B:
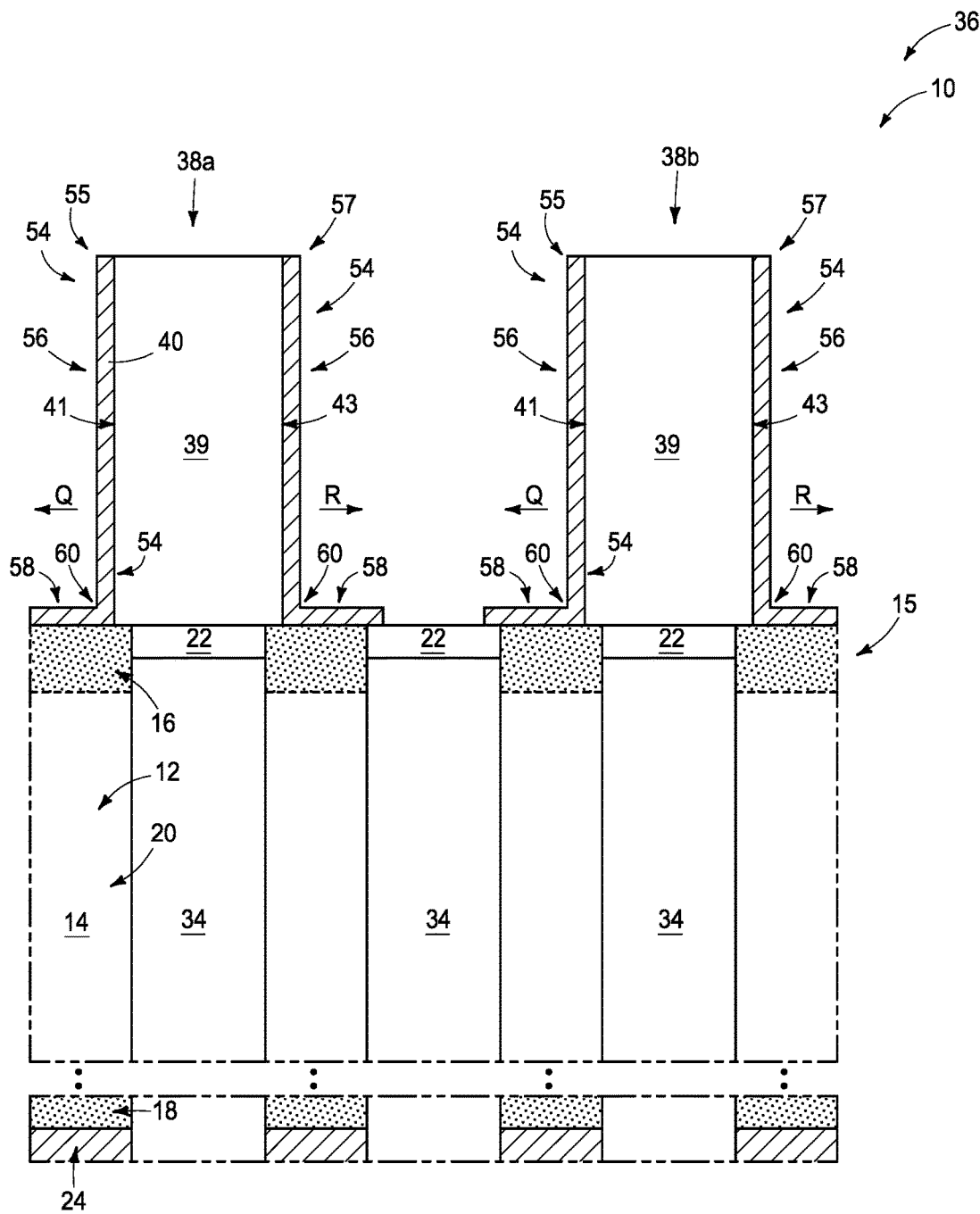
Figure 8C:
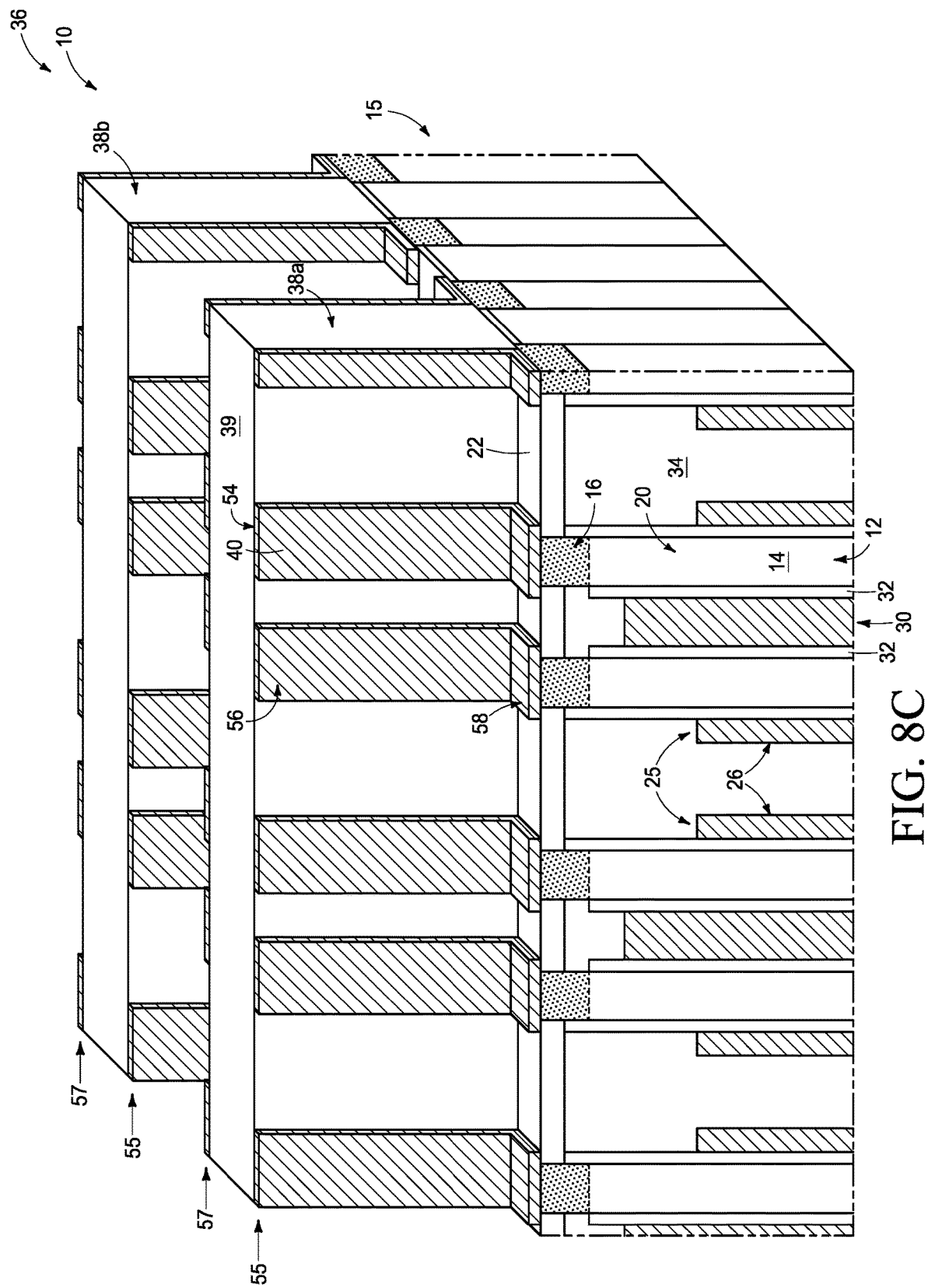

Referring to FIGS. 8-8C, the materials 51, 42 and 48 are removed with one or more suitable etches. The bottom electrodes 54 remain along the linear structures 38.

Each of the bottom-electrode-structures 54 has a vertical segment 56 along one of sidewalls (41, 43) of a linear structure 38, and has a horizontal segment 58 along a source/drain region 16. The horizontal segments 58 join to the vertical segments 56 at corners 60. The corners 60 may be about 90° (i.e., may be approximately right angles), with the term "about 90°" meaning 90° to within reasonable tolerances of fabrication and measurement. In some embodiments, the term about 90° may mean 90°+10°.

In some embodiments, the horizontal segments 58 may be referred to as first segments and the vertical segments 56 may be referred to as second segments. The first and second segments 58 and 56 may or may not be substantially orthogonal to one another, depending on whether the sidewalls (41, 43) are vertical (as shown) or tapered.

In the illustrated embodiment, the vertical segments 56 are longer than the horizontal segments 58. In other embodiments, the segments 56 and 58 may be about the same length as one another, or the horizontal segments 58 may be longer than the vertical segments 56.

The bottom-electrode-structures 54 may be considered to be configured as angle plates, and in the shown embodiment are in one-to-one correspondence with the upper source/drain regions 16. Each of the bottom electrodes 54 may be considered to be electrically coupled with an associated source/drain region 16 of an associated pillar 12.

The bottom-electrode-structures 54 adjacent the first lateral sides 41 of the linear structures 38 may be considered to correspond to a first set 55 of the bottom-electrode-structures 54, and the bottom-electrode-structures 54 adjacent the second lateral sides 43 of the linear structures 38 may be considered to correspond to a second set 57 of the bottom-electrode-structures 54. The horizontal segments 58 of the bottom electrodes 54 within the first set 55 project in a first direction Q (with direction Q being shown in FIG. 8B), and the horizontal segments 58 of the bottom electrodes 54 within the second set 57 project in a second direction R (with direction R being shown in FIG. 8B). The direction R is opposite to the direction Q. In some embodiments, the bottom electrodes of the first set 55 may be considered to be substantially mirror images of the bottom electrodes of the second set 57, where the term "substantial mirror image" means a mirror image to within reasonable tolerances of fabrication and measurement.

Figure 9:
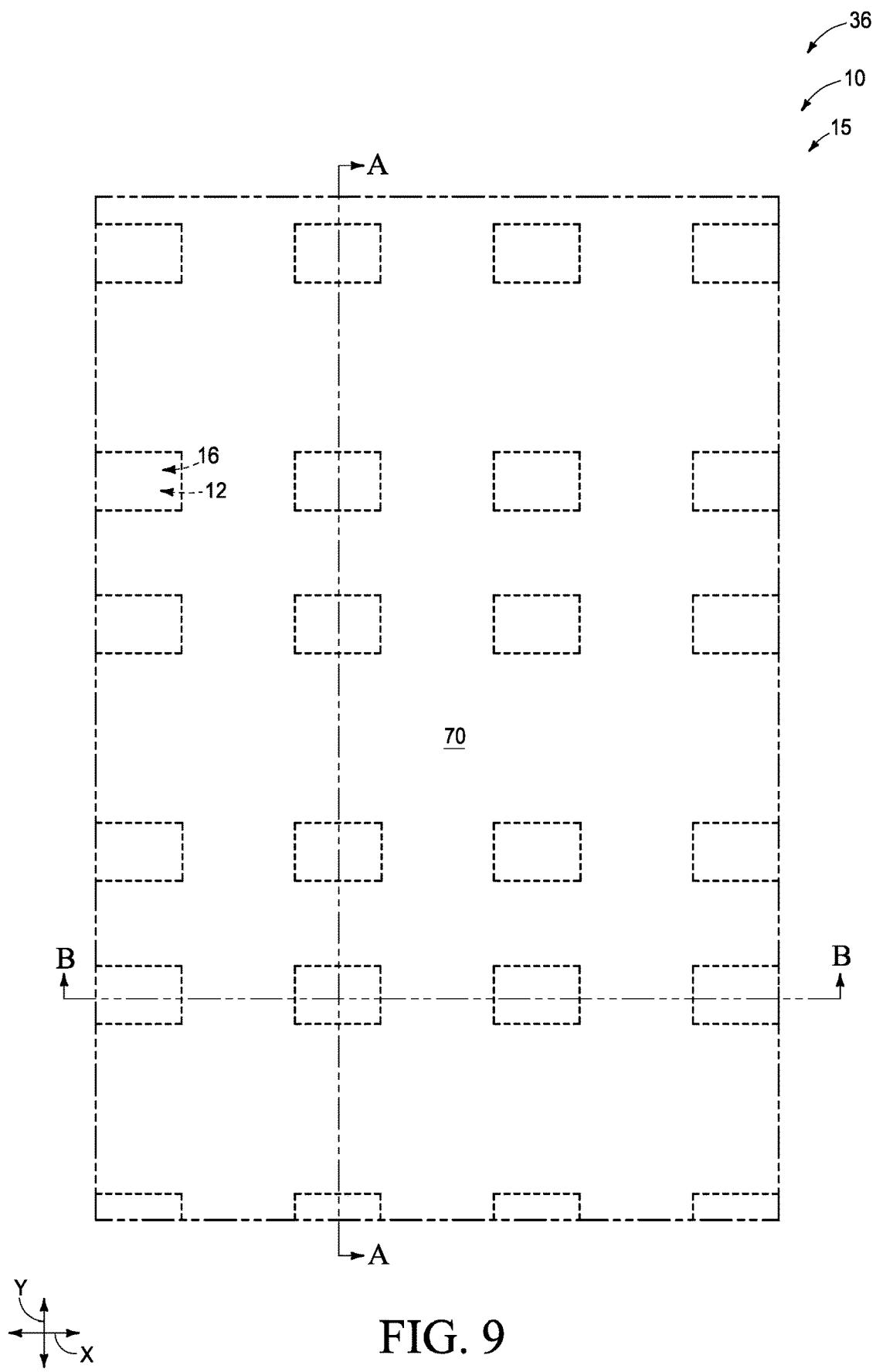
FIGS. 9-9B are diagrammatic views of the region of FIGS. 1-1B at an example process stage following that of FIGS. 8-8C.
Figure 9A:
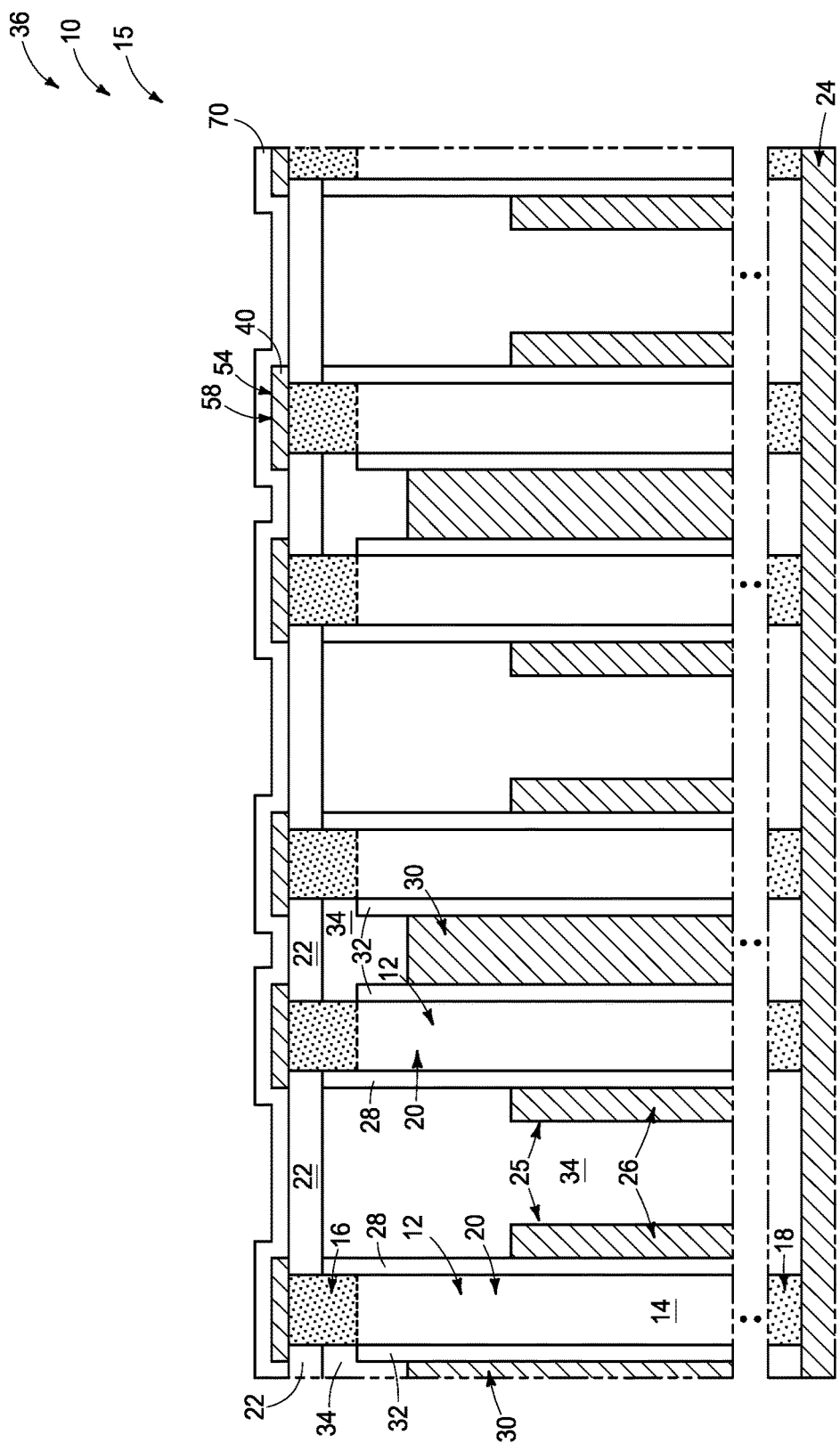
Figure 9B:
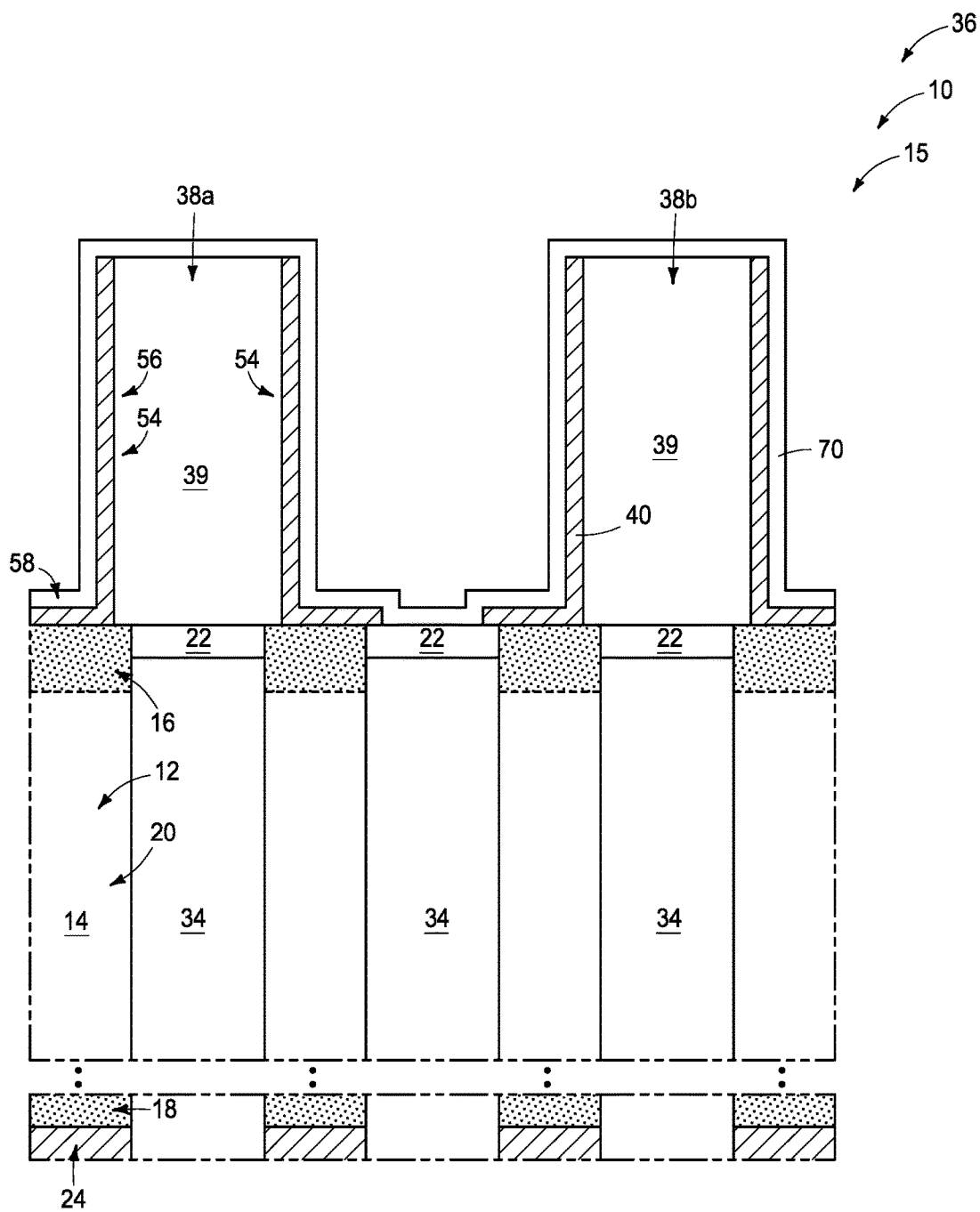

Referring to FIGS. 9-9B, ferroelectric-insulative-material 70 is formed over the bottom-electrode-structures 54, and is directly against the bottom-electrode-structures 54. In the shown embodiment the ferroelectric-insulative-material 70 extends across the material 22 between the bottom electrodes 54, as well as extending over the bottom electrodes, and over the linear features 38.

The ferroelectric-insulative-material 70 may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric-insulative-material may have dopant therein which comprises one or more of silicon, aluminum, lanthanum, yttrium, erbium, calcium, magnesium, strontium, and a rare-earth element.

The ferroelectric-insulative-material 70 may be formed to any suitable thickness; and in some embodiments may be formed to a thickness within a range of from about 30 Å to about 250 Å.

Figure 10:
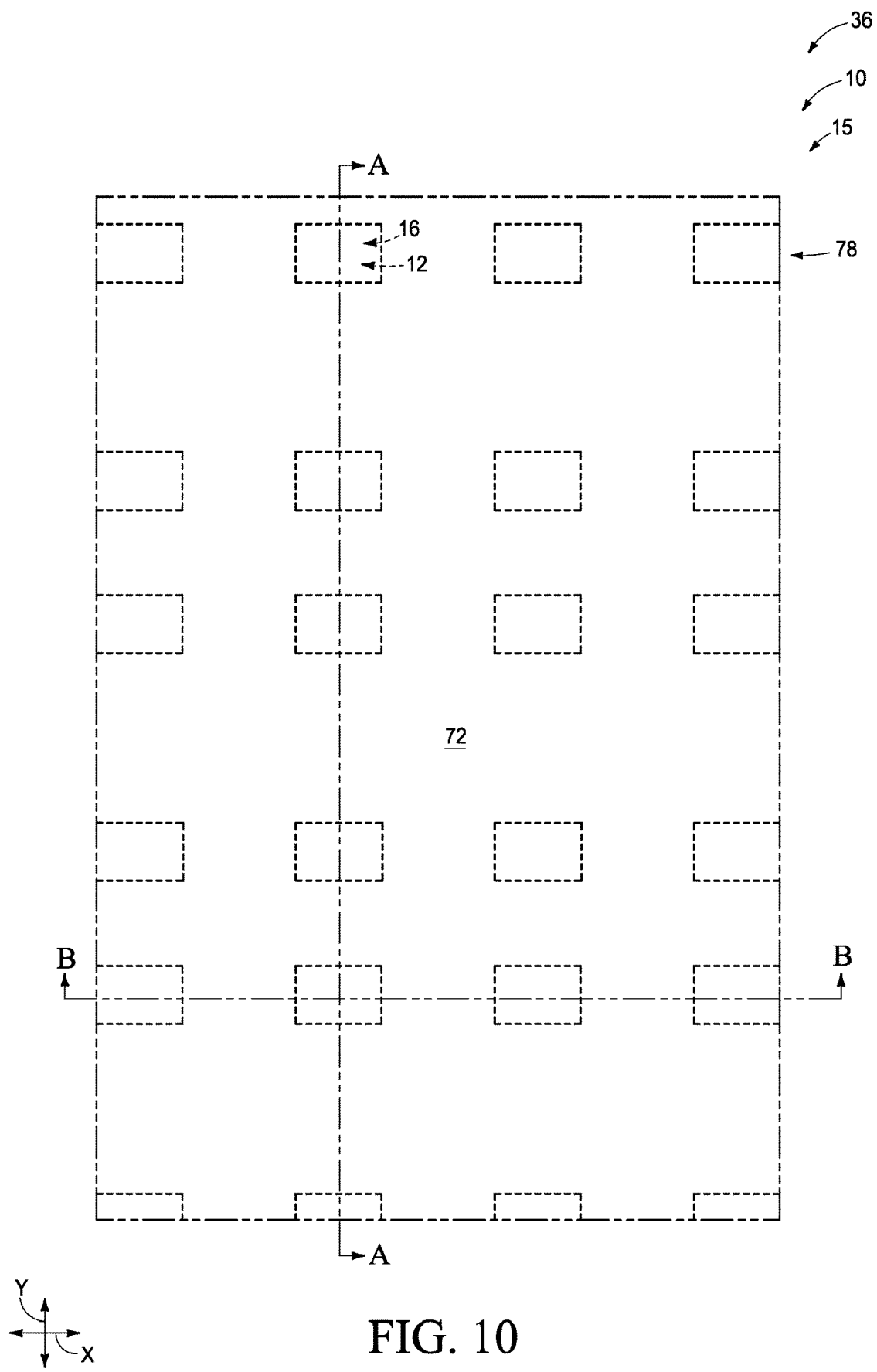
FIGS. 10-10B are diagrammatic views of the region of FIGS. 1-1B at an example process stage following that of FIGS. 9-9B.
Figure 10A:
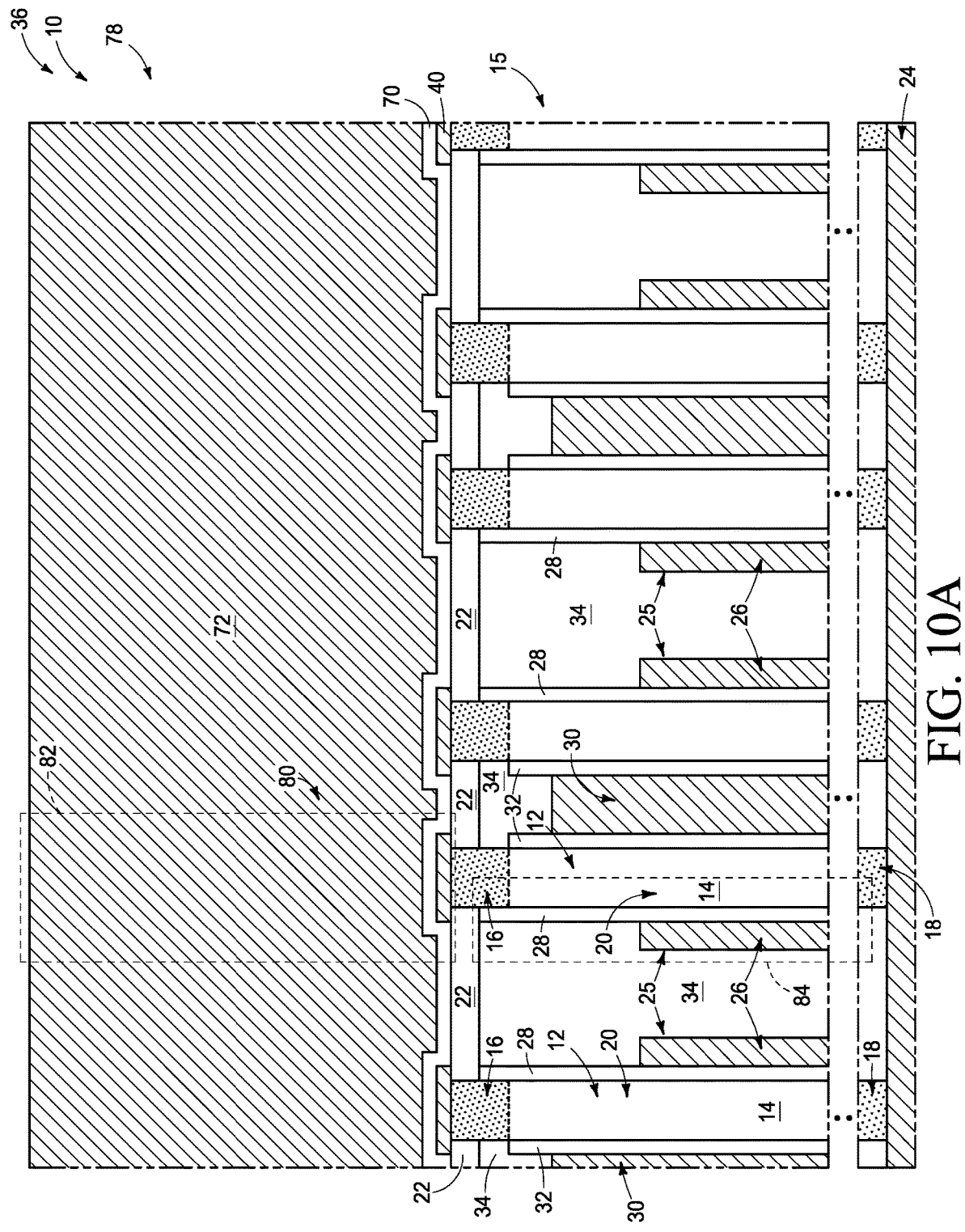
Figure 10B:
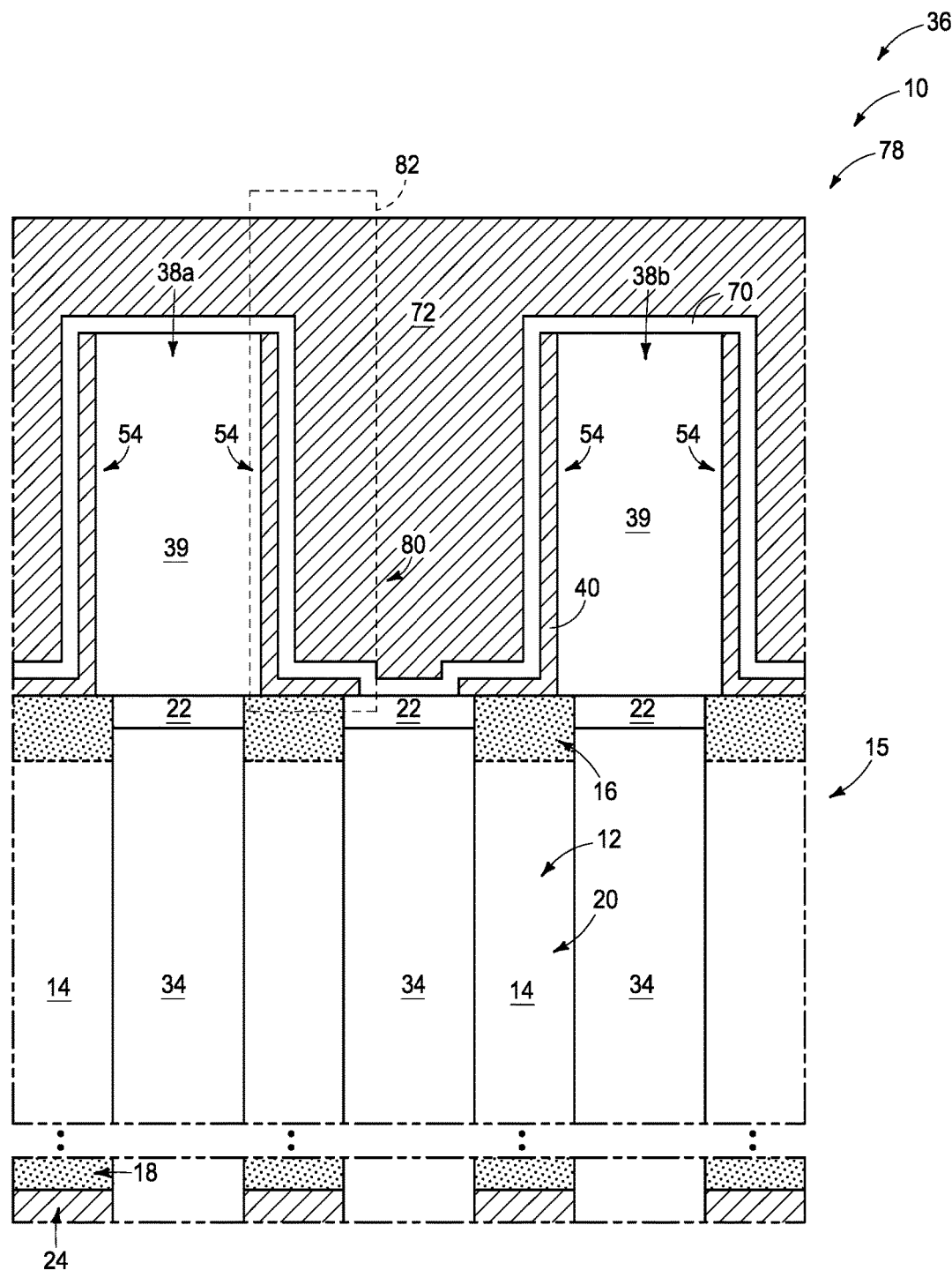

Referring to FIGS. 10-10B, top-electrode-material 72 is formed over the ferroelectric-insulative-material 70. The top-electrode-material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the top-electrode-material 72 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten.

The top-electrode-material 72 may have any suitable thickness, and in some embodiments may have a thickness of at least about 10 Å, at least about 100 Å, at least about 500 Å, etc.

The electrode materials 40 and 72 may comprise a same composition as one another in some embodiments, or may comprise different compositions relative to one another. In some embodiments, the electrode materials 40 and 72 may both comprise, consist essentially of, or consist of titanium nitride.

The integrated assembly 36 of FIGS. 10-10B may be considered to correspond to a portion of a memory array (memory device) 78. Such memory array includes memory cells 80 which each include a capacitor 82 (with one of the memory cells 80 and its associated capacitor being diagrammatically indicated in FIG. 10B, and with another of the memory cells 80 and its associated capacitor being diagrammatically indicated in FIG. 10A). The capacitors each include one of the bottom electrodes 54; and includes regions of the ferroelectric-insulative-material 70 and the top-electrode-material 72.

The individual memory cells 80 each include an access transistor 84 coupled with the capacitor 82 (one of the access transistors 84 is diagrammatically indicated in FIG. 10A). Each of the access transistors 84 includes a pillar 12 and a region of a transistor gate 26 adjacent such pillar.

Each of the memory cells 80 is uniquely addressed by one of the wordlines 25 in combination with one of the digit lines 24. In some embodiments, the memory cells 80 may be considered to be substantially identical to one another, and to be representative of a large number of substantially identical memory cells which may be formed across the memory array 78. For instance, the memory array may comprise hundreds, thousands, hundreds of thousands, millions, hundreds of millions, etc., of the memory cells. The wordlines 25 may be representative of a large number of substantially identical wordlines that may extend along rows of the memory array, and the digit lines 24 may be representative of a large number of substantially identical digit lines that may extend along columns of the memory array. The term "substantially identical" means identical to within reasonable tolerances of fabrication and measurement.

The capacitors 82 are ferroelectric capacitors comprising the ferroelectric-insulative-material. Accordingly, the memory array 78 may comprise FeRAM.

Some embodiments include recognition that it may be advantageous to sub-divide the top-electrode-material 72 into multiple plates. Voltage to the individual plates may be independently controlled, which may enable the electric field across the ferroelectric-insulative-material 70 to be tailored within specific regions of the memory array 78 during memory operations (e.g., READ/WRITE operations). Such may enable charge/discharge rates of the capacitors 82 to be increased, which may improve operational speeds associated with memory cells 80 of the memory array 78. It may be particularly advantageous for the top electrode material to be subdivided with slits extending along the column direction (i.e., the y-axis direction of the figures).

Figure 11:
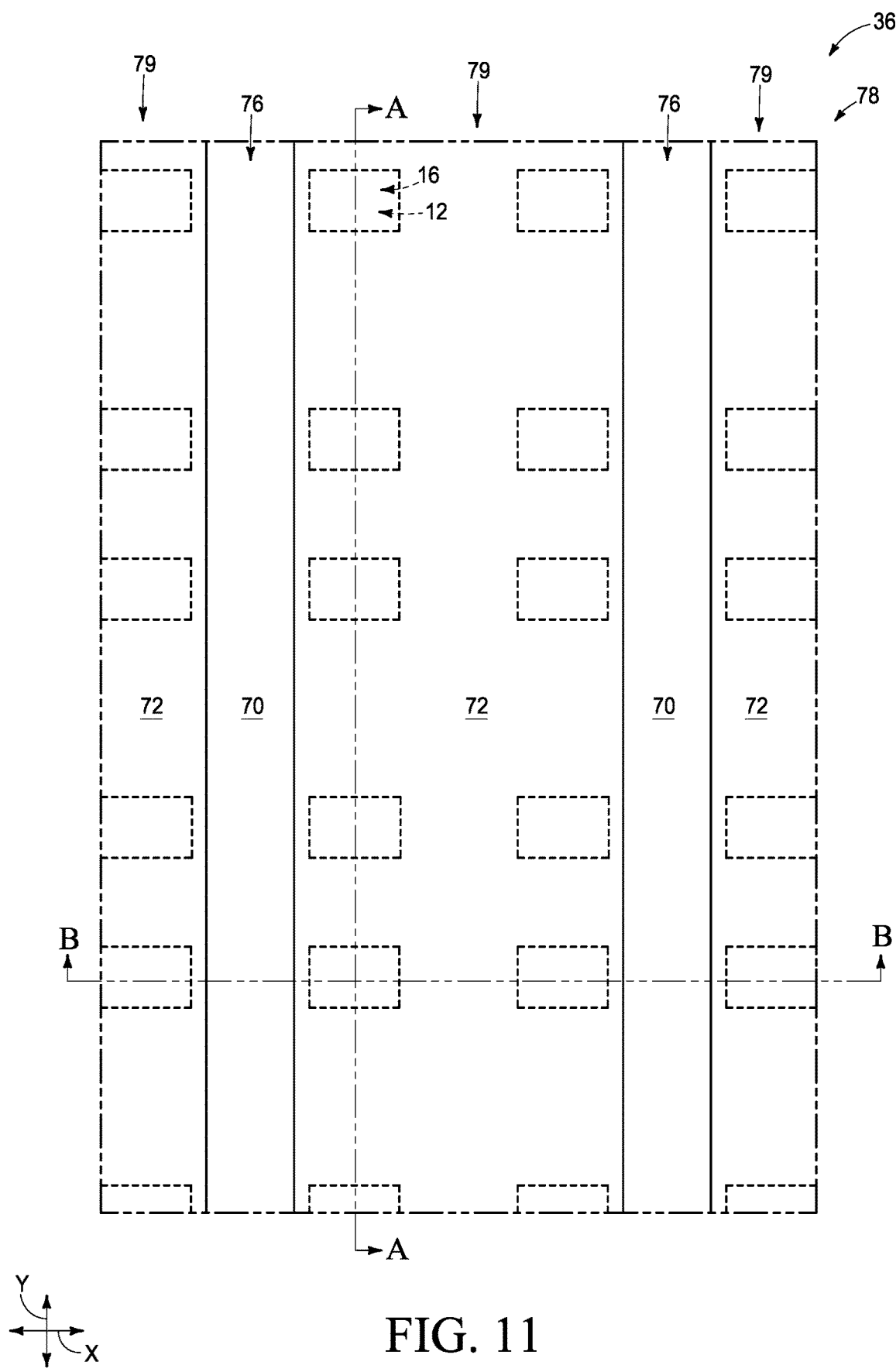
FIGS. 11-11B are diagrammatic views of the region of FIGS. 1-1B at an example process stage following that of FIGS. 10-10B.
Figure 11A:
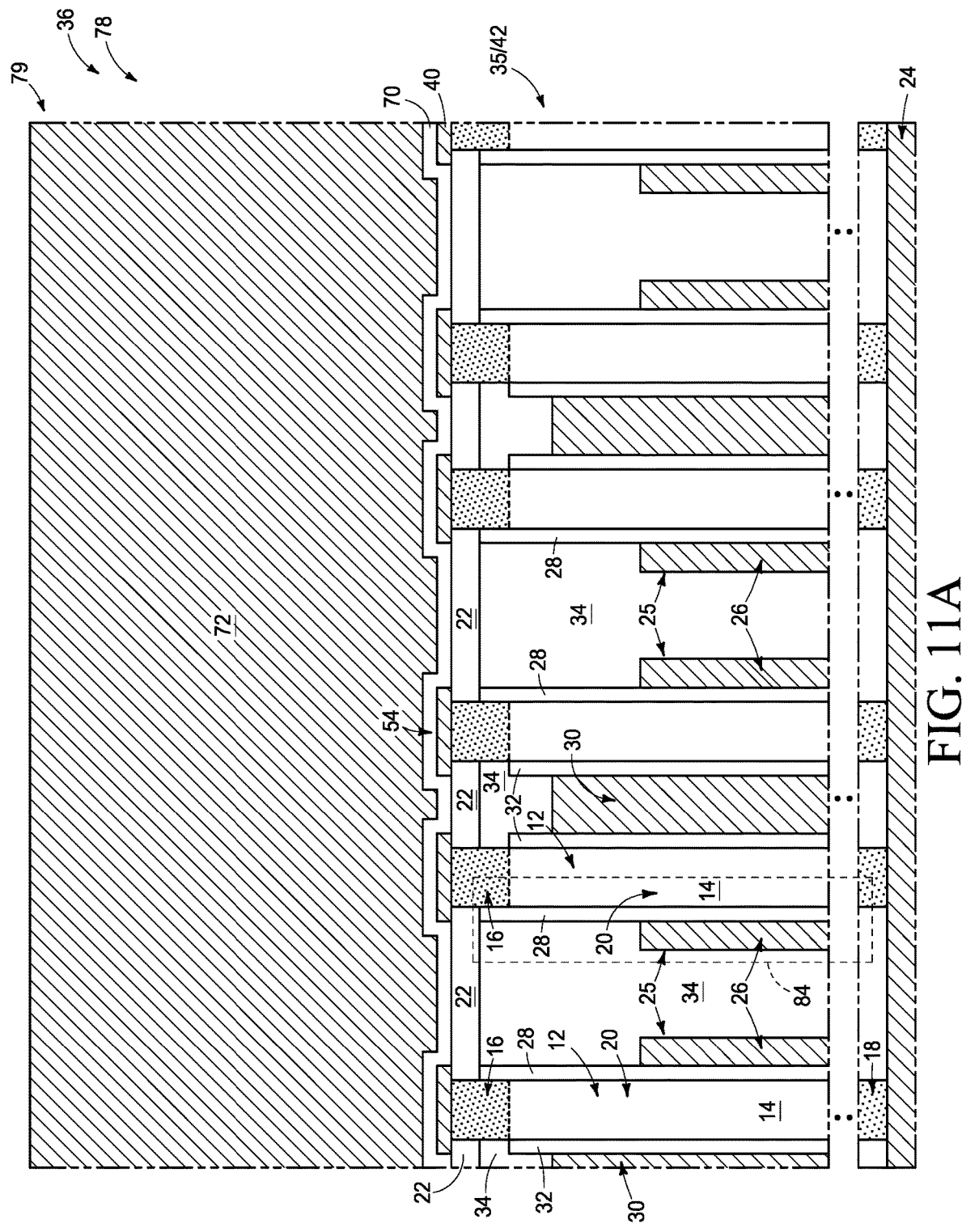
Figures 1, 11A:
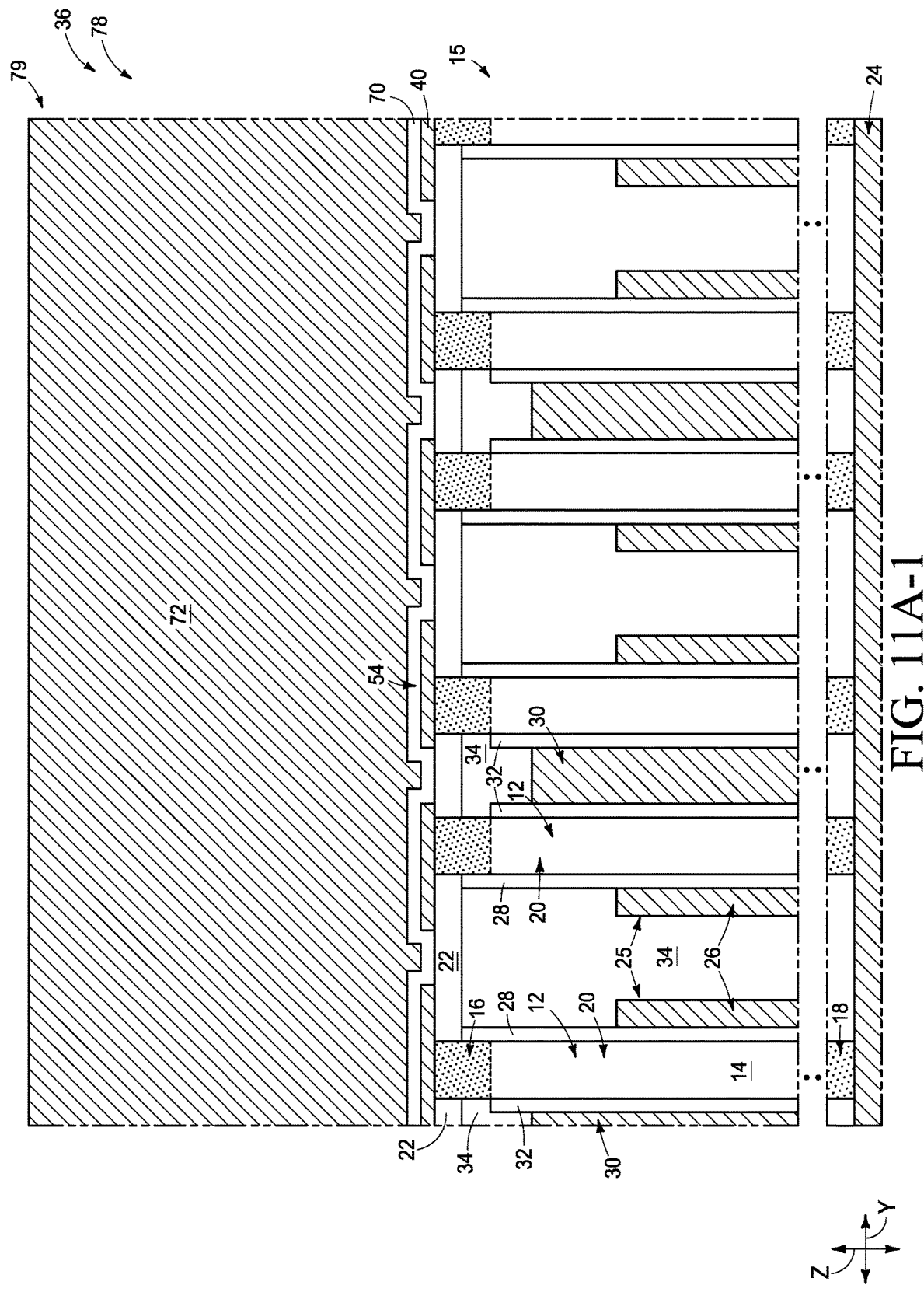
Figure 11B:
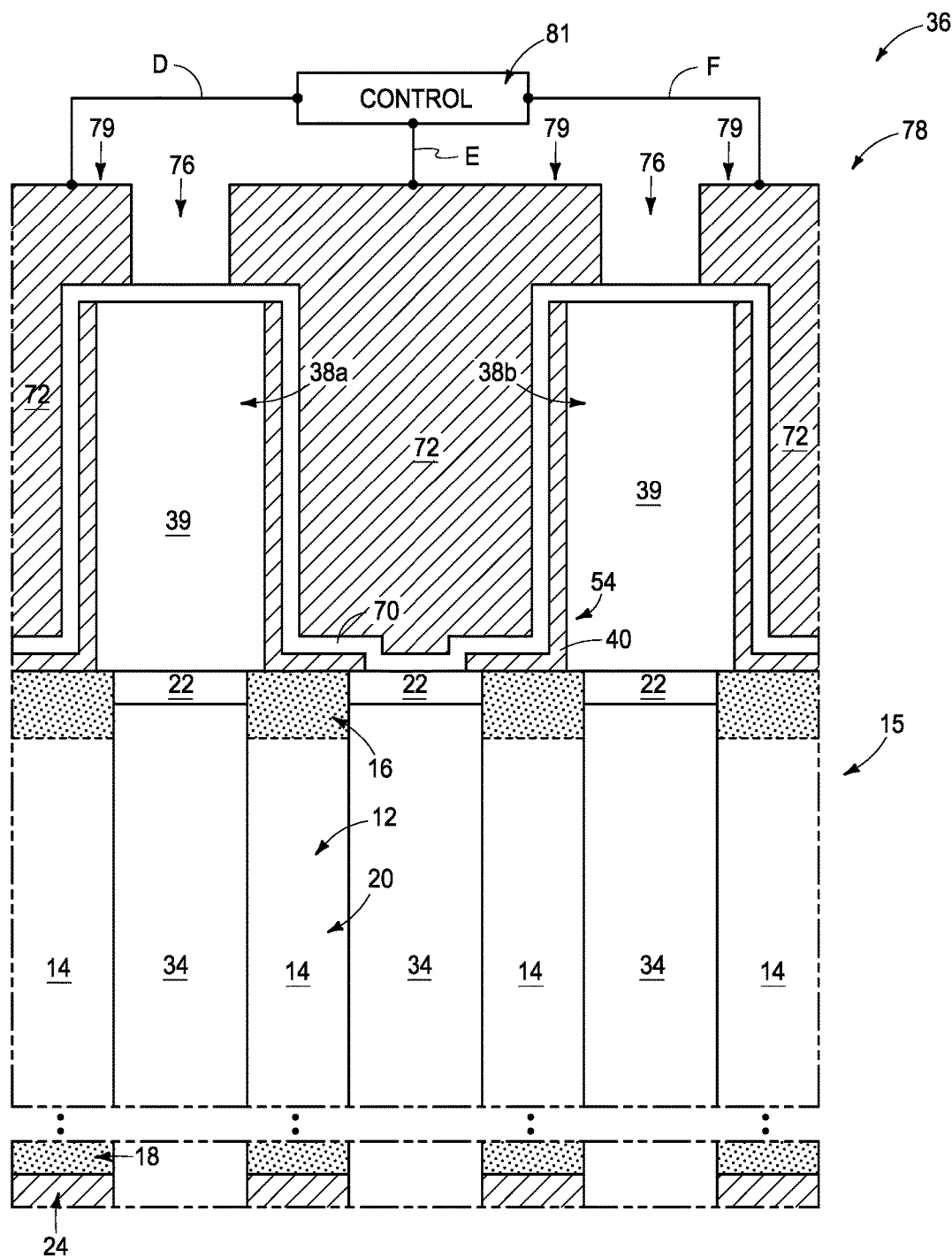

FIGS. 11-11B show the assembly 10 after slits 76 are formed to extend through the top-electrode-material 72. In the shown embodiment, the slits 76 stop at the ferroelectric-insulative-material 70. In other embodiments (described below with reference to FIGS. 15 and 16) the slits may penetrate through the ferroelectric-insulative-material.

The slits 76 may be patterned with any suitable processing. For instance, a photoresist mask (not shown) may be used to define locations of the slits, one or more etches may be used to etch through the material 72 and form the slits in such locations, and then the mask may be removed to leave the configuration of FIGS. 11-11B.

The illustrated slits 76 extend along the column direction (i.e., the illustrated y-axis direction) and are directly over the linear structures 38. Although two slits 76 are shown, there may or may not be a slit aligned with every one of the linear structures 38. Generally, there will be at least one of the slits 76.

The slits 76 subdivide the top-electrode-material 72 into plate structures (plates) 79. Although three of the plates 79 are formed in the shown embodiment, in other embodiments there may be a different number of plates formed depending on the number of the slits 76 formed. Generally, there will be at least two of the plates 79 formed utilizing the slits 76.

Control circuitry 81 (which may also be referred to as a control circuit) may be utilized to provide desired voltages to the plates 79 (i.e., to independently control voltages to the different plates 79). The control circuitry is only shown in FIG. 11B to simplify the drawings.

At least two of the plates may be at a different voltage relative to one another. Specifically, one of the plates may be at a first voltage, and another of the plates may be at a second voltage which is different than the first voltage. In the shown embodiment, the control circuitry 81 provides voltages D, E and F to the three separate plates 79 of FIG. 11B. At least one of such voltages may be different than the others. In some embodiments, only one of such voltages is different while the other two are the same as one another.

FIG. 11A-1 shows an embodiment similar to that of FIG. 11A, but at a process stage following the embodiment described above relative to FIG. 7A-1.

The memory array 78 of FIG. 11 may have any suitable configuration. An example FeRAM array 78 is described schematically with reference to FIG. 12. The memory array includes a plurality of substantially identical memory cells 80, which each include a ferroelectric capacitor 82 and an access transistor 84. Wordlines 25 extend along rows of the memory array, and digit lines 24 extend along columns of the memory array. Each of the memory cells is uniquely addressed utilizing a combination of a wordline and a digit line. The wordlines extend to driver circuitry (Wordline Driver Circuitry) 110, and the digit lines 24 extend to detecting (sensing) circuitry (Sense Amplifier Circuitry) 112. The top electrodes of the capacitors 82 are shown coupled with plate structures 79, and the plate structures are shown to be coupled with the control circuitry 81.

At least some of the circuitry 110, 112 and 81 may be directly under the memory array 78. One or more of the circuitries 110, 112 and 81 may include CMOS (complementary metal-oxide-semiconductor), and accordingly some embodiments may include CMOS-under-array architecture.

Figure 12:
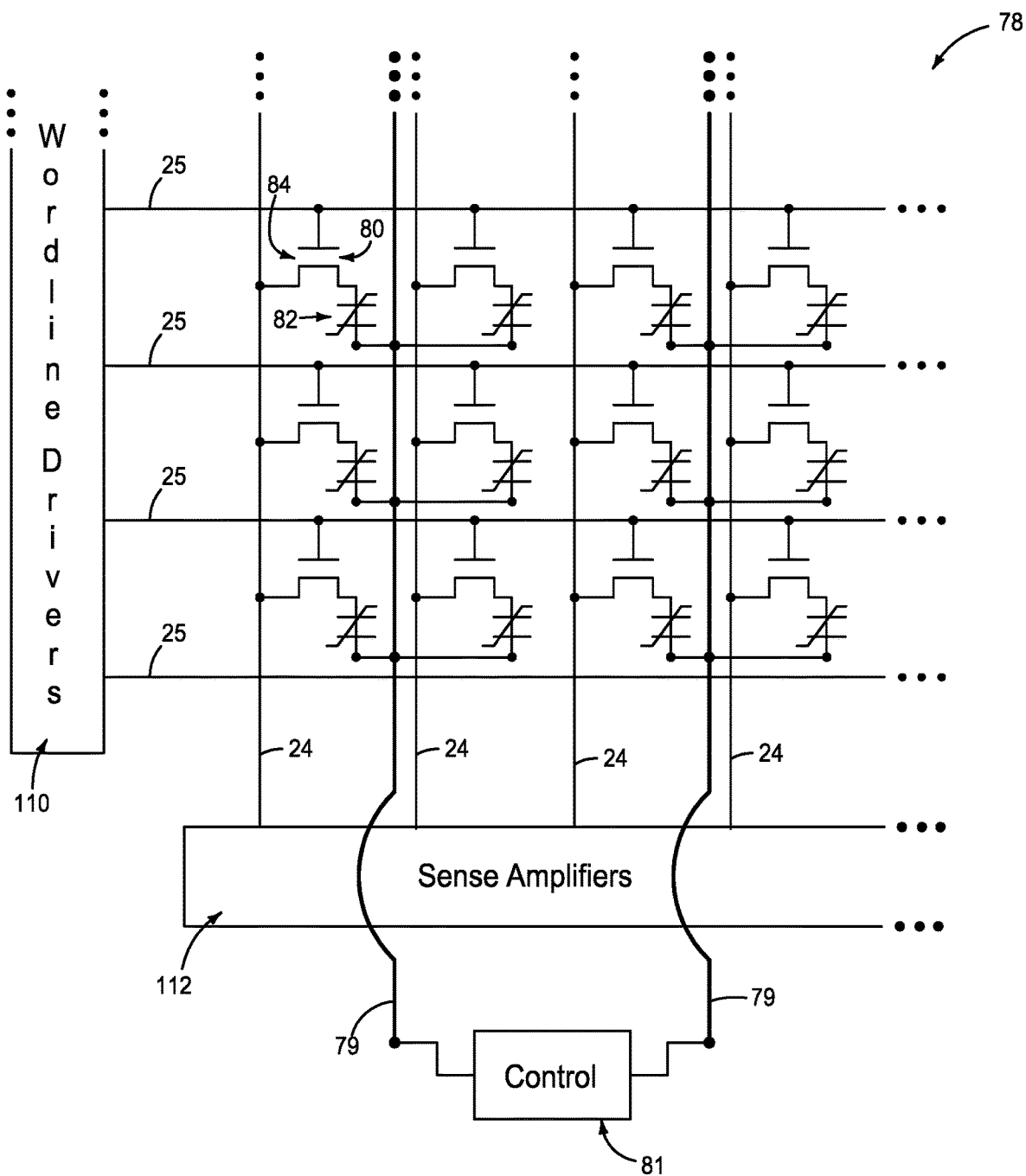
FIG. 12 is a schematic diagram of an example memory array comprising ferroelectric capacitors.
Figure 13:
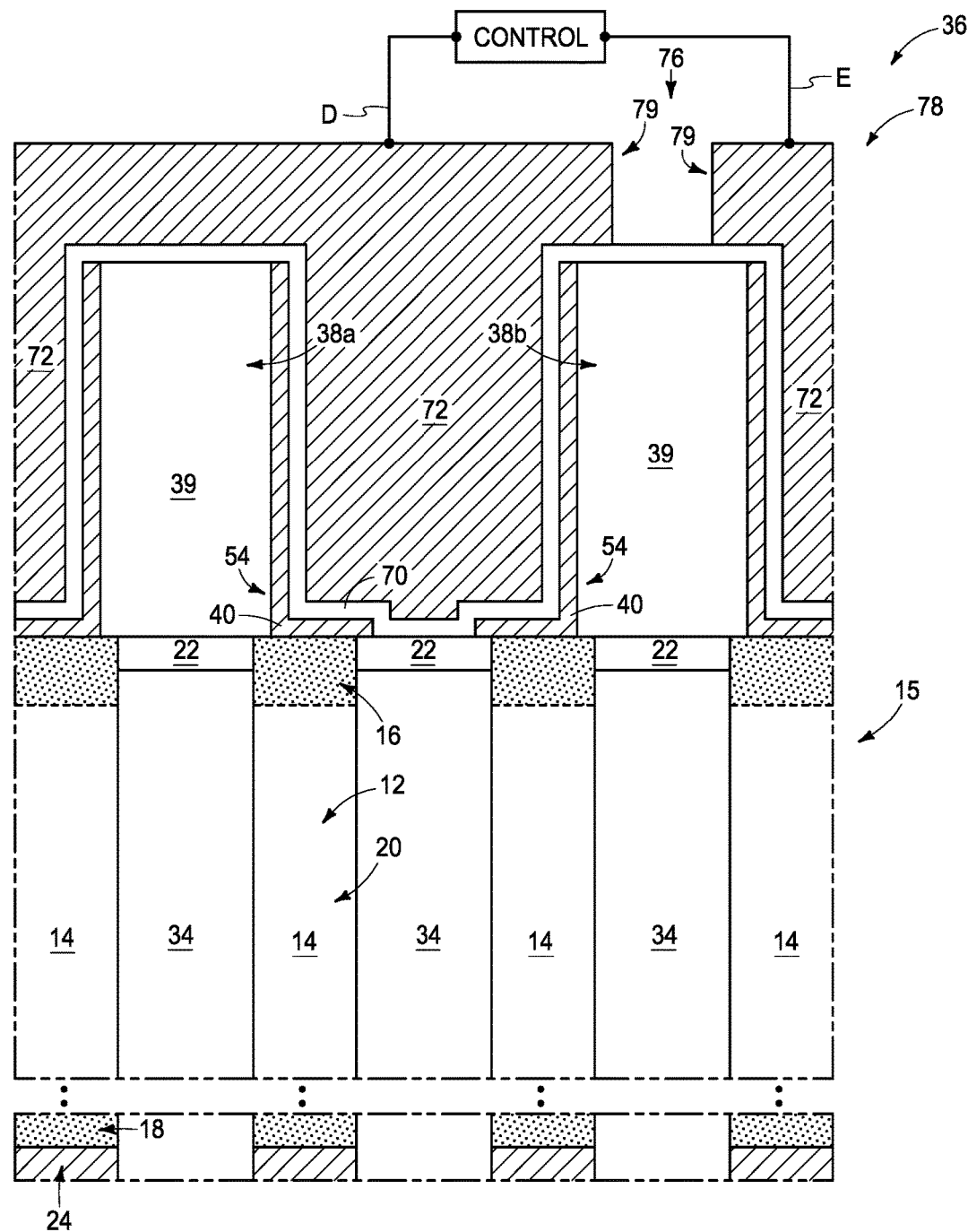
FIG. 13 is diagrammatic view of a region analogous to that of FIG. 11B showing another example embodiment.

FIGS. 11 and 12 show an embodiment in which each plate structure is shared by two columns of memory cells. In other embodiments, a different number of memory cells may share a plate structure, depending on the number of slits 76 that are formed. For instance, FIG. 13 shows an embodiment similar to that of FIG. 11B, but in which a slit 76 is formed over one of the shown linear structures 38 and not the other. Thus, only two of the plates 79 are formed in the shown region of the assembly 36.

Figure 14:
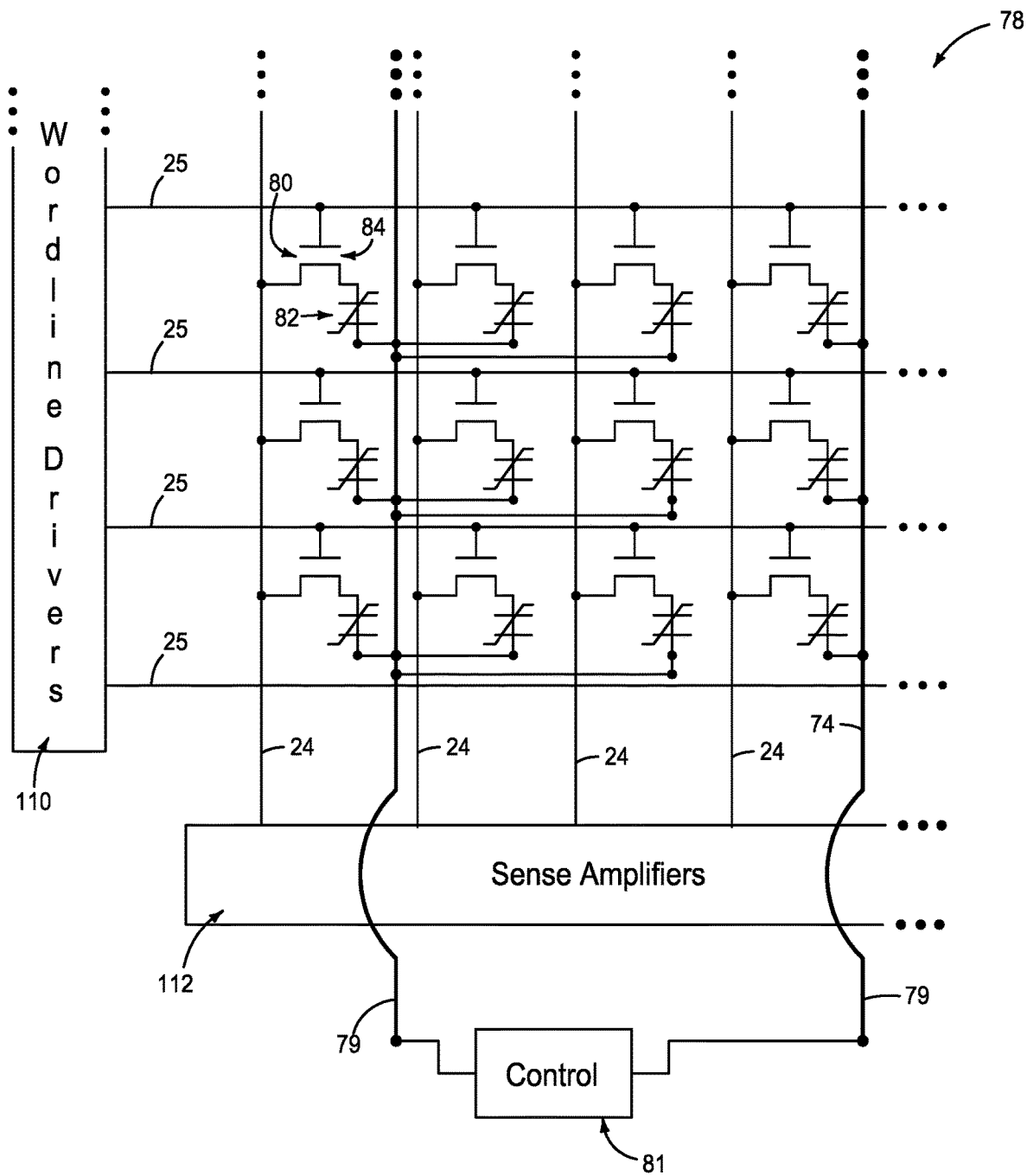
FIG. 14 is a schematic diagram of an example memory array comprising ferroelectric capacitors.

FIG. 14 schematically illustrates a region of the memory array 78 of FIG. 13. The region of FIG. 14 is similar to that of FIG. 12, except that three columns of the memory cells 80 share one of the plate structures 79.

Figure 15:
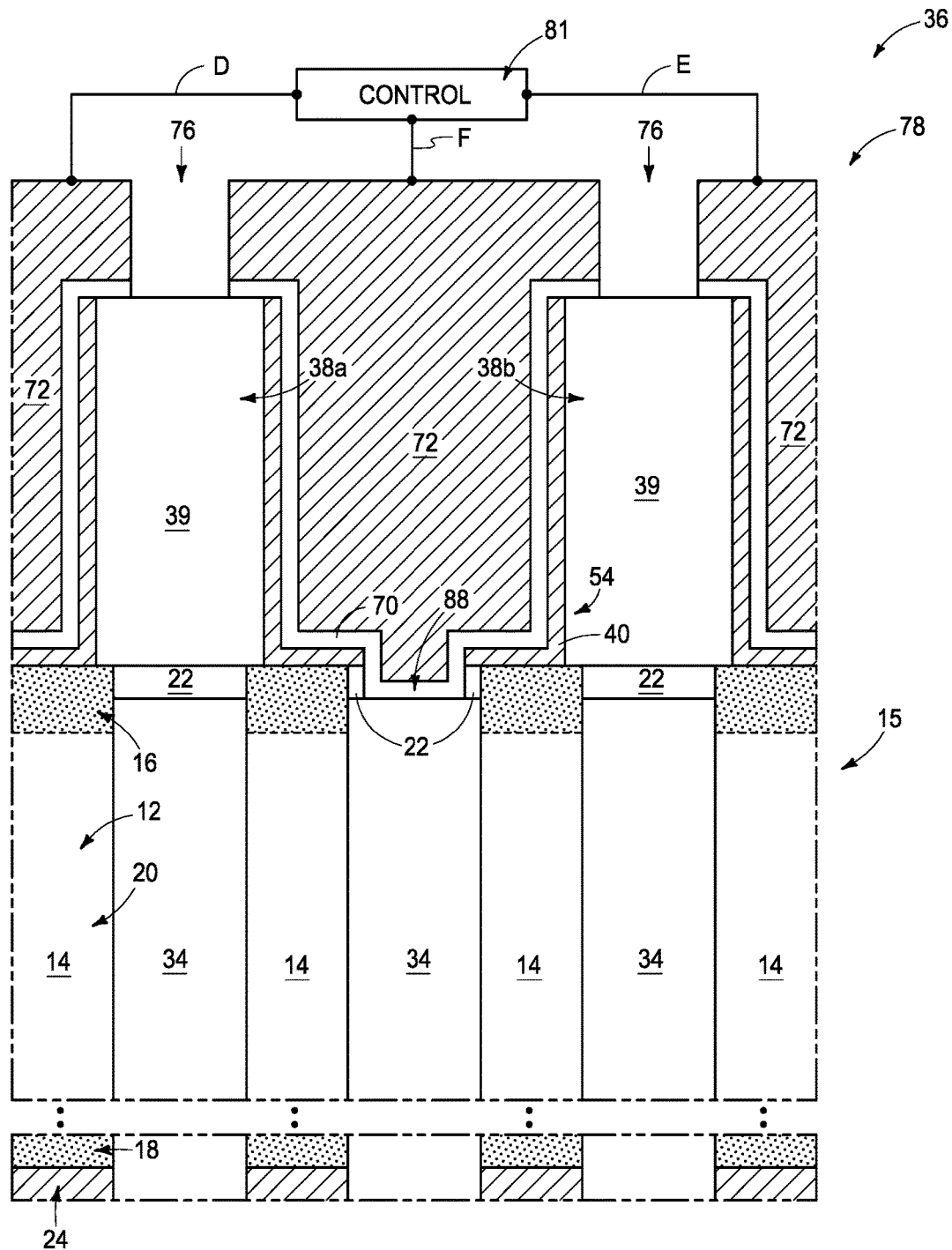
FIGS. 15-17 are diagrammatic views of regions analogous to that of FIG. 11B showing other example embodiments.
Figure 16:
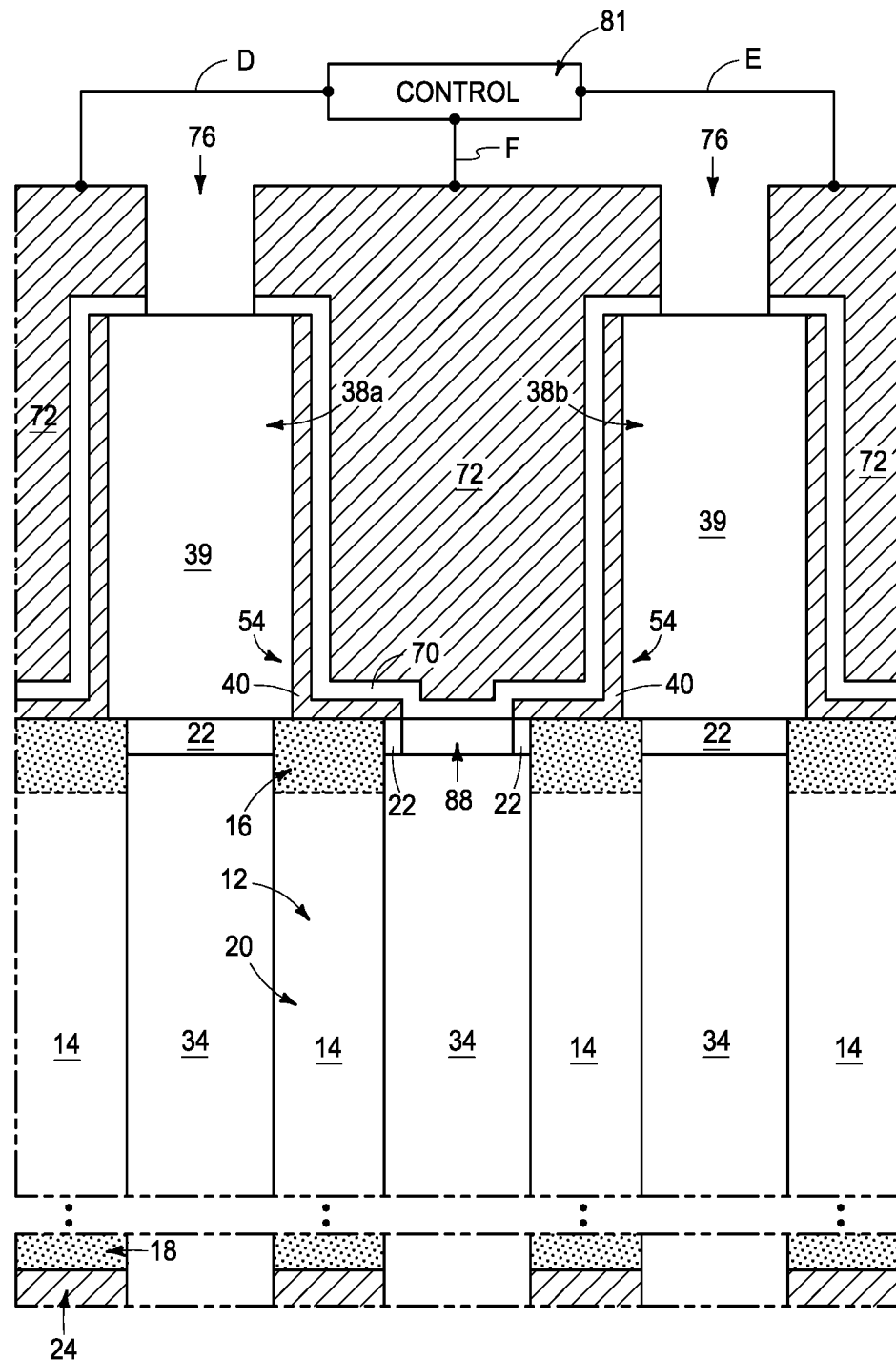

The embodiment of FIG. 8B shows etches utilized for removal of various materials stopping at an upper surface of the material 22. In other embodiments, such etches may penetrate into or through the material 22, and possibly also into the material 34 underlying the material 22. For instance, FIGS. 15 and 16 show embodiments in which etching has penetrated into the material 22 to form a cavity (gap) 88, and in which the ferroelectric-insulative-material 70 extends into the cavity (FIG. 15), or extends across the cavity (FIG. 16). In the embodiment of FIG. 16, the cavity (gap) 88 may be a gas-filled void which is sealed by the ferroelectric-insulative-material 70.

FIGS. 15 and 16 also illustrate example embodiments in which the slits 76 penetrate through the ferroelectric-insulative-material 70. The slits 76 are shown to stop at an upper surface of the insulative material 39 of the linear structures 38. In other embodiments, the slits may penetrate into the insulative material 39.

Figure 17:
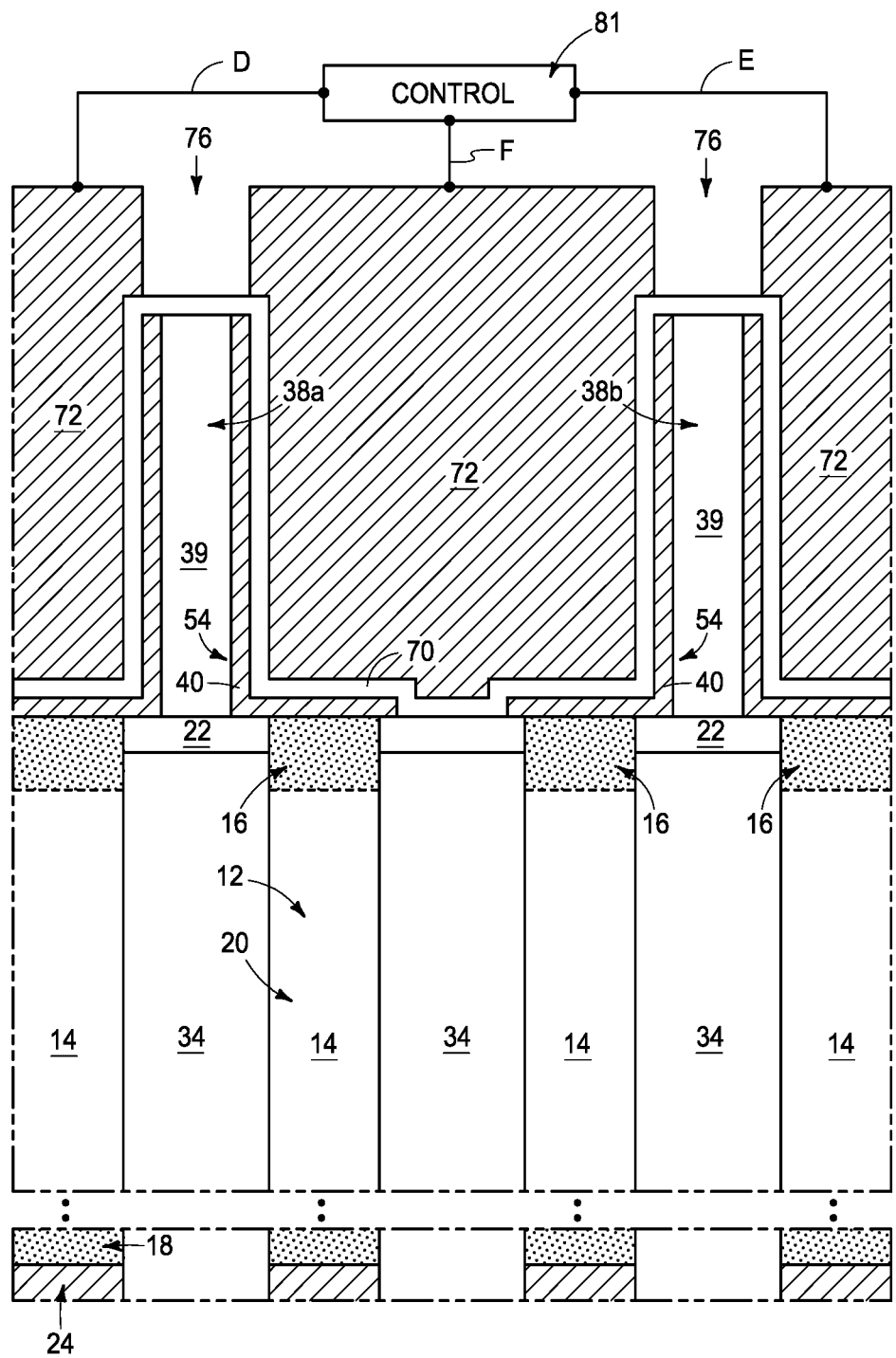

The embodiment of FIG. 2B shows the insulative material 39 of the linear structures 38 extending partially across the source/drain regions 16 adjacent lateral edges of the linear structures. In other embodiments, the linear structures 38 may not extend across the source/drain regions 16. For instance, FIG. 17 shows an embodiment in which the insulative material 39 of the linear structures 38 does not extend across any of the upper source/drain regions 16 that are adjacent to lateral edges of the linear structures.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first memory cell and a second memory cell. The first memory cells cell comprising a first pillar of semiconductor material, with the first pillar comprising a first upper source/drain region and a first channel region under the first upper source/drain region. The second memory cell comprising a second pillar of semiconductor material, with the second pillar comprising a second upper source/drain region and a second channel region under the second upper source/drain region. A gating structure passes across the first and second channel regions and comprises regions proximate the first and second channel regions, the gating structure extends along a first direction. An insulative structure is over regions of the first and second pillars. The insulative structure extends along a second direction which is substantially orthogonal to the first direction. A first bottom electrode is electrically coupled with the first upper source/drain region, and a second bottom electrode is electrically coupled with the second upper source/drain region. The first and second bottom electrodes are configured as first and second angle plates, respectively. The second angle plate is substantially a mirror image of the first angle plate. The first and second angle plates have horizontal segments adjacent the first and second upper source/drain regions, respectively; and having vertical segments extending upwardly from the horizontal segments. The vertical segments of the first and second angle plates are adjacent lateral sides of the insulative structure. Ferroelectric-insulative-material is over the first and second bottom electrodes. Top-electrode-material is over the ferroelectric-insulative-material. A slit passes through the top-electrode-material and extends along the second direction. The slit is directly over the insulative structure.

Some embodiments include an integrated assembly having pillars arranged in an array. The array has a row direction and a column direction. The pillars have upper source/drain regions, lower source/drain regions, and channel regions between the upper and lower source/drain regions. Gating structures are proximate to the channel regions and extend along the row direction. Conductive structures are beneath the pillars and are electrically coupled with the lower source/drain regions. The conductive structures extend along the column direction. Insulative structures are above the pillars and extend along the column direction. Each of the insulative structures has a first lateral side and an opposing second lateral side, and are associated with a pair of the columns of the pillars along said first and second lateral sides. Bottom electrodes are electrically coupled with the upper source/drain regions. The bottom electrodes are configured as angle plates. The angle plates have horizontal segments adjacent the upper source/drain regions and have vertical segments extending upwardly from the horizontal segments. The vertical segments are adjacent to the lateral sides of the insulative structures. The bottom electrodes include a first set adjacent the first lateral sides and a second set adjacent the second lateral sides. The first set of the bottom electrodes has their horizontal segments projecting in a first direction from their vertical segments. The second set of the bottom electrodes has their horizontal segments projecting in a second direction from their vertical segments. The second direction is opposite to the first direction. A ferroelectric-insulative-material is over the bottom electrodes. A top-electrode-material over the ferroelectric-insulative-material. One or more slits pass through the top-electrode-material and extend along the column direction. Each of the slits is directly over an insulative structure.

Some embodiments include an integrated assembly having pillars arranged in an array. The array has a row direction and a column direction. The pillars have upper source/drain regions, lower source/drain regions, and channel regions between the upper and lower source/drain regions. Shield lines extend along the row direction and are in regions between the pillars. Gating structures are proximate the channel regions and extend along the row direction. Conductive structures are beneath the pillars and are electrically coupled with the lower source/drain regions. The conductive structures extend along the column direction. Linear structures are above the pillars and extend along the column direction. Each of the linear structures has a first lateral side and an opposing second lateral side, and is associated with a pair of the columns of the pillars along said first and second lateral sides. Bottom electrodes are electrically coupled with the upper source/drain regions. The bottom electrodes have first segments adjacent the upper source/drain regions and have second segments extending upwardly from the first segments. The second segments are directly against the lateral sides of the linear structures. The bottom electrodes include a first set along the first lateral sides and a second set along the second lateral sides. The bottom electrodes of the first set have their first segments projecting from their second segments in a first direction. The bottom electrodes of the second set have their first segments projecting from their second segments in a second direction which is opposite to the first direction. A ferroelectric-insulative-material is over the bottom electrodes. A top-electrode-material is over the ferroelectric-insulative-material. One or more slits pass through the top-electrode-material and extend along the column direction. Each of the slits is directly over an associated one of the linear structures.

Some embodiments include a method of forming an integrated assembly. A construction is formed to have an array of pillars comprising semiconductor material. The array comprises rows and columns. The pillars have upper source/drain regions, lower source/drain regions, and channel regions between the upper and lower source/drain regions. The construction includes gating structures extending along the row direction and being proximate the channel regions, and includes conductive structures extending along the column direction and being coupled with the lower source/drain regions. The construction includes a first insulative material between the upper source/drain regions of the pillars. An upper surface of the construction extends across the first insulative material and across upper surfaces of the upper source/drain regions. Linear structures are formed over the upper surface and extend along the column direction. Each of the linear structures has a first lateral side and an opposing second lateral side, and is associated with a pair of columns of the pillars along said first and second lateral sides. Bottom-electrode-material is formed conformally along the linear structures and along regions of the upper surface between the linear structures. The bottom-electrode-material is patterned into bottom-electrode-structures. The bottom-electrode-structures have first segments along the upper surfaces of the upper source/drain regions and have second segments along the sidewalls of the linear structures. Ferroelectric-insulative-material is formed over the bottom-electrode-structures. Top-electrode-material is formed over the ferroelectric-insulative-material. One or more slits are formed to pass through the top-electrode-material. The slits extend along the column direction and each of the slits is directly over an associated one of the linear structures. The slits divide the top-electrode-material into two or more plates.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first memory cell comprising a first pillar of a semiconductor material; the first pillar comprising a first upper source/drain region and a first channel region under the first upper source/drain region;
   a second memory cell comprising a second pillar of the semiconductor material; the second pillar comprising a second upper source/drain region and a second channel region under the second upper source/drain region;
   a gating structure passing across the first channel region and the second channel region and comprising regions proximate the first channel region and the second channel region, the gating structure extending along a first direction;
   an insulative structure over portion of each of the first pillar and the second pillar, the insulative structure extending along a second direction which is orthogonal to the first direction;
   a first bottom electrode electrically coupled with the first upper source/drain region, and a second bottom electrode electrically coupled with the second upper source/drain region; the first bottom electrode and the second bottom electrode being configured as a first angle plate and a second angle plate, respectively; the second angle plate being a mirror image of the first angle plate; the first angle plate and the second angle plate having horizontal length segments adjacent to the first upper source/drain region and the second upper source/drain region, respectively; and having vertical length segments extending upwardly from the horizontal length length segments; the vertical length segments of the first angle plate and the second angle plate being adjacent to lateral sides of the insulative structure;
   ferroelectric-insulative-material over the first bottom electrode and the second bottom electrode;
   top-electrode-material over the ferroelectric-insulative-material;
   a slit passing through the top-electrode-material and extending along the second direction; the slit being directly over the insulative structure;
   wherein the slit does penetrate through the ferroelectric-insulative-material; and
   wherein the vertical length segments are longer than the horizontal length segments.

2. An integrated assembly, comprising:
   a first memory cell comprising a first pillar of a semiconductor material; the first pillar comprising a first upper source/drain region and a first channel region under the first upper source/drain region;
   a second memory cell comprising a second pillar of the semiconductor material; the second pillar comprising a second upper source/drain region and a second channel region under the second upper source/drain region;
   a gating structure passing across the first channel region and the second channel region and comprising regions proximate the first channel region and the second channel region, the gating structure extending along a first direction;
   an insulative structure over portion of each of the first pillar and the second pillar, the insulative structure extending along a second direction which is orthogonal to the first direction;
   a first bottom electrode electrically coupled with the first upper source/drain region, and a second bottom electrode electrically coupled with the second upper source/drain region; the first bottom electrode and the second bottom electrode being configured as a first angle plate and a second angle plate, respectively; the second angle plate being a mirror image of the first angle plate; the first angle plate and the second angle plate having horizontal segments adjacent to the first upper source/drain region and the second upper source/drain region, respectively; and having vertical segments extending upwardly from the horizontal segments; the vertical segments of the first angle plate and the second angle plate being adjacent to lateral sides of the insulative structure;
   ferroelectric-insulative-material over the first bottom electrode and the second bottom electrode;
   top-electrode-material over the ferroelectric-insulative-material;
   a slit passing through the top-electrode-material and extending along the second direction; the slit being directly over the insulative structure;
   wherein the slit does penetrate through the ferroelectric-insulative-material; and
   a gap extends into a region between the first upper source/drain region and the second upper source/drain region.

3. The integrated assembly of claim 2, wherein the ferroelectric-insulative-material extends into the gap.

4. An integrated assembly, comprising:
   a first memory cell comprising a first pillar of a semiconductor material; the first pillar comprising a first upper source/drain region and a first channel region under the first upper source/drain region;
   a second memory cell comprising a second pillar of the semiconductor material; the second pillar comprising a second upper source/drain region and a second channel region under the second upper source/drain region;
   a gating structure passing across the first channel region and the second channel region and comprising regions proximate the first channel region and the second channel region, the gating structure extending along a first direction;

an insulative structure over portion of each of the first pillar and the second pillar, the insulative structure extending along a second direction which is orthogonal to the first direction;

a first bottom electrode electrically coupled with the first upper source/drain region, and a second bottom electrode electrically coupled with the second upper source/drain region; the first bottom electrode and the second bottom electrode being configured as a first angle plate and a second angle plate, respectively; the second angle plate being a mirror image of the first angle plate; the first angle plate and the second angle plate having horizontal segments adjacent to the first upper source/drain region and the second upper source/drain region, respectively; and having vertical segments extending upwardly from the horizontal segments; the vertical segments of the first angle plate and the second angle plate being adjacent to lateral sides of the insulative structure;

ferroelectric-insulative-material over the first bottom electrode and the second bottom electrode;

top-electrode-material over the ferroelectric-insulative-material;

a slit passing through the top-electrode-material and extending along the second direction; the slit being directly over the insulative structure; and wherein the slit does penetrate through the ferroelectric-insulative-material; and wherein the ferroelectric-insulative-material is directly against the first bottom electrode and the second bottom electrode.

5. The integrated assembly of claim 4, wherein the insulative structure laterally overlaps portions of the upper source/drain region of the pillars.

6. An integrated assembly, comprising:

pillars arranged in an array; the array comprising a row direction and a column direction; the pillars having upper source/drain regions, lower source/drain regions, and channel regions, each between a corresponding pair of the upper source/drain regions and the lower source/drain regions;

gating structures proximate the channel regions and extending along the row direction;

conductive structures beneath the pillars and electrically coupled with the lower source/drain regions; the conductive structures extending along the column direction;

insulative structures above the pillars and extending along the column direction; each of the insulative structures having a first lateral side and an opposing second lateral side, and being associated with a pair of columns of the pillars along the first lateral side and the opposing second lateral side;

bottom electrodes electrically coupled with the upper source/drain regions; the bottom electrodes being configured as angle plates; the angle plates having horizontal length segments adjacent to the upper source/drain regions and having vertical length segments extending upwardly from the horizontal length segments; the vertical length segments being adjacent to the lateral sides of the insulative structures;

the bottom electrodes including a first set adjacent to the first lateral sides and a second set adjacent to the opposing second lateral sides; the first set of the bottom electrodes having the horizontal length segments projecting in a first direction from the vertical length segments; the second set of the bottom electrodes having the horizontal length segments projecting in a second direction from the vertical length segments; the second direction being opposite to the first direction;

ferroelectric-insulative-material over the bottom electrodes;

top-electrode-material over the ferroelectric-insulative-material;

one or more slits passing through the top-electrode-material and extending along the column direction; each of said one or more slits being directly over an associated one of the insulative structures;

wherein said one or more slits penetrate entirely through the ferroelectric-insulative-material; and wherein the vertical length segments are longer than the horizontal length segments.

7. The integrated assembly of claim 6, further comprising a gap extends into a region between the upper source/drain regions.

8. The integrated assembly of claim 7, wherein the ferroelectric-insulative-material extends into the gap.

9. The integrated assembly of claim 6, wherein the ferroelectric-insulative-material is directly against the first and second bottom electrodes.

10. The integrated assembly of claim 6, wherein the insulative structures laterally overlap portions of the upper source/drain regions.

11. An integrated assembly, comprising:

pillars arranged in an array; the array comprising a row direction and a column direction; the pillars having upper source/drain regions, lower source/drain regions, and channel regions, each between a corresponding pair of the upper source/drain regions and the lower source/drain regions;

shield lines extending along the row direction and being in regions between the pillars;

gating structures proximate the channel regions and extending along the row direction;

conductive structures beneath the pillars and electrically coupled with the lower source/drain regions; the conductive structures extending along the column direction;

linear structures above the pillars and extending along the column direction; each of the linear structures having a first lateral side and an opposing second lateral side, and being associated with a pair of columns of the pillars along the first lateral side and the opposing second lateral side;

bottom electrodes electrically coupled with the upper source/drain regions; the bottom electrodes having first segments adjacent to the upper source/drain regions and having second segments extending upwardly from the first segments; the second segments being directly against the lateral sides of the linear structures;

the bottom electrodes including a first set along the first lateral sides and a second set along the opposing second lateral sides; the bottom electrodes of the first set having the first segments projecting from the second segments in a first direction; the bottom electrodes of the second set having the first segments projecting from the second segments in a second direction which is opposite to the first direction;

ferroelectric-insulative-material over the bottom electrodes;

top-electrode-material over the ferroelectric-insulative-material; and one or more slits passing through the top-electrode-material and extending along the column direction; each of said one or more slits being directly over an associated one of the linear structures;

wherein said one or more slits penetrate through the ferroelectric-insulative-material; and further comprising a gap extends into a region between the upper source/drain regions.

12. The integrated assembly of claim 11, wherein the ferroelectric-insulative-material extends into the gap.

13. The integrated assembly of claim 11, wherein the ferroelectric-insulative-material is directly against the first bottom electrodes and the second bottom electrodes.

14. The integrated assembly of claim 11, wherein the linear structures laterally overlap portions of the upper source/drain regions.

* * * * *